US012628351B2

(12) United States Patent
Oka et al.

(10) Patent No.: US 12,628,351 B2
(45) Date of Patent: May 12, 2026

(54) MEMORY CELL AND MEMORY CELL ARRAY

(71) Applicant: Sony Semiconductor Solutions Corporation, Kanagawa (JP)

(72) Inventors: Mikio Oka, Kanagawa (JP); Kazuki Yamaguchi, Kumamoto (JP); Masashi Kino, Kumamoto (JP); Takashige Doi, Kanagawa (JP); Masashige Moritoki, Kumamoto (JP); Takashi Watanabe, Kumamoto (JP); Norikazu Kasahara, Kumamoto (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 937 days.

(21) Appl. No.: 17/801,048

(22) PCT Filed: Jan. 29, 2021

(86) PCT No.: PCT/JP2021/003243
§ 371 (c)(1),
(2) Date: Aug. 19, 2022

(87) PCT Pub. No.: WO2021/176908
PCT Pub. Date: Sep. 10, 2021

(65) Prior Publication Data
US 2023/0079435 A1      Mar. 16, 2023

(30) Foreign Application Priority Data
Mar. 3, 2020    (JP) ................................. 2020-035833

(51) Int. Cl.
  *H10D 48/40*      (2025.01)
  *G11C 11/16*      (2006.01)
  *H10B 61/00*      (2023.01)

(52) U.S. Cl.
  CPC ............ *H10B 61/22* (2023.02); *G11C 11/161* (2013.01)

(58) Field of Classification Search
  None
  See application file for complete search history.

(56) References Cited

U.S. PATENT DOCUMENTS 9,263,144 B2    2/2016  Ito
10,217,800 B2    2/2019  Ueki
(Continued)

FOREIGN PATENT DOCUMENTS

JP          H05226603 A      9/1993
JP          2007-149800 A    6/2007
(Continued)

OTHER PUBLICATIONS

International Search Report issued in International Patent Application No. PCT/JP2021/003243 on Apr. 13, 2021 and English translation of same. 5 pages.
(Continued)

*Primary Examiner* — Shahed Ahmed
*Assistant Examiner* — Lamont B Koo
(74) *Attorney, Agent, or Firm* — K&L Gates LLP

(57)      ABSTRACT

A memory cell array of the present disclosure includes a plurality of memory cells 11 arranged in a first direction and a second direction different from the first direction. Each of the memory cells 11 includes a resistance-variable nonvolatile memory element and a selection transistor TR electrically connected to the nonvolatile memory element. The selection transistor TR is formed in an active region 80 provided in a semiconductor layer 60. At least a part of the active region 80 is in contact with an element isolation region 81 provided in the semiconductor layer 60. A surface (Continued)

of the element isolation region 81 is located at a position lower than a surface of the active region 80.

17 Claims, 27 Drawing Sheets

(56)                    References Cited

U.S. PATENT DOCUMENTS

| | | |
|---|---|---|
| 2007/0120128 A1 | 5/2007 | Sato et al. |
| 2007/0228425 A1* | 10/2007 | Miller ................. H10D 62/405 |
| | | 257/288 |
| 2007/0241410 A1 | 10/2007 | Umehara et al. |
| 2013/0043530 A1 | 2/2013 | Kim et al. |
| 2017/0062706 A1 | 3/2017 | Yamakawa |
| 2017/0250106 A1* | 8/2017 | Lin ................... H01L 21/02164 |
| 2019/0147931 A1 | 5/2019 | Oka |
| 2019/0378566 A1* | 12/2019 | Boniardi ............. G11C 11/5678 |

FOREIGN PATENT DOCUMENTS

| | | |
|---|---|---|
| JP | 2007-273493 A | 10/2007 |
| JP | 2010-239147 A | 10/2010 |
| JP | 2011003779 A | 1/2011 |
| JP | 2012-203964 A | 10/2012 |
| JP | 2013-042140 A | 2/2013 |

OTHER PUBLICATIONS

Written Opinion issued in International Patent Application No. PCT/JP2021/003243 on Apr. 13, 2021. 6 pages.

* cited by examiner

FIG. 1

SECOND DIRECTION ⊗ → FIRST DIRECTION

(A)
RECORDING OF INFORMATION "0"

(B)
RECORDING OF INFORMATION "1"

11

30B

30

30A

35 CAP LAYER
33 STORAGE LAYER
32 INTERMEDIATE LAYER
31 MAGNETIZATION FIXED LAYER
34 BASE LAYER 31C
31B
31A e⁻

67

67

CAP LAYER
SECOND MAGNETIZATION FIXED LAYER
SECOND INTERMEDIATE LAYER
STORAGE LAYER
FIRST INTERMEDIATE LAYER
FIRST MAGNETIZATION FIXED LAYER
FIRST STACK

FIRST DIRECTION

SECOND DIRECTION

FIRST DIRECTION

SECOND DIRECTION

FIRST DIRECTION

SECOND DIRECTION

FIG. 26

MEMORY CELL AND MEMORY CELL ARRAY

TECHNICAL FIELD

The present disclosure relates to a memory cell and a memory cell array including the memory cell.

BACKGROUND ART

Along with rapid development of various information devices from a large-capacity server to a mobile terminal, further improvement in performance such as higher integration, higher speed, and lower power consumption has been pursued in various elements such as a memory and a logic constituting the information devices. In particular, a semiconductor nonvolatile memory has remarkably progressed, and for example, a flash memory as a large-capacity file memory is spreading at a speed of expelling a hard disk drive. Meanwhile, in view of development to a memory for code storage and a working memory, a ferroelectric random access memory (FeRAM), a magnetic random access memory (MRAM), a phase-change random access memory (PCRAM), and the like are being developed in order to replace a currently generally used NOR flash memory, DRAM, and the like with these memories, and some of these memories have already been put into practical use.

Among these memories, the MRAM performs data storage (recording) on the basis of a magnetization direction of a magnetic body, and therefore can perform rewrite at high speed and almost infinitely ($10^{15}$ times or more). The MRAM is already used in the fields of industrial automation, aircraft, and the like. In addition, the MRAM is expected to be developed to a memory for code storage and a working memory in the future due to its high-speed operation and high reliability. However, in reality, the MRAM has a problem in reducing power consumption and increasing capacity. This is an essential problem caused by a recording principle of the MRAM, that is, a system of reversing magnetization by a current magnetic field generated from a wire. As a means for solving this problem, a recording method that does not depend on a current magnetic field, that is, a magnetization reversal method has been studied. In particular, a spin transfer torque based magnetic random access memory (STT-MRAM) to which magnetization reversal by spin transfer is applied has attracted attention.

Similarly to the MRAM, the spin transfer torque based magnetic random access memory (hereinafter, simply referred to as "nonvolatile memory element") is constituted by, for example, magnetic tunnel junction (MTJ), and utilizes application of torque to a storage layer when a spin-polarized electron that has passed through a magnetic layer fixed in a certain direction enters another magnetic layer (a magnetic layer whose magnetization direction is not fixed, and is also referred to as a "free layer" or a "storage layer"). When a current (write current) equal to or larger than a certain threshold flows through the nonvolatile memory element, a magnetization direction of the storage layer is reversed. Data of "0/1" is rewritten by changing the polarity of the write current (a direction in which a current passing through the storage layer flows). In addition, an absolute value of the write is 1 mA or less in a nonvolatile memory element of a scale of about 0.1 μm, and a required write current value decreases in proportion to the volume of the nonvolatile memory element. Therefore, scaling can be performed. In addition, since a word line for generating a recording current magnetic field, which is required in the MRAM, is not required, there is also an advantage that a cell structure is simplified. Various materials have been studied as a ferromagnetic material used in a nonvolatile memory element. In general, a nonvolatile memory element having perpendicular magnetic anisotropy is considered to be more suitable for reducing power and increasing capacity than a nonvolatile memory element having in-plane magnetic anisotropy. This is because the perpendicular magnetization has a lower energy barrier to be exceeded at the time of spin torque magnetization reversal, and high magnetic anisotropy of a perpendicular magnetization film is advantageous for maintaining thermal stability of a storage carrier miniaturized by increasing capacity. Here, the nonvolatile memory element is usually electrically connected to a selection transistor, the nonvolatile memory element and the selection transistor constitute a memory cell, and a plurality of the memory cells constitutes a memory cell array.

By the way, the larger a write current, the lower a data write failure ratio generated in the nonvolatile memory element. Therefore, the write current is preferably large. Therefore, it is preferable to increase a current that can flow through the selection transistor. However, a selection transistor that satisfies such a requirement has a problem that a channel forming region is large and it is difficult to reduce the memory cell.

For example, Japanese Patent Application Laid-Open No. 2012-203964 discloses a technique in which a nonvolatile memory element and a selection transistor are alternately arranged in series to expand and equalize a pitch between the nonvolatile memory elements.

CITATION LIST

Patent Document

Patent Document 1: Japanese Patent Application Laid-Open No. 2012-203964

SUMMARY OF THE INVENTION

Problems to be Solved by the Invention

However, in the technique disclosed in the above patent publication, a contact hole is required for each nonvolatile memory element in order to alternately arrange the nonvolatile memory element and the selection transistor in series, it is difficult to reduce the memory cell, and a write current cannot be increased. Furthermore, if an interval (formation pitch) between adjacent nonvolatile memory elements is narrowed in order to reduce the memory cell, when a stacked film for forming the nonvolatile memory element is formed and then the stacked film is patterned (for example, etched) to form the nonvolatile memory, residues of the patterned (for example, etched) stacked film are redeposited, which may cause a short circuit between the adjacent nonvolatile memory elements.

Therefore, a first object of the present disclosure is to provide a memory cell including a selection transistor having a configuration and a structure capable of increasing a write current that can flow, and a memory cell array including the memory cell. Furthermore, a second object of the present disclosure is to provide a memory cell array having a configuration and a structure in which a problem hardly occurs even when an interval (formation pitch) between adjacent nonvolatile memory elements is narrowed.

Solutions to Problems

A memory cell array according to a first aspect of the present disclosure for achieving the above-described first object is a memory cell array including a plurality of memory cells arranged in a first direction and a second direction different from the first direction, in which each of the memory cells includes:

a resistance-variable nonvolatile memory element; and a selection transistor electrically connected to the nonvolatile memory element, the selection transistor is formed in an active region provided in a semiconductor layer, at least a part of the active region is in contact with an element isolation region provided in the semiconductor layer, and a surface of the element isolation region is located at a position lower than a surface of the active region.

A memory cell of the present disclosure for achieving the above-described first object includes:

a resistance-variable nonvolatile memory element; and a selection transistor electrically connected to the nonvolatile memory element, in which the selection transistor is formed in an active region provided in a semiconductor layer, at least a part of the active region is in contact with an element isolation region provided in the semiconductor layer, and a surface of the element isolation region is located at a position lower than a surface of the active region.

A memory cell array according to a second aspect of the present disclosure for achieving the above-described second object is a memory cell array including a plurality of memory cells arranged in a first direction and a second direction different from the first direction, in which each of the memory cells includes:

a resistance-variable nonvolatile memory element; and a selection transistor electrically connected to the nonvolatile memory element, and a nonvolatile memory element constituting a (2m−1)-th (in which m=1, 2, 3 . . . ) memory cell arranged in the first direction is arranged on a first-A virtual line extending in the first direction, and a nonvolatile memory element constituting a 2m-th memory cell is arranged on a first-B virtual line extending in the first direction and located away from the first-A virtual line in the second direction.

BRIEF DESCRIPTION OF DRAWINGS

Figure 1:
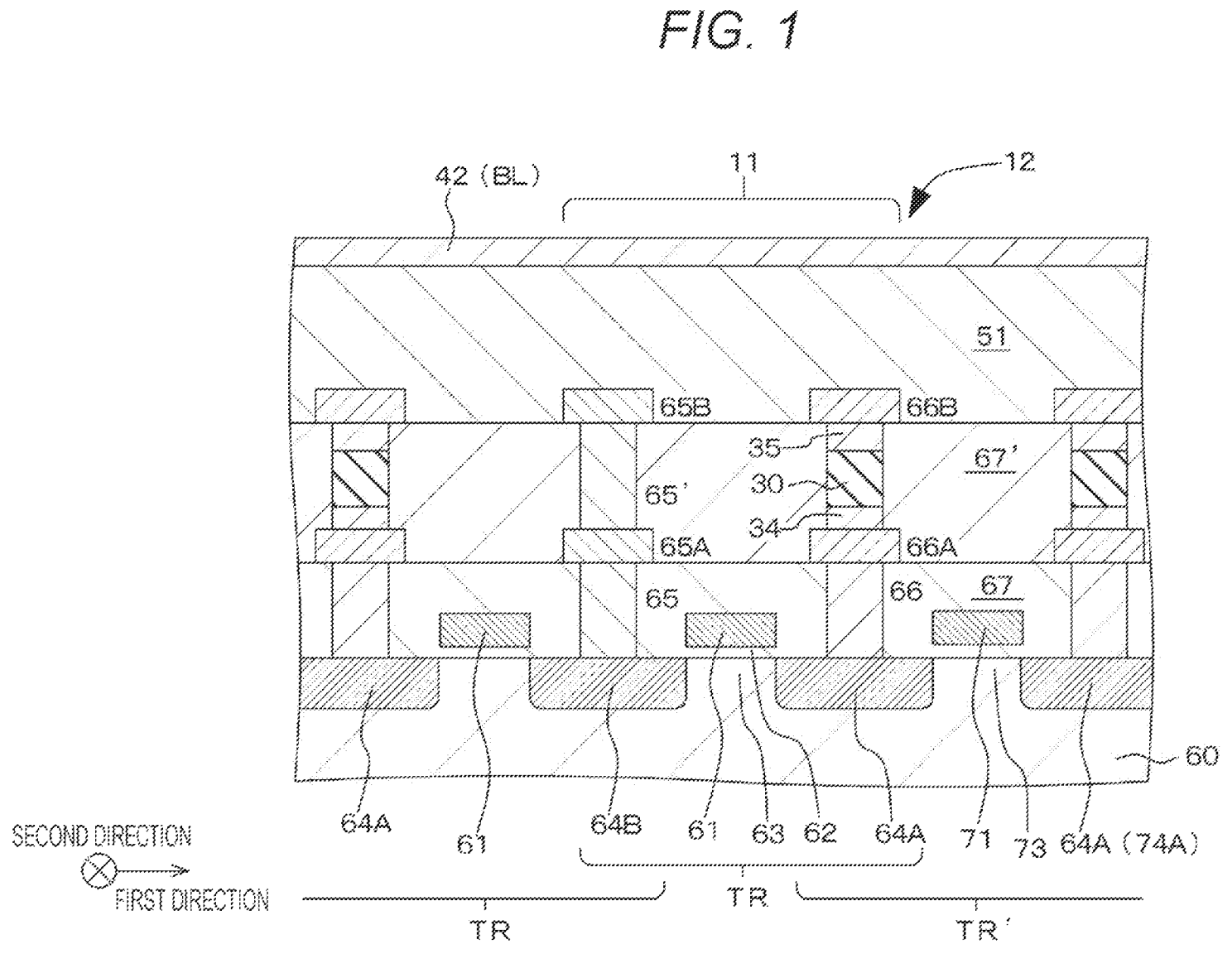

FIG. 1 is a partial cross-sectional view of a memory cell and a memory cell array of Example 1 taken along a one-dot chain line in FIG. 3.

Figure 2:
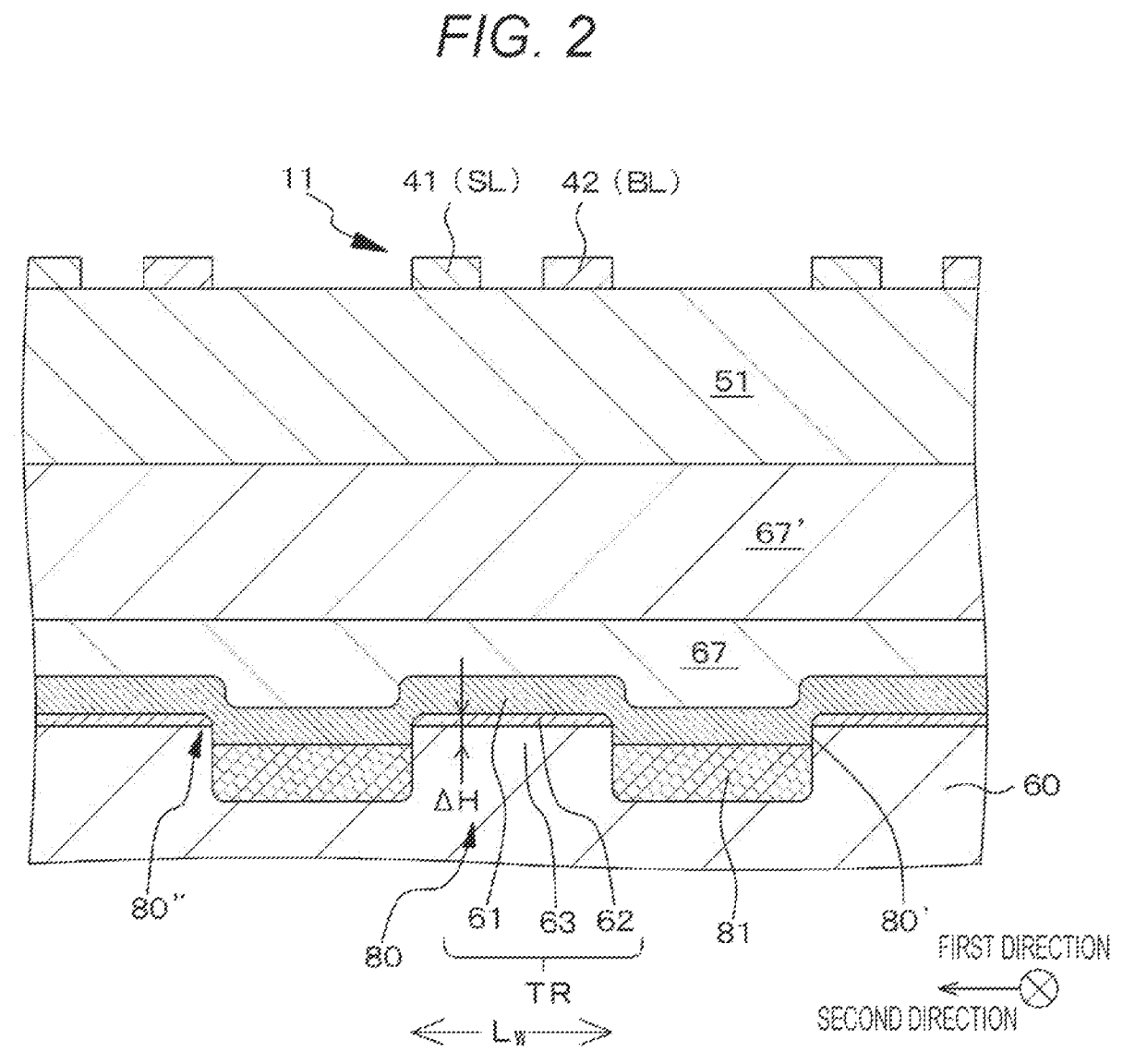

FIG. 2 is a partial end view of the memory cell and the memory cell array of Example 1 taken along an arrow F-F in FIG. 4.

Figure 4:
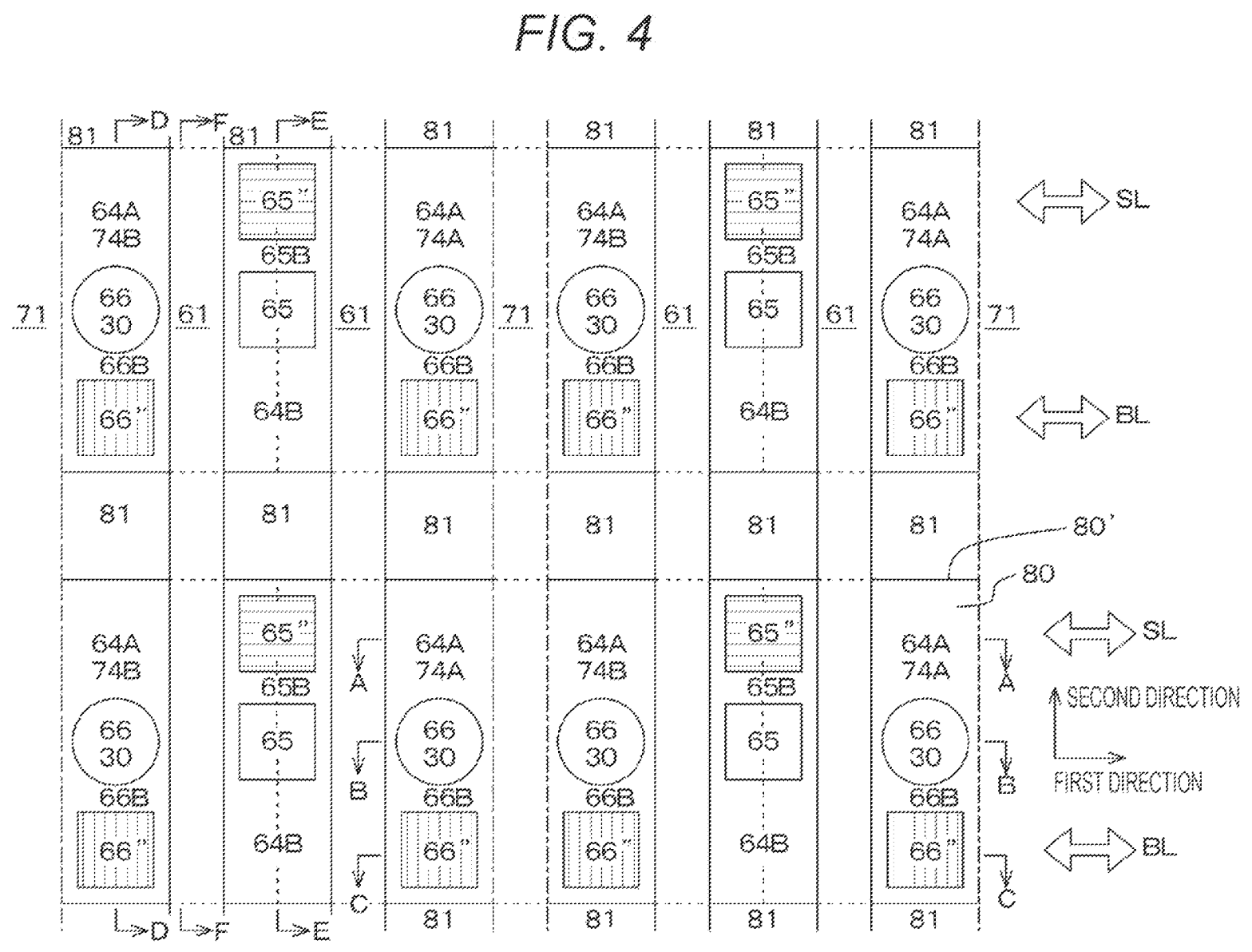

FIG. 4 is a diagram schematically illustrating an arrangement state of the memory cell array of Example 1.

Figure 7:
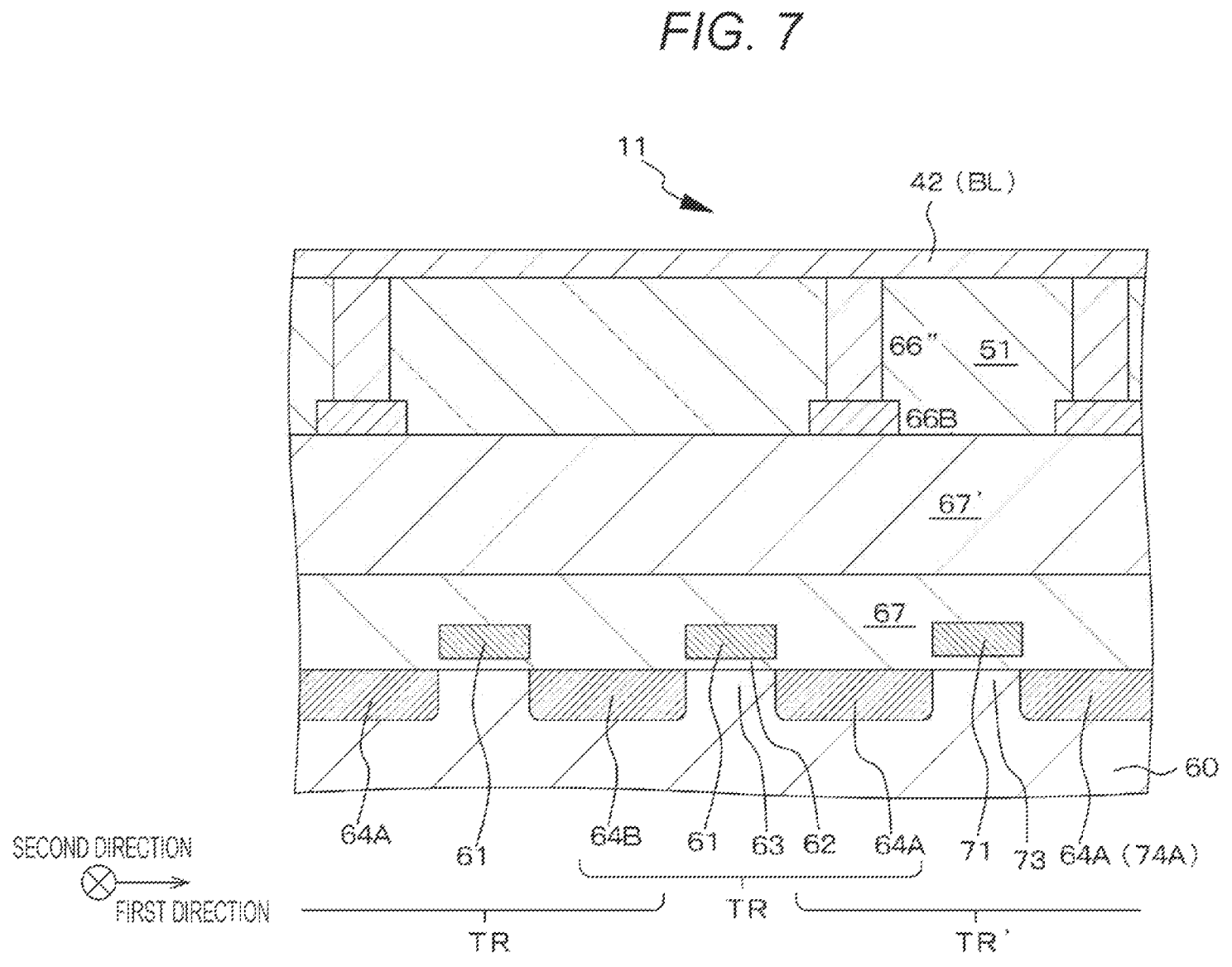

FIG. 7 is a partial cross-sectional view of the memory cell and the memory cell array of Example 1 taken along an arrow C-C in FIG. 4.

FIG. 12 is a diagram schematically illustrating an arrangement state of a memory cell array of Example 2.

FIG. 13 is a diagram schematically illustrating an arrangement state of the memory cell array of Example 2.

FIG. 14 is a partial end view of a memory cell and the memory cell array of Example 2 taken along an arrow G-G in FIG. 12.

FIG. 15 is a partial end view of the memory cell and the memory cell array of Example 2 taken along an arrow H-H in FIG. 12.

FIG. 17 is a partial end view of a memory cell and the memory cell array of the modification of Example 2 taken along an arrow J-J in FIG. 16.

FIG. 18 is a partial end view of the memory cell and the memory cell array of the modification of Example 2 taken along an arrow K-K in FIG. 16.

FIG. 19 is a partial end view of a memory cell and a memory cell array of Example 3 similar to that taken along the arrow G-G in FIG. 12.

FIG. 20 is a partial end view of the memory cell and the memory cell array of Example 3 similar to that taken along the arrow H-H in FIG. 12.

FIG. 21 is a partial end view of the memory cell and the memory cell array of Example 3 similar to that taken along the arrow J-J in FIG. 16.

FIG. 22 is a partial end view of the memory cell and the memory cell array of Example 3 similar to that taken along the arrow K-K in FIG. 16.

Figure 26:
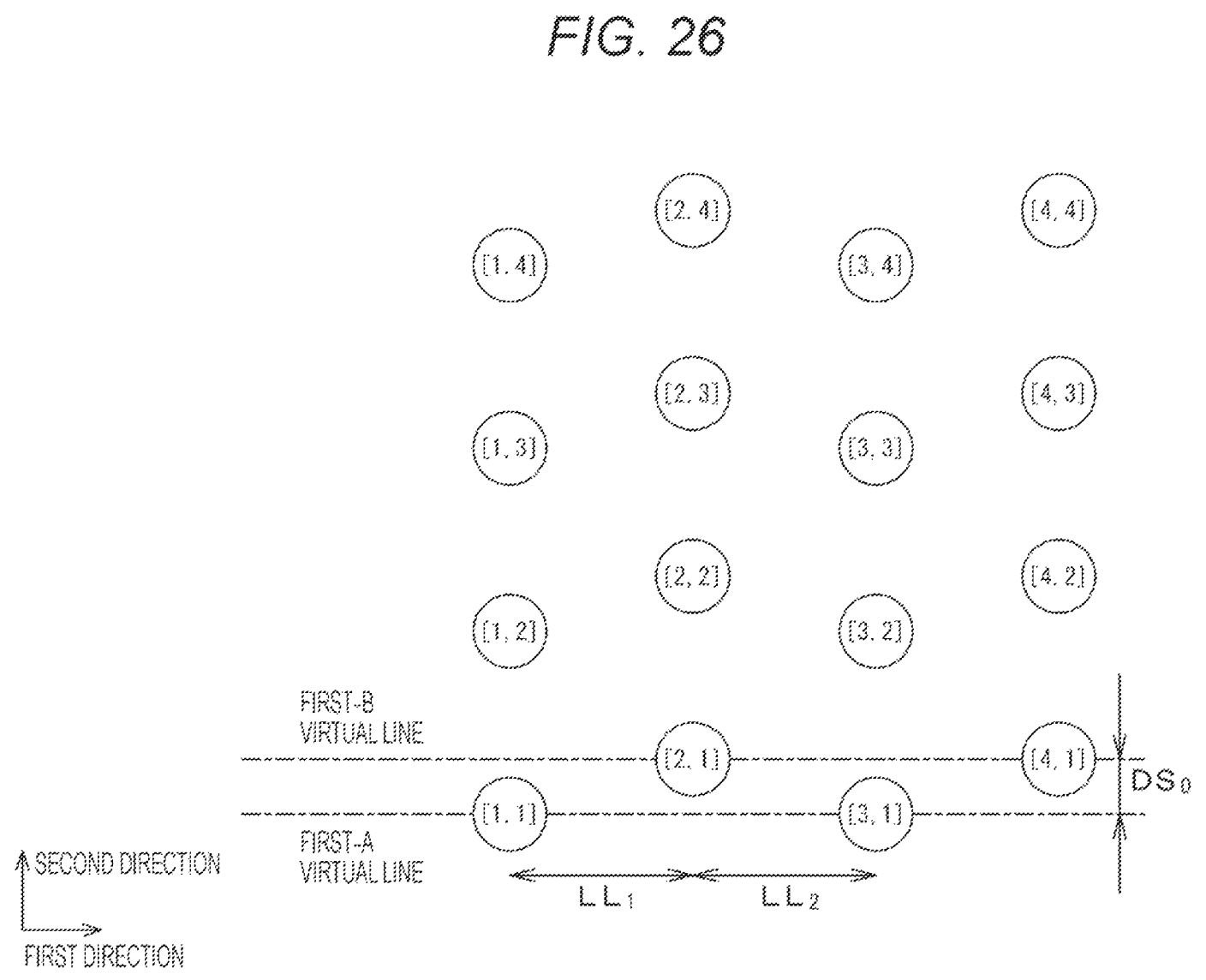

FIG. 26 is a diagram schematically illustrating an arrangement state of nonvolatile memory elements in a prototype of the memory cell array of Example 2.

MODE FOR CARRYING OUT THE INVENTION

Figure 3:
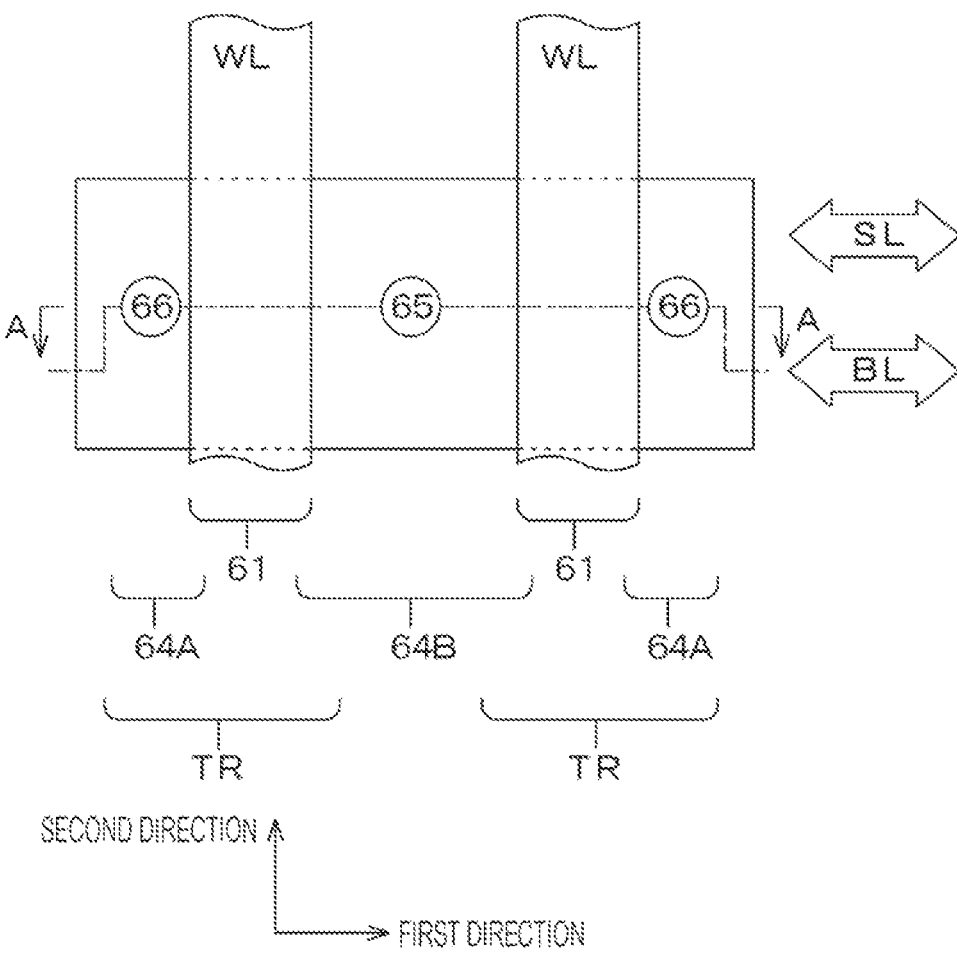
FIG. 3 is a diagram schematically illustrating an arrangement state of the two memory cells of Example 1.

Hereinafter, the present disclosure will be described on the basis of Examples with reference to the drawings. However, the present disclosure is not limited to Examples, and various numerical values and materials in Examples are illustrative. Note that description will be made in the following order.

1. General description of memory cell of present disclosure and memory cell arrays according to first and second aspects of present disclosure

2. Example 1 (memory cell of present disclosure and memory cell array according to first aspect of present disclosure)

3. Example 2 (memory cell array according to second aspect of present disclosure)

4. Example 3 (combination of Examples 1 and 2)

5. Example 4 (modification of Examples 1 to 3)

6. Example 5 (other modification of Examples 1 to 3)

7. Others

<General Description of Memory Cell of Present Disclosure and Memory Cell Arrays According to First and Second Aspects of Present Disclosure>

In a memory cell array according to a first aspect of the present disclosure, a nonvolatile memory element constituting a (2m−1)-th (in which m=1, 2, 3 . . . ) memory cell arranged in a first direction is arranged on a first-A virtual line extending in the first direction, and a nonvolatile memory element constituting a 2m-th memory cell is arranged on a first-B virtual line extending in the first direction and located away from the first-A virtual line in a second direction.

Here, arrangement of a nonvolatile memory element constituting a memory cell on any one of various virtual lines means that, when a stack constituting the nonvolatile memory element is cut along a virtual plane orthogonal to a height direction of the stack, an area centroid point of the cross-sectional shape of the nonvolatile memory element is located on the virtual line.

In the memory cell array according to the first aspect of the present disclosure or the memory cell of the present disclosure including the preferable form described above, a difference $\Delta H$ in a height direction between a top surface of an active region and a surface of an element isolation region is desirably 15 nm to 35 nm. Similarly, also in a memory cell array according to a second aspect of the present disclosure, a selection transistor can be formed in an active region provided in a semiconductor layer, and a difference $\Delta H$ in a height direction between a top surface of the active region and a surface of an element isolation region can be 15 nm to 35 nm.

In each of the memory cell arrays according to the first and second aspects of the present disclosure including the preferable forms described above, memory cells adjacent to each other in the second direction can be isolated from each other by the element isolation region. In addition, in this case, memory cells adjacent to each other in the first direction can be isolated from each other by an element isolation transistor. Note that the element isolation transistor preferably has the same structure as the selection transistor.

Moreover, each of the memory cell arrays according to the first and second aspects of the present disclosure including the preferable forms described above can have a configuration in which the selection transistor includes a gate electrode, a gate insulating layer, a channel forming region, and source/drain regions, one source/drain region of the selection transistor is electrically connected to one end of the nonvolatile memory element, the other source/drain region of the selection transistor is electrically connected to a first wire (also referred to as a selection line or a sense line), the other end of the nonvolatile memory element is electrically connected to a second wire (also referred to as a bit line), a word line also serving as the gate electrode of the selection transistor extends in the second direction, and

the channel forming region and the source/drain regions of the selection transistor are arranged in the first direction. Note that the selection transistor in the memory cell of the present disclosure including the preferable forms described above preferably has a similar configuration.

In addition, such a configuration can be a configuration in which the other source/drain region of the selection transistor is shared by a (2m−1)-th (in which m=1, 2, 3 . . . ) memory cell and a 2m-th memory cell arranged in the first direction, and the 2m-th memory cell and a (2m+1)-th memory cell are isolated from each other by an element isolation transistor. That is, in such a configuration, the selection transistor is shared by the two memory cells. In addition, such two memory cells that share the selection transistor are referred to as "memory cell unit" for convenience.

In the memory cell unit, the (2m−1)-th memory cell and the 2m-th memory cell arranged in the first direction are sandwiched between two element isolation transistors. Here, an element isolation transistor adjacent to the (2m−1)-th memory cell is referred to as a first element isolation transistor for convenience, and an element isolation transistor adjacent to the 2m-th memory cell is referred to as a second element isolation transistor for convenience. The nonvolatile memory element of the (2m−1)-th memory cell is electrically connected to the other source/drain region of the first element isolation transistor, and the nonvolatile memory element of the 2m-th memory cell is electrically connected to one source/drain region of the second element isolation transistor. The other source/drain region of the first element isolation transistor also serves as one source/drain region of the selection transistor in the (2m−1)-th memory cell, and one source/drain region of the second element isolation transistor also serves as one source/drain region of the selection transistor in the 2m-th memory cell.

In the memory cell unit according to the second aspect of the present disclosure, the nonvolatile memory element of the (2m−1)-th memory cell and the nonvolatile memory element of the 2m-th memory cell arranged in the first direction can be arranged two-fold rotationally symmetrically with (the center of) the selection transistor as a rotation axis. Furthermore, in the memory cell unit according to the second aspect of the present disclosure, when a distance in the first direction between the nonvolatile memory element of the (2m−1)-th memory cell and the nonvolatile memory element of the 2m-th memory cell arranged in the first direction is represented by $LL_1$, and a distance in the first direction between the nonvolatile memory element of the 2m-th memory cell and the nonvolatile memory element of the (2m+1)-th memory cell arranged in the first direction is represented by $LL_2$.

$$LL_2 < LL_1$$

can be satisfied. Note that the "distance between nonvolatile memory elements" means a distance between area centroid points in adjacent nonvolatile memory elements. Furthermore, the "distance between nonvolatile memory elements in the first direction" means a distance between nonvolatile memory elements on a virtual plane when the distance between the nonvolatile memory elements is orthogonally projected on a virtual plane included in the first direction.

Moreover, in these preferable configurations in each of the memory cell arrays according to the first and second aspects of the present disclosure, a word line of the selection transistor can extend from an edge portion of the active region along a side surface of the active region in the second direction, and can further extend on the element isolation region.

Moreover, in these preferable configurations in each of the memory cell arrays according to the first and second aspects of the present disclosure, or in the memory cell of the present disclosure, when a difference in a height direction between a top surface of the active region and a surface of the element isolation region is represented by $\Delta H$, and the width of the channel forming region of the selection transistor in the second direction is represented by $L_W$, $$0.08 \leq \Delta H/L_W \leq 0.28$$

preferably, $$0.125 \leq \Delta H/L_W \leq 0.28$$

can be satisfied.

Alternatively, in each of the memory cell arrays according to the first and second aspects of the present disclosure, the memory cell can include one nonvolatile memory element and one selection transistor, or the memory cell can include one nonvolatile memory element and two selection transistors, or the memory cell can include two nonvolatile memory elements and two selection transistors.

Moreover, in each of the memory cell arrays according to the first and second aspects of the present disclosure including the preferable forms and configurations described above, or in the memory cell of the present disclosure including the preferable forms and configurations described above, the element isolation region can have a shallow trench structure. Specifically, the element isolation region can be formed by forming a recess in a semiconductor layer (base portion) and embedding the recess with an insulating material such as $SiO_2$ or SiN.

Moreover, in each of the memory cell arrays according to the first and second aspects of the present disclosure including the preferable forms and configurations described above, or in the memory cell of the present disclosure including the preferable forms and configurations described above, in order to suppress electric field concentration, and in order to prevent the thickness of the gate insulating layer from being thin at an end portion of the active region, the end portion of the active region facing the element isolation region can be rounded.

Moreover, the nonvolatile memory element constituting each of the memory cell arrays according to the first and second aspects of the present disclosure including the various preferable forms and configurations described above or the nonvolatile memory element constituting the memory cell of the present disclosure including the various preferable forms and configurations described above can be constituted by a perpendicular magnetization type spin transfer torque based magnetic random access memory (hereinafter, also simply referred to as "spin transfer torque based magnetic random access memory"). However, the nonvolatile memory element is not limited to such a form, and can also be constituted by an in-plane magnetization type magnetic random access memory. Alternatively, in each of the memory cell arrays according to the first and second aspects of the present disclosure, a perpendicular magnetization type spin transfer torque based magnetic random access memory and an in-plane magnetization type magnetic random access memory can be mixed. In the spin transfer torque based magnetic random access memory, a magnetization direction of a storage layer changes according to information to be stored, and in the storage layer, an easy magnetization axis is, for example, parallel to a stacking direction of a stack.

Moreover, in each of the memory cell arrays according to the first and second aspects of the present disclosure including the various preferable forms and configurations described above, a projection image in an extending direction of the second wire can be orthogonal to a projection image in an extending direction of the word line, and the extending direction of the second wire can be parallel to the extending direction of the word line. Furthermore, the first direction is preferably orthogonal to the second direction.

Moreover, in each of the memory cell arrays according to the first and second aspects of the present disclosure including the various preferable forms and configurations described above, or in the memory cell of the present disclosure including the various preferable forms and configurations described above, the selection transistor can be constituted by a planar transistor, specifically, a field effect transistor (known MIS-FET or MOS-FET). Furthermore, in the memory cell array according to the second aspect of the present disclosure, the selection transistor can be constituted by a Fin-FET, thereby making it possible to suppress short channel characteristics. Alternatively, in the selection transistor, the channel forming region can be constituted by a semiconductor element having a tri-gate structure or a semiconductor element having a gate-all-around (GAA) structure or an omega (Ω) structure (specifically, for example, a FET in which a channel forming region is constituted by a nanowire or a nanosheet). The selection transistor may be an n-channel transistor or a p-channel transistor.

The nonvolatile memory element constituting each of the memory cell arrays according to the first and second aspects of the present disclosure including the various preferable forms and configurations described above or the nonvolatile memory element constituting the memory cell of the present disclosure including the various preferable forms and configurations described above (hereinafter, these nonvolatile memory elements may be referred to as "nonvolatile memory element or the like of the present disclosure" for convenience) can include at least a storage layer and a magnetization fixed layer, and the magnetization fixed layer can be connected to one source/drain region of the selection transistor, or the storage layer can be connected to one source/drain region of the selection transistor. The nonvolatile memory element or the like of the present disclosure constituted by a spin transfer torque based magnetic random access memory includes at least the storage layer and the magnetization fixed layer as described above. Specifically, the nonvolatile memory element or the like of the present disclosure can include a stack including at least the magnetization fixed layer, an intermediate layer, and the storage layer. In addition, a first surface (surface facing the selection transistor) of the stack is connected to a conductive base layer, and a second surface (surface facing the first surface) of the stack is in contact with the second wire. The base layer is connected to one source/drain region of the selection transistor. Specifically, the base layer is connected to a contact hole connecting one source/drain region of the selection transistor and the stack to each other. That is, one source/drain region of the selection transistor and the stack are electrically connected to each other by the contact hole. The other source/drain region of the selection transistor is connected to the first wire. In addition, by causing a current (a magnetization reversal current, also called a spin polarization current, which is a write current) to flow between the first wire and the second wire, information can be stored in the storage layer. That is, by causing a magnetization reversal current to flow in the stacking direction of the stack, the magnetization direction of the storage layer can be changed, and information can be recorded in the storage layer.

As described above, the magnetization fixed layer can be connected to one source/drain region of the selection transistor via the base layer. That is, the magnetization fixed layer can constitute the first surface of the stack, and a material-stable stack can be thereby obtained. However, the configuration is not limited thereto, and as described above, the storage layer can constitute the first surface of the stack.

As described above, the spin transfer torque based magnetic random access memory can have a structure in which a stack having a tunnel magnetoresistance (TMR) effect or a giant magnetoresistance (GMR) effect is constituted by a stack including a storage layer, an intermediate layer, and a magnetization fixed layer. In addition, for example, when a magnetization reversal current (a spin polarization current or a write current) is caused to flow from the storage layer to the magnetization fixed layer in a magnetization state of antiparallel arrangement, the magnetization of the storage layer is reversed by spin torque acting as electrons are injected from the magnetization fixed layer to the storage layer, and the magnetization direction of the storage layer, the magnetization direction of the magnetization fixed layer (specifically, a reference layer), and the magnetization direction of the storage layer are arranged in parallel. Meanwhile, for example, when the magnetization reversal current is caused to flow from the magnetization fixed layer to the storage layer in a magnetization state of parallel arrangement, the magnetization of the storage layer is reversed by spin torque acting as electrons flow from the storage layer to the magnetization fixed layer, and the magnetization direction of the storage layer and the magnetization direction of the magnetization fixed layer (specifically, a reference layer) are arranged in antiparallel. Alternatively, as illustrated in the conceptual diagram of FIG. 6B, a structure (double spin filter structure) can be adopted in which a stack having a TMR effect or a GMR effect is constituted by a magnetization fixed layer, an intermediate layer, a storage layer, an intermediate layer, and a magnetization fixed layer. In such a structure, it is necessary to make a difference in change in magnetoresistance between two intermediate layers located above and below the storage layer.

Here, a metal atom constituting the magnetization fixed layer and the storage layer can include a cobalt (Co) atom, an iron (Fe) atom, or a cobalt atom and an iron atom (Co—Fe). In other words, the metal atom constituting the magnetization fixed layer and the storage layer can include at least a cobalt (Co) atom or an iron (Fe) atom. That is, the magnetization fixed layer and the storage layer can be constituted by a metal material (an alloy or a compound) containing at least cobalt (Co) or iron (Fe).

Alternatively, the storage layer can be constituted by at least one metal material (an alloy or a compound) selected from the group consisting of cobalt, iron, and nickel, preferably by a metal material (an alloy or a compound) containing cobalt, iron, and nickel, or alternatively can be constituted by a metal material (an alloy or a compound) containing cobalt, iron, nickel, and boron. Alternatively, examples of the material constituting the storage layer can include an alloy of a ferromagnetic material such as nickel (Ni), iron (Fe), or cobalt (Co) (for example, Co—Fe, Co—Fe—B, Co—Fe—Ni, Fe—Pt, Ni—Fe, Fe—B, or Co—B), and alloys obtained by adding gadolinium (Gd) to these alloys. Moreover, in the perpendicular magnetization type, in order to further increase perpendicular magnetic anisotropy, a heavy rare earth element such as terbium (Tb), dysprosium (Dy), or holmium (Ho) may be added to such an alloy, or alloys containing these heavy rare earth elements may be added. Crystallinity of the storage layer is essentially arbitrary, and may be polycrystalline, monocrystalline, or amorphous. Furthermore, the storage layer can have a single-layer configuration, a stacked configuration in which the above-described plurality of different ferromagnetic material layers is stacked, or a stacked configuration in which a ferromagnetic material layer and a nonmagnetic body layer are stacked.

Furthermore, a nonmagnetic element can also be added to a material constituting the storage layer. By adding the nonmagnetic element, effects such as improvement in heat resistance due to prevention of diffusion, an increase in magnetoresistance effect, and an increase in dielectric strength due to flattening can be obtained. Examples of the nonmagnetic element to be added include B, C, N, O, F, Li, Mg, Si, P, Ti, V, Cr, Mn, Ni, Cu, Ge, Nb, Ru, Rh, Pd, Ag, Ta, Ir, Pt, Au, Zr, Hf, W, Mo, Re, and Os.

Moreover, ferromagnetic material layers having different compositions can be stacked as the storage layer. Alternatively, a ferromagnetic material layer and a soft magnetic material layer can be stacked, or a plurality of ferromagnetic material layers can be stacked via a soft magnetic material layer or a nonmagnetic body layer. In particular, in a case where a plurality of ferromagnetic material layers such as an Fe layer, a Co layer, an Fe—Ni alloy layer, a Co—Fe alloy layer, a Co—Fe—B alloy layer, an Fe—B alloy layer, and a Co—B alloy layer is stacked via a nonmagnetic body layer, a relationship in magnetic strength between the ferromagnetic material layers can be adjusted.

Therefore, it is possible to suppress an increase in a magnetization reversal current (also referred to as a spin polarization current) in the spin transfer torque based magnetic random access memory. Examples of a material of the nonmagnetic body layer include Ru, Os, Re, Ir, Au, Ag, Cu, Al, Bi, Si, B, C, Cr, Ta, Pd, Pt, Zr, Hf, W, Mo, Nb, V, and alloys thereof.

The storage layer can have a thickness of 0.5 nm to 30 nm, for example, and the magnetization fixed layer can have a thickness of 0.5 nm to 30 nm, for example.

The magnetization fixed layer can have a stacked ferri-structure (also referred to as a stacked ferri-pin structure) in which at least two magnetic material layers are stacked. One magnetic material layer constituting the stacked ferri-structure may be referred to as a "reference layer", and the other magnetic material layer constituting the stacked ferri-structure may be referred to as a "fixed layer". The stacked ferri-structure is a stacked structure having antiferromagnetic coupling, that is, a structure in which interlayer exchange coupling between two magnetic material layers (a reference layer and a fixed layer) is antiferromagnetic, is also referred to as a synthetic antiferromagnet (SAF), refers to a structure in which interlayer exchange coupling between two magnetic material layers is antiferromagnetic or ferromagnetic depending on the thickness of a nonmagnetic layer disposed between two magnetic material layers (a reference layer and a fixed layer), and is reported in, for example, S. S. Parkin et. al, Physical Review Letters, 7 May, pp 2304-2307 (1990). The magnetization direction of the reference layer is a magnetization direction serving as a reference of information to be stored in the storage layer. One magnetic material layer (reference layer) constituting the stacked ferri-structure is located on the storage layer side. That is, the reference layer is in contact with the intermediate layer. By adopting the stacked ferri-structure (also referred to as a stacked ferri-pin structure) for the magnetization fixed layer, asymmetry of thermal stability with respect to an information write direction can be reliably canceled, and stability against spin torque can be improved.

In addition, one magnetic material layer (for example, a reference layer) constituting the stacked ferri-structure contains at least one element selected from the group consisting of iron (Fe), cobalt (Co), and nickel (Ni), or contains at least one element selected from the group consisting of iron (Fe), cobalt (Co), and nickel (Ni), and boron (B). Specific examples thereof include a Co—Fe alloy, a Co—Fe—Ni alloy, a Ni—Fe alloy, and a Co—Fe—B alloy, and further include a stacked structure such as Fe layer/Pt layer, Fe layer/Pd layer, Co layer/Pt layer, Co layer/Pd layer, Co layer/Ni layer, or Co layer/Rh layer. By adding a nonmagnetic element such as Ag, Cu, Au, Al, Si, Bi, Ta, B, C, O, N, Pd, Pt, Zr, Ta, Hf, Ir, W, Mo, Nb, V, Ru, or Rh to these materials, magnetic characteristics may be adjusted, or various physical properties such as a crystal structure, crystallinity, and stability of a substance may be adjusted.

Meanwhile, the other magnetic material layer (for example, a fixed layer) constituting the stacked ferri-structure can include a material mainly containing at least one element (referred to as "element-A" for convenience) selected from the group consisting of iron (Fe), cobalt (Co), nickel (Ni), and manganese (Mn), and at least one element (an element different from the above-described element-A, and referred to as "element-B" for convenience) selected from the group consisting of platinum (Pt), palladium (Pd), nickel (Ni), manganese (Mn), iridium (Ir), and rhodium (Rh).

Moreover, examples of a material constituting the nonmagnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, Rh, Ti, and alloys thereof.

Alternatively, a configuration can be adopted in which the fixed layer is constituted by a stacked structure of Co thin film/Pt thin film, the reference layer is constituted by a stacked structure of Co thin film/Pt thin film/CoFeB thin film (the CoFeB thin film is in contact with the intermediate layer) in order to increase an MR ratio, and a nonmagnetic layer containing, for example, Ru is disposed between the fixed layer and the reference layer.

However, the magnetization fixed layer is not limited to the form having a stacked ferri-structure. A magnetization fixed layer including one layer and functioning as a reference layer can also be used. Examples of a material constituting such a magnetization fixed layer include a material (ferromagnetic material) constituting the storage layer. Alternatively, the magnetization fixed layer (reference layer) can be constituted by a stack of a Co layer and a Pt layer, a stack of a Co layer and a Pd layer, a stack of a Co layer and a Ni layer, a stack of a Co layer and a Tb layer, a Co—Pt alloy layer, a Co—Pd alloy layer, a Co—Ni alloy layer, a Co—Fe alloy layer, a Co—Tb alloy layer, a Co layer, an Fe layer, or a Co—Fe—B alloy layer. Alternatively, by adding a nonmagnetic element such as Ag, Cu, Au, Al, Si, Bi, Ta, B, C, O, N, Pd, Pt, Zr, Hf, Ir, W, Mo, Nb, V, Ru, or Rh to these materials, magnetic characteristics may be adjusted, or various physical properties such as a crystal structure, crystallinity, and stability of a substance may be adjusted. Moreover, the magnetization fixed layer (reference layer) can preferably include a Co—Fe—B alloy layer.

Alternatively, the magnetization direction of the magnetization fixed layer can be fixed by using antiferromagnetic coupling between an antiferromagnetic layer and a ferromagnetic layer. Specific examples of the antiferromagnetic material include an Fe—Mn alloy, an Fe—Pt alloy, a Ni—Mn alloy, a Pt—Mn alloy, a Pt—Cr—Mn alloy, an Ir—Mn alloy, a Rh—Mn alloy, a Co—Pt alloy, a cobalt oxide, a nickel oxide (NiO), and an iron oxide ($Fe_2O_3$). Alternatively, by adding a nonmagnetic element such as Ag, Cu, Au, Al, Si, Bi, Ta, B, C, O, N, Pd, Pt, Zr, Ta, Hf, Ir, W, Mo, Nb, V, Ru, or Rh to these materials, magnetic characteristics may be adjusted, or various physical properties such as a crystal structure, crystallinity, and stability of a substance may be adjusted. Examples of a material constituting the nonmagnetic layer can include ruthenium (Ru), an alloy thereof, and a ruthenium compound, or can include Os, Re, Ir, Au, Ag, Cu, Al, Bi, Si, B, C, Cr, Ta, Pd, Pt, Zr, Hf, W, Mo, Nb, V, Rh, and alloys thereof.

Since the magnetization direction of the magnetization fixed layer is a reference of information, the magnetization direction should not change by recording or reading information, but does not necessarily need to be fixed in a specific direction. It is only required to form a configuration and a structure in which the magnetization direction of the magnetization fixed layer is less likely to change than that of the storage layer by making a coercive force, a film thickness, or a magnetic damping constant larger than that of the storage layer.

The intermediate layer preferably includes a nonmagnetic body material. That is, in the spin transfer torque based magnetic random access memory, the intermediate layer in a case where the stack having a TMR effect is constituted preferably includes an insulating and nonmagnetic body material. The stack having a TMR effect and constituted by the magnetization fixed layer, the intermediate layer, and the storage layer refers to a structure in which an intermediate layer constituted by a nonmagnetic body material film functioning as a tunnel insulating film is sandwiched between the magnetization fixed layer including a magnetic material and the storage layer including a magnetic material. Here, examples of the insulating and nonmagnetic body material include various insulating materials, dielectric materials, and semiconductor materials such as magnesium oxide (MgO), magnesium nitride, magnesium fluoride, aluminum oxide ($AlO_X$), aluminum nitride (AlN), silicon oxide ($SiO_X$), silicon nitride (SiN), $TiO_2$, $Cr_2O_3$, Ge, NiO, $CdO_X$, $HfO_2$, $Ta_2O_5$, $Bi_2O_3$, $CaF_2$, $SrTiO_2$, $AlLaO_3$, Mg—$Al_2$—O, Al—N—O, BN, and ZnS. The intermediate layer including an insulating material preferably has an area resistance value of about several tens $\Omega \cdot \mu m^2$ or less. In a case where the intermediate layer includes magnesium oxide (MgO), the MgO layer is desirably crystallized, and more desirably has crystal orientation in the (001) direction. Furthermore, in a case where the intermediate layer includes magnesium oxide (MgO), the thickness thereof is desirably 1.5 nm or less. Meanwhile, examples of a material constituting the nonmagnetic body material film constituting the stack having a GMR effect can include a conductive material such as Cu, Ru, Cr, Au, Ag, Pt, Ta, or alloys thereof. An arbitrary nonmetallic material may be used as long as the conductivity thereof is high (resistivity is several hundred $\mu\Omega \cdot cm$ or less), but it is desirable to appropriately select a material that hardly causes an interface reaction with the storage layer or the magnetization fixed layer.

The intermediate layer including an insulating and nonmagnetic body material can be obtained, for example, by oxidizing or nitriding a metal layer (metal film) formed by a sputtering method. More specifically, in a case where aluminum oxide ($AlO_X$) or magnesium oxide (MgO) is used as the insulating material constituting the intermediate layer, for example, a method for oxidizing aluminum or magnesium formed by a sputtering method in the atmosphere, a method for plasma-oxidizing aluminum or magnesium formed by a sputtering method, a method for oxidizing aluminum or magnesium formed by a sputtering method with IPC plasma, a method for naturally oxidizing aluminum or magnesium formed by a sputtering method in oxygen, a method for oxidizing aluminum or magnesium formed by a sputtering method with oxygen radicals, a method for irradiating aluminum or magnesium formed by a sputtering method with an ultraviolet ray when the aluminum or magnesium is naturally oxidized in oxygen, a method for forming a film of aluminum or magnesium by a reactive sputtering method, and a method for forming a film of aluminum oxide ($AlO_X$) or magnesium oxide (MgO) by a sputtering method can be exemplified.

The three-dimensional shape of the stack is desirably a cylindrical shape or a columnar shape from a viewpoint of ensuring ease of processing and uniformity in a direction of an easy magnetization axis in the storage layer, but is not limited thereto, and can be a triangular prism, a quadrangular prism, a hexagonal prism, an octagonal prism, or the like (in which a side edge or a side ridge may be rounded), or an elliptic cylinder. The area of the stack is preferably, for example, 0.01 $\mu m^2$ or less from a viewpoint of easily reversing a magnetization direction with a low magnetization reversal current. By causing a magnetization reversal current to flow through the stack from the first wire to the second wire or from the second wire to the first wire, the magnetization direction in the storage layer is set to a direction parallel to the easy magnetization axis or a direction opposite to the easy magnetization axis, and information is thereby written in the storage layer.

The base layer is disposed in order to improve the crystallinity of the magnetic material layer constituting the stack, and includes Ta, Cr, Ru, Ti, or the like. Furthermore, a cap layer can be disposed between the second wire and the stack in order to prevent mutual diffusion between the second wire and atoms constituting the stack, to reduce contact resistance, and to prevent oxidation of the stack. However, in some cases, the second wire may be directly connected to the stack. In addition, in this case, the cap layer can have a single-layer structure including at least one material selected from the group consisting of hafnium, tantalum, tungsten, zirconium, niobium, molybdenum, titanium, vanadium, chromium, magnesium, ruthenium, rhodium, palladium, and platinum; a single-layer structure including an oxide such as a magnesium oxide layer, an aluminum oxide layer, a titanium oxide layer, a silicon oxide layer, a $Bi_2O_3$ layer, a $SrTiO_2$ layer, an $AlLaO_3$ layer, an Al—N—O layer, a Mg—Ti—O layer, or a $MgAl_2O_4$ layer; or a stacked structure of at least one material layer selected from the group consisting of hafnium, tantalum, tungsten, zirconium, niobium, molybdenum, titanium, vanadium, chromium, magnesium, ruthenium, rhodium, palladium, and platinum, and at least one oxide layer selected from the group consisting of MgTiO, MgO, AlO, and SiO (for example, Ru layer/Ta layer).

The various layers described above can be formed by, for example, a physical vapor deposition method (PVD method) exemplified by a sputtering method, an ion beam deposition method, and a vacuum vapor deposition method, and a chemical vapor deposition method (CVD method) typified by an atomic layer deposition (ALD) method. Furthermore, these layers can be patterned by a reactive ion etching method (RIE method) or an ion milling method (ion beam etching method). The various layers are preferably formed continuously in a vacuum apparatus, and then preferably patterned.

The base layer, the second wire, the first wire, various other wires, wiring layers, and the like may each have a single-layer structure of Ta or TaN, or Cu, Al, Au, Pt, Ti, Ru, W, or the like, or a compound thereof, or may each have a stacked structure of a base film including Cr, Ti, or the like, and a Cu layer, a Au layer, a Pt layer, or the like formed on the base film. Alternatively, the base layer, the second wire, the first wire, various other wires, wiring layers, and the like can each have a single-layer structure of Ta or a compound thereof, or a stacked structure with Cu, Ti, or the like, or a compound thereof. These electrodes and the like can be formed by, for example, a PVD method exemplified by a sputtering method.

A contact hole, a connection hole, and a pad portion electrically connecting the base layer and the source/drain region of the selection transistor to each other can each include polysilicon doped with impurities, a high melting point metal such as tungsten, Ti, Pt, Pd, Cu, TiW, TiNW, $WSi_2$, or $MoSi_2$, or a metal silicide, and can be formed on the basis of a CVD method or a PVD method exemplified by a sputtering method. A barrier metal layer is formed on an inner wall or a bottom of the contact hole or the connection hole. Furthermore, examples of materials constituting various insulating layers, various interlayer insulating layers, and a gate insulating layer include silicon oxide ($SiO_2$), silicon nitride (SiN), SiON, SiOC, SiOF, SiCN, spin-on-glass (SOG), non-doped silicate glass (NSG), boron-phosphorus-silicate glass (BPSG), PSG, BSG, PbSG, AsSG, SbSG, LTO, and $Al_2O_3$. Alternatively, examples thereof include a low dielectric constant insulating material (for example, fluorocarbon, cycloperfluorocarbon polymer, benzocyclobutene, cyclic fluororesin, polytetrafluoroethylene, amorphous tetrafluoroethylene, polyaryl ether, fluorinated aryl ether, fluorinated polyimide, organic SOG, parylene, fluorinated fullerene, or amorphous carbon), a polyimide-based resin, a fluorine-based resin, Silk (trademark of The Dow Chemical Co., coating type low dielectric constant interlayer insulating film material), and Flare (trademark of Honeywell Electronic Materials Co., polyallyl ether (PAE)-based material). These materials can be used singly or in combination appropriately. Alternatively, examples thereof include a high-K (high dielectric constant) film (for example, a Hf oxide, $Al_2O_3$, a Ru oxide, a Ta oxide, a Si oxide containing Al, Ru, Ta, and Hf, a Si nitride containing Al, Ru, Ta, and Hf, and a Si oxynitride containing Al, Ru, Ta, and Hf) that can be formed at a low temperature. Alternatively, examples thereof include an organic insulating material (organic polymer) exemplified by a straight chain hydrocarbon having a functional group capable of bonding to a control electrode at one end, such as polymethyl methacrylate (PMMA); polyvinyl phenol (PVP); polyvinyl alcohol (PVA); polyimide; polycarbonate (PC); polyethylene terephthalate (PET); polystyrene; a silanol derivative (silane coupling agent) such as N−2 (aminoethyl) 3-aminopropyltrimethoxysilane (AEAPTMS), 3-mercaptopropyltrimethoxysilane (MPTMS), or octadecyl trichlorosilane (OTS); a novolac type phenol resin; a fluorine-based resin; octadecanethiol, or dodecyl isocyanate. A combination thereof can be also used. Various insulating layers and various interlayer insulating layers can be formed on the basis of a known method such as various CVD methods, a coating method, various PVD methods including a sputtering method and a vacuum vapor deposition method, various printing methods including a screen printing method, or a sol-gel method. The contact hole and the connection hole may be formed on the pad portion.

The semiconductor layer (base portion) can be constituted by, for example, a silicon semiconductor substrate, or can be constituted by an SOI substrate (specifically, a silicon layer constituting an SOI substrate or the like). Examples of the SOI substrate include an SOI substrate formed on the basis of a smart cut method and a substrate bonding technique, an SOI substrate formed on the basis of a separation by implantation of oxygen (SIMOX) method, and an SOI substrate in which an insulating layer is formed on a surface of a silicon semiconductor substrate and a silicon layer is formed on the insulating layer. Alternatively, the semiconductor layer can be constituted by an InGaAs layer or a Ge layer instead of the silicon layer.

Examples of an electronic device incorporating the memory cell of the present disclosure or each of the memory cell arrays according to the first and second aspects of the present disclosure include a portable electronic device such as a mobile device, a game device, a music device, or a video device, a fixed electronic device, and a magnetic head. Furthermore, examples thereof further include a storage device including the memory cell of the present disclosure or each of the memory cell arrays according to the first and second aspects of the present disclosure. The memory cell of the present disclosure or each of the memory cell arrays according to the first and second aspects of the present disclosure can also be used as a one time programmable memory (OTP memory).

Example 1

Figure 5:
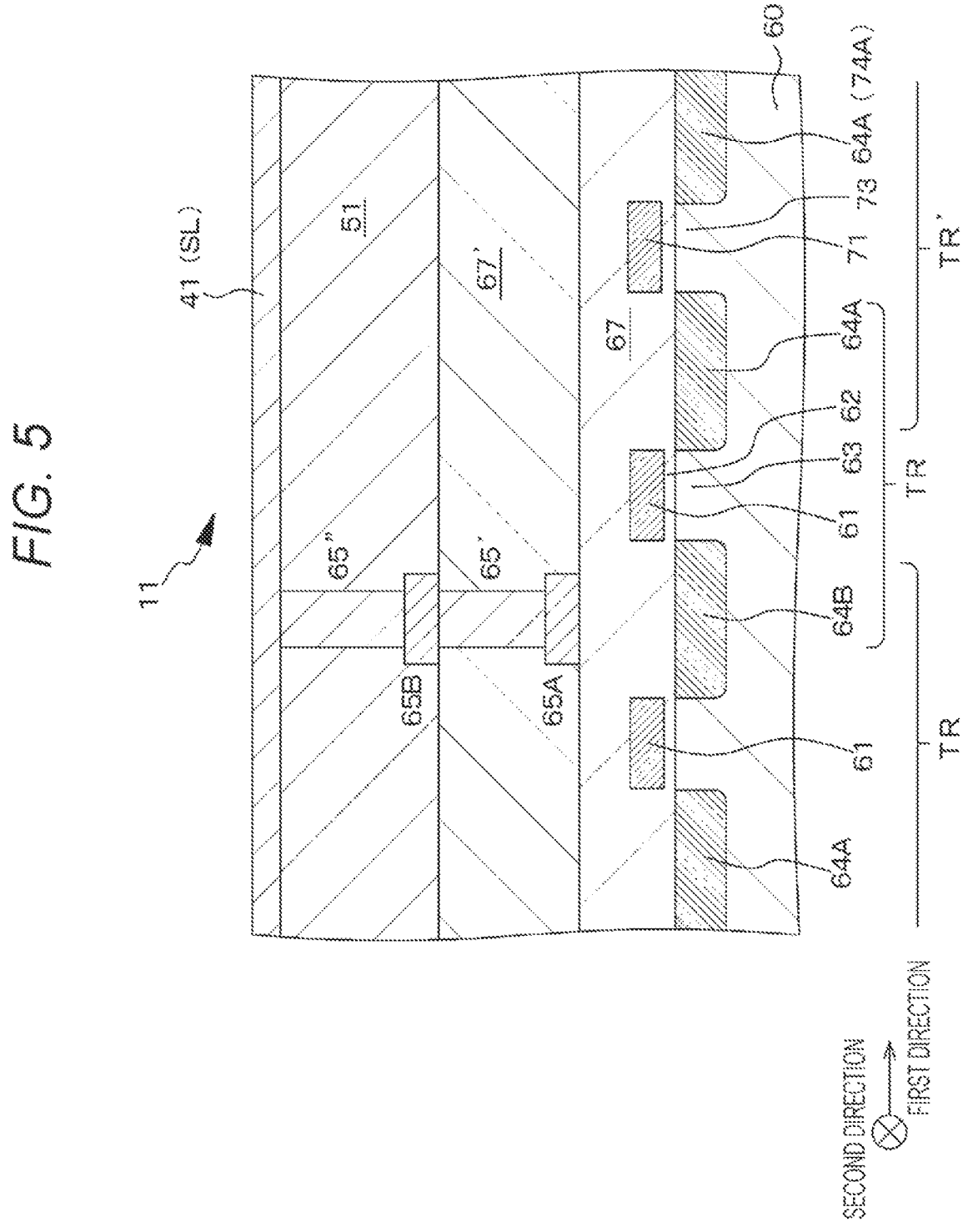
FIG. 5 is a partial cross-sectional view of the memory cell and the memory cell array of Example 1 taken along an arrow A-A in FIG. 4.
Figure 6:
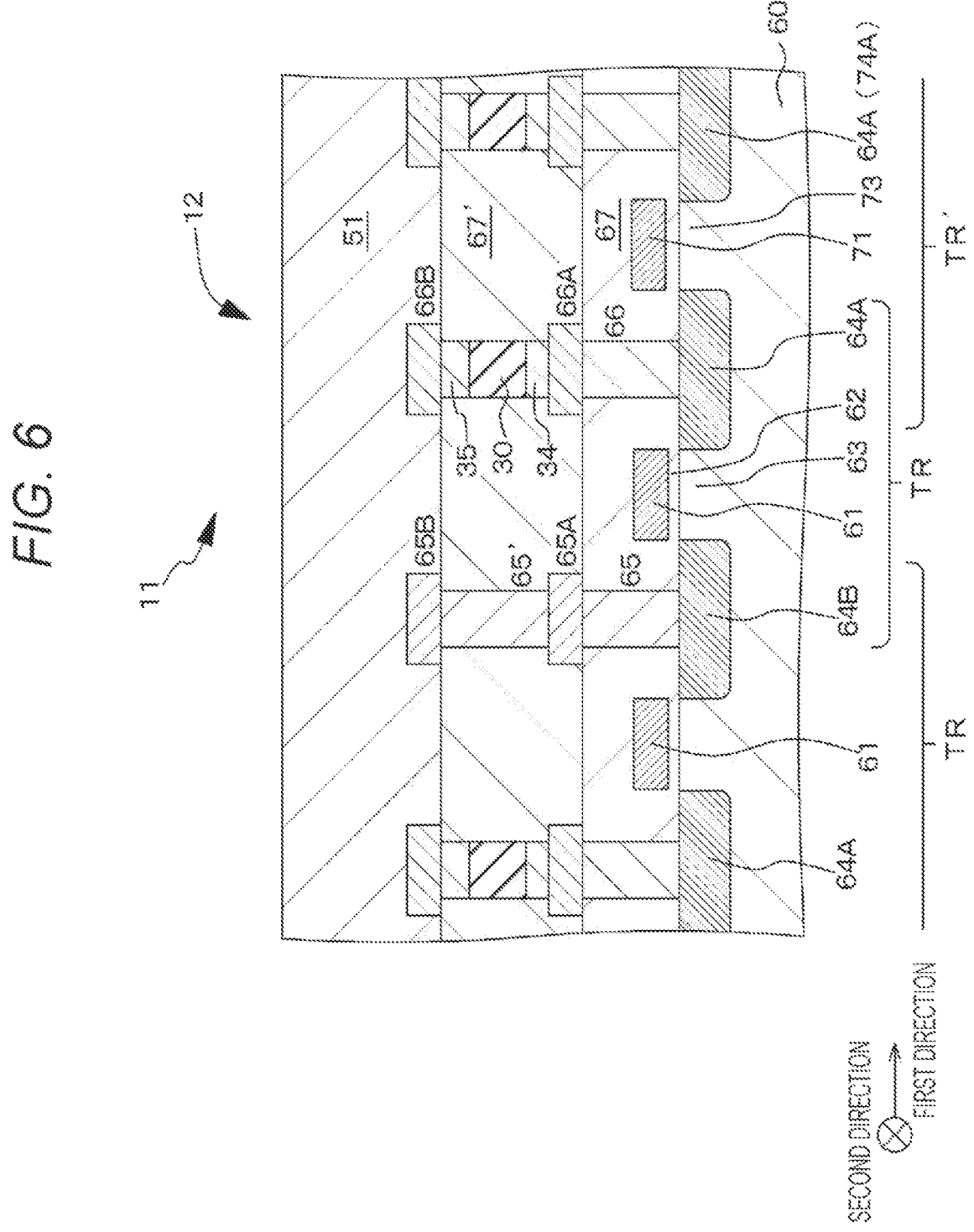
FIG. 6 is a partial end view of the memory cell and the memory cell array of Example 1 taken along an arrow B-B in FIG. 4.
Figure 8:
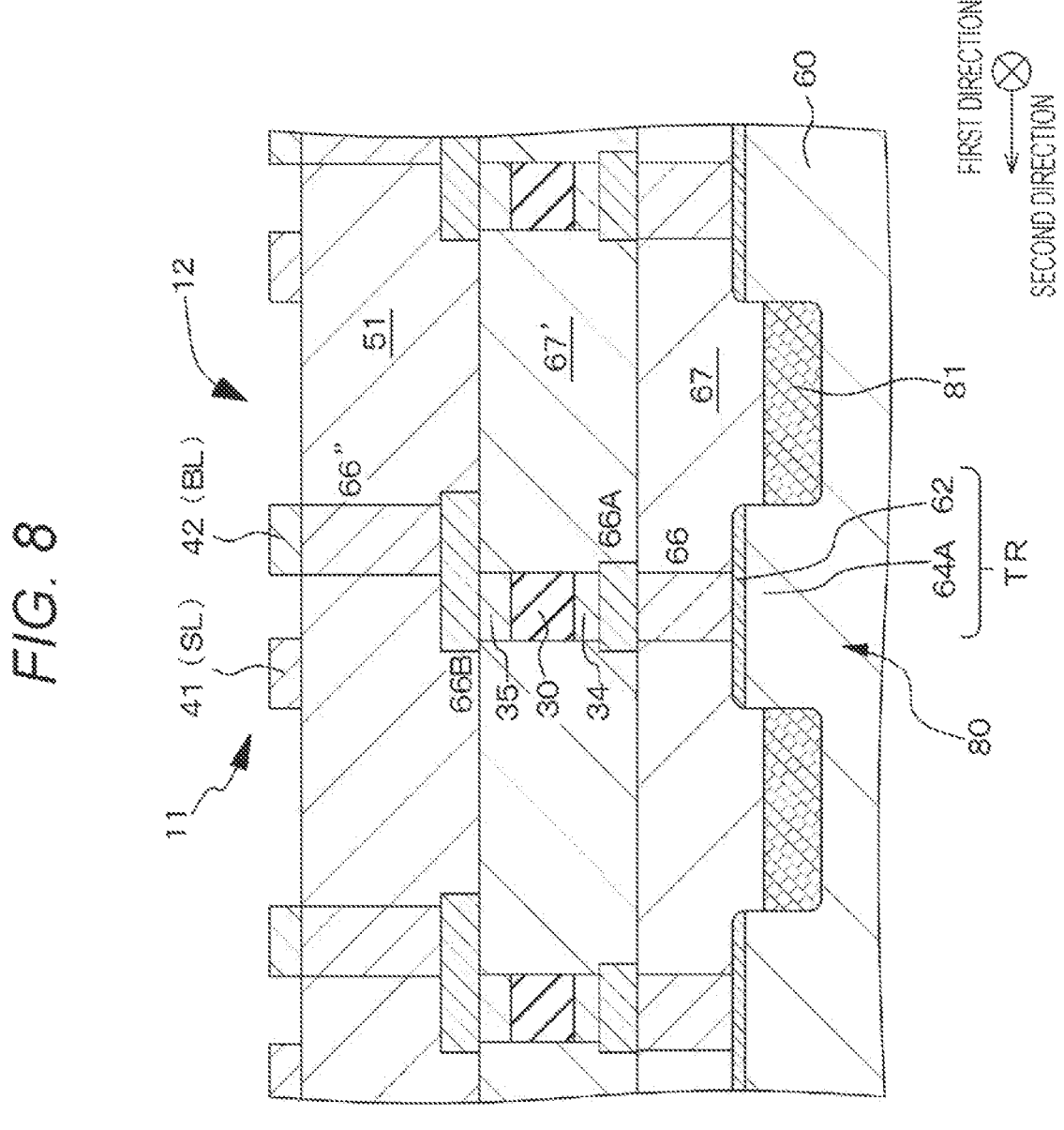
FIG. 8 is a partial end view of the memory cell and the memory cell array of Example 1 taken along an arrow D-D in FIG. 4.
Figure 9:
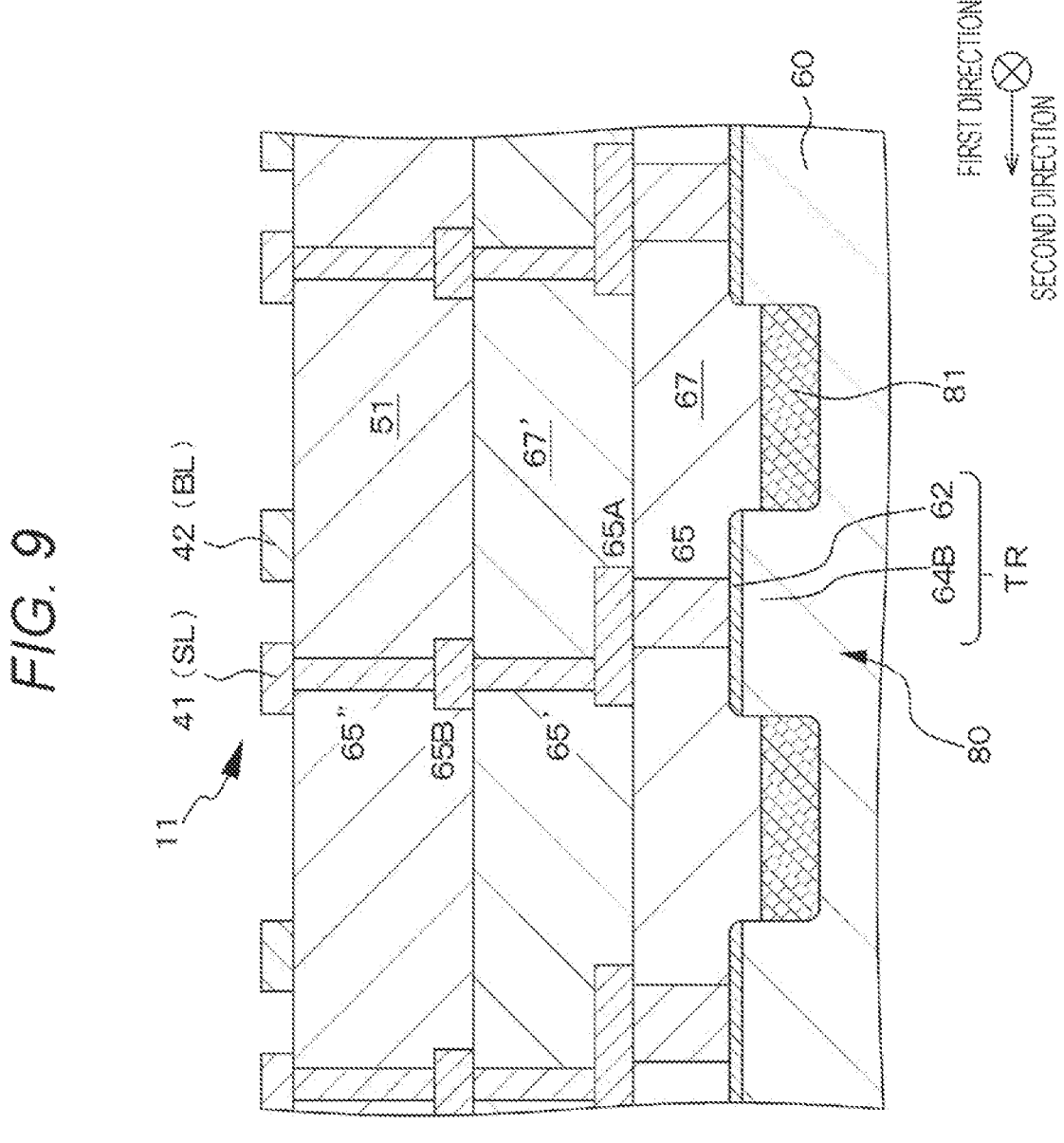
FIG. 9 is a partial end view of the memory cell and the memory cell array of Example 1 taken along an arrow E-E in FIG. 4.
Figure 10:
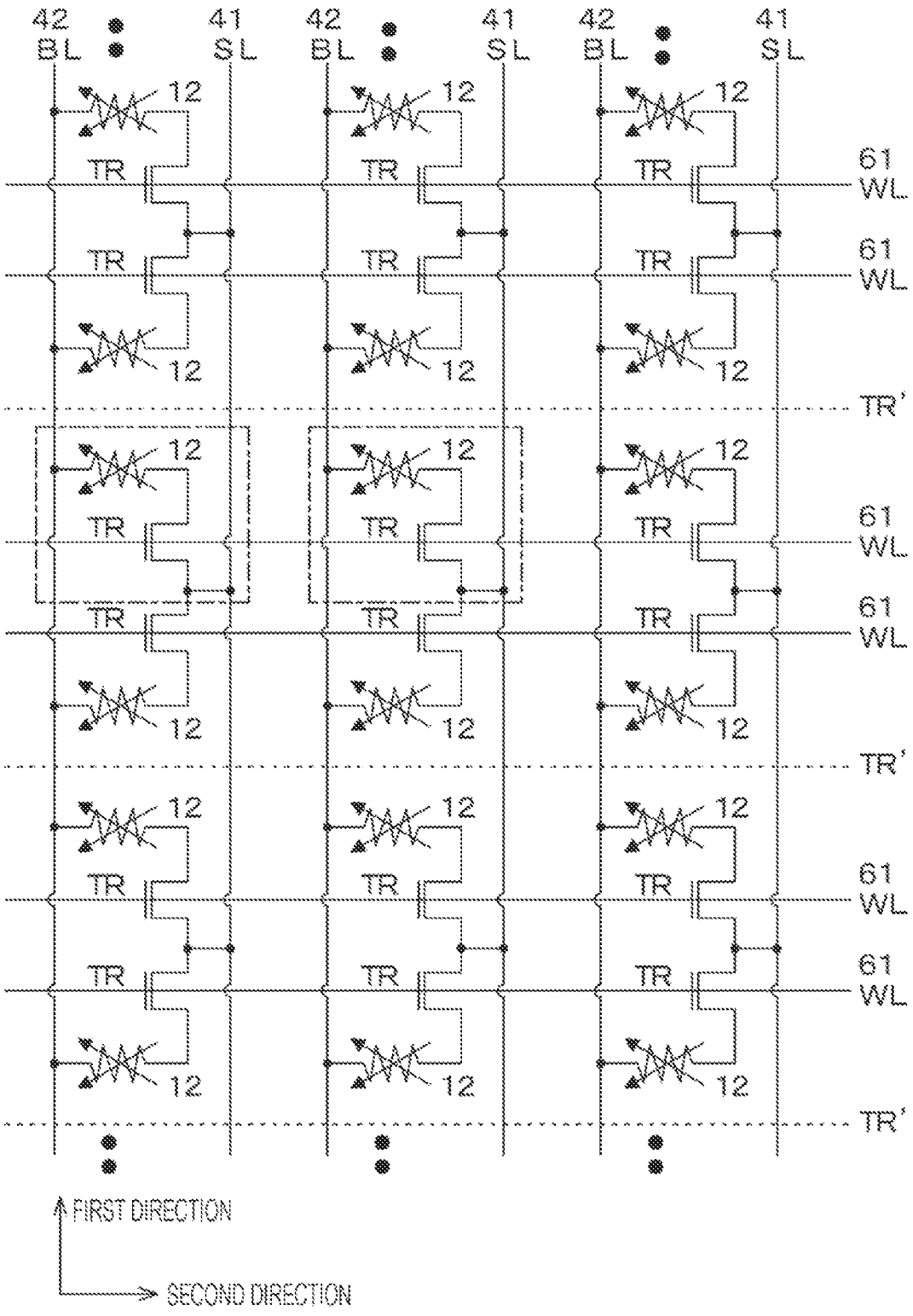
FIG. 10 is an equivalent circuit diagram of the memory cell array of Example 1.
Figure 11A:
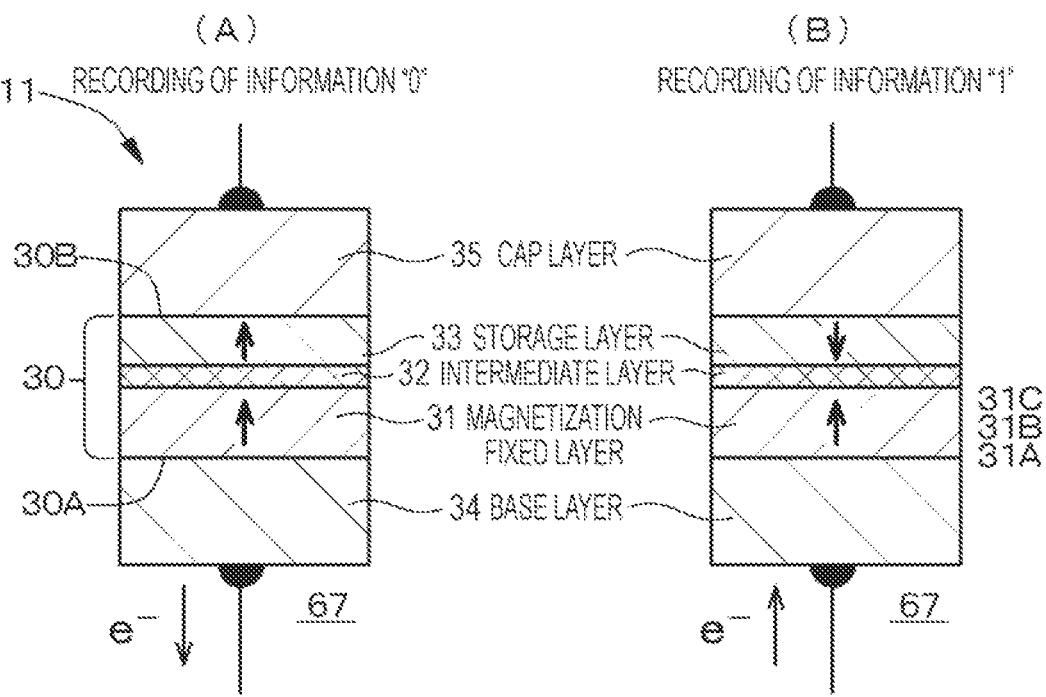
FIGS. 11A and 11B are a conceptual diagram of a nonvolatile memory element (spin transfer torque based magnetic random access memory to which spin transfer magnetization reversal is applied) of Example 1 and a conceptual diagram of a spin transfer torque based magnetic random access memory having a double spin filter structure, respectively.
Figure 11B:
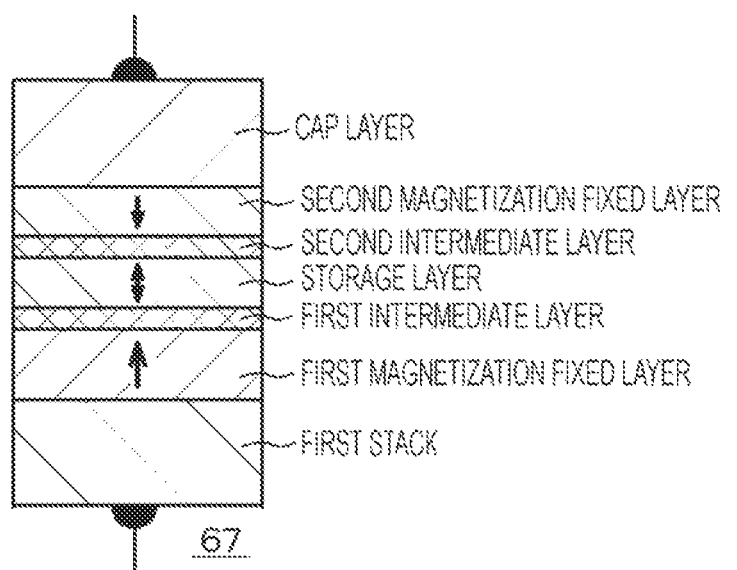

Example 1 relates to the memory cell of the present disclosure and the memory cell array according to the first aspect of the present disclosure. FIG. 1 illustrates a partial cross-sectional view of the memory cell and the memory cell array of Example 1 taken along a one-dot chain line in FIG. 3. FIG. 2 illustrates a partial end view of the memory cell and the memory cell array of Example 1 taken along an arrow F-F in FIG. 4. FIG. 3 schematically illustrates an arrangement state of two memory cells of Example 1. FIG. 4 schematically illustrates an arrangement state of the memory cell array of Example 1. Moreover, FIG. 5 illustrates a partial cross-sectional view of the memory cell and the memory cell array of Example 1 taken along an arrow A-A in FIG. 4. FIG. 6 illustrates a partial end view of the memory cell and the memory cell array of Example 1 taken along an arrow B-B in FIG. 4. FIG. 7 illustrates a partial cross-sectional view of the memory cell and the memory cell array of Example 1 taken along an arrow C-C in FIG. 4. FIG. 8 illustrates a partial end view of the memory cell and the memory cell array of Example 1 taken along an arrow D-D in FIG. 4. FIG. 9 illustrates a partial end view of the memory cell and the memory cell array of Example 1 taken along an arrow E-E in FIG. 4. Furthermore, FIG. 10 illustrates an equivalent circuit diagram of the memory cell array of Example 1. FIG. 11A illustrates a conceptual diagram of a nonvolatile memory element (spin transfer torque based magnetic random access memory to which spin transfer magnetization reversal is applied) of Example 1. FIG. 11B illustrates a conceptual diagram of a spin transfer torque based magnetic random access memory having a double spin filter structure. Note that, in FIGS. 10, 23, and 24, the position where an element isolation transistor is disposed is conceptually indicated by a dotted line. Furthermore, the planar shapes of various components in FIGS. 4, 12, and 16 each schematically illustrating an arrangement state of a memory cell array are schematic shapes, and are not particularly meaningful.

The memory cell array of Example 1 or each of Examples 2 to 5 described later is a memory cell array including a plurality of memory cells 11 arranged in a first direction and a second direction different from the first direction. Note that the first direction is preferably orthogonal to the second direction. In addition, each of the memory cells 11 includes:

a resistance-variable nonvolatile memory element 12; and a selection transistor TR electrically connected to the nonvolatile memory element 12.

In addition, in the memory cell array or the memory cell 11 of Example 1, the selection transistor TR is formed in an active region 80 provided in a semiconductor layer 60, at least a part of the active region 80 is in contact with an element isolation region 81 provided in the semiconductor layer 60, and a surface of the element isolation region 81 is located at a position lower than a surface of the active region 80.

Here, a difference ΔH in a height direction between a top surface of the active region 80 and the surface of the element isolation region 81 is desirably 15 nm to 35 nm. Specifically, in Example 1 or Example 3 described later, a value of ΔH is set to 25 nm.

Furthermore, the memory cells 11 adjacent to each other in the second direction are isolated from each other by the element isolation region 81. In addition, the memory cells 11 adjacent to each other in the first direction are isolated from each other by an element isolation transistor TR'. Note that the element isolation transistor TR' preferably has the same structure as the selection transistor TR. By operation of the element isolation transistor TR', a current can be prevented from flowing between the memory cells 11 (specifically, between the selection transistors TR). Here, the element isolation transistor TR' includes a gate electrode 71, a gate insulating layer 62, a channel forming region 73, and source/drain regions 74A (64A) and 74B (64A). By applying an appropriate voltage to the gate electrode 71 of the element isolation transistor TR', the element isolation transistor TR' is in a non-conductive state all the time.

Here, in Example 1 or each of Examples 2 to 5 described later, the selection transistor TR includes a gate electrode 61, the gate insulating layer 62, a channel forming region 63, and source/drain regions 64A and 64B, one source/drain region 64A of the selection transistor TR is electrically connected to one end of the nonvolatile memory element 12, the other source/drain region 64B of the selection transistor TR is electrically connected to a first wire 41 (a selection line SL, a sense line), the other end of the nonvolatile memory element 12 is electrically connected to a second wire 42 (a bit line BL), a word line WL also serving as the gate electrode 61 of the selection transistor TR extends in the second direction, and the channel forming region 63 and the source/drain regions 64A and 64B of the selection transistor TR are arranged in the first direction. Furthermore, the other source/drain region 64B of the selection transistor TR is shared by a (2m−1)-th (in which m=1, 2, 3 . . . ) memory cell 11 and a 2m-th memory cell 11 arranged in the first direction, and the 2m-th memory cell 11 and a (2m+1)-th memory cell 11 are isolated from each other by the element isolation transistor TR'.

As described above, in the memory cell array of Example 1, the selection transistor TR is shared by the two memory cells 11 to constitute a memory cell unit. The three-dimensional shape of the nonvolatile memory element 12 is a cylindrical shape (columnar shape) or a quadrangular prism, but is not limited thereto.

In the memory cell unit, the (2m−1)-th memory cell 11 and the 2m-th memory cell 11 arranged in the first direction are sandwiched between two element isolation transistors TR'. In addition, the nonvolatile memory element 12 of the (2m−1)-th memory cell 11 is electrically connected to the other source/drain region 74B of a first element isolation transistor TR', and the nonvolatile memory element 12 of the 2m-th memory cell 11 is electrically connected to one source/drain region 74A of a second element isolation transistor TR'. The other source/drain region 74B of the first element isolation transistor TR' also serves as one source/drain region 64A of the selection transistor TR in the (2m−1)-th memory cell 11, and one source/drain region 74A of the second element isolation transistor TR' also serves as one source/drain region 64A of the selection transistor TR in the 2m-th memory cell 11. The same applies to Examples 2 to 3 described later.

Moreover, the word line WL of the selection transistor TR extends from an edge portion of the active region 80 along a side surface 80' of the active region 80 in the second direction, and further extends on the element isolation region 81. Furthermore, when a difference in a height direction between a top surface of the active region 80 and a surface of the element isolation region 81 is represented by ΔH, and the width of a channel forming region of the selection transistor TR in the second direction is represented by $L_W$, $$0.08 \leq \Delta H / L_W \leq 0.28$$

preferably, $$0.125 \leq \Delta H / L_W \leq 0.28$$

is satisfied. Specifically, $$\Delta H / L_W = 0.15$$

is satisfied. The element isolation region 81 has a shallow trench structure. Specifically, the element isolation region 81 can be formed by forming a recess in the semiconductor layer 60 and embedding the recess with an insulating material such as $SiO_2$ or SiN. Note that the semiconductor layer 60 is specifically constituted by a silicon semiconductor substrate. Furthermore, in order to suppress electric field concentration, an end portion 80″ of the active region 80 facing the element isolation region 81 is rounded such that the gate insulating layer 62 is not thin at the end portion 80″ of the active region 80.

The nonvolatile memory element 12 constituting the memory cell in Example 1 or each of Examples 2 to 5 described later and constituted by a resistance-variable nonvolatile memory element includes a stack 30 formed by stacking a storage layer (also referred to as a magnetization reversal layer or a free layer) 33, an intermediate layer 32, and a magnetization fixed layer 31, and having a first surface 30A and a second surface 30B facing the first surface 30A. In addition, the magnetization fixed layer 31 is located on the first surface 30A side, and the storage layer 33 is located on the second surface 30B side. The first surface 30A of the magnetization fixed layer 31 is in contact with a base layer 34, and the base layer 34 is formed on a lower layer/interlayer insulating layer 67 containing $SiO_2$. A pad portion 66A is disposed between the base layer 34 and the lower layer/interlayer insulating layer 67, but the formation of the pad portion 66A may be omitted.

The magnetization fixed layer 31 has a stacked ferri-structure (also referred to as a stacked ferri-pin structure) in which at least two magnetic material layers are stacked. A nonmagnetic layer 31B containing ruthenium (Ru) is formed between one magnetic material layer (reference layer) 31C constituting the stacked ferri-structure and the other magnetic material layer (fixed layer) 31A constituting the stacked ferri-structure.

The storage layer 33 includes a ferromagnetic material having a magnetic moment whose magnetization direction freely changes in the stacking direction of the stack 30, more specifically, a Co—Fe—B alloy $[(Co_{20}Fe_{80})_{80}B_{20}]$. The intermediate layer 32 including a nonmagnetic body material is constituted by an insulating layer functioning as a tunnel barrier layer (tunnel insulating film), specifically, a magnesium oxide (MgO) layer. By constituting the intermediate layer 32 by a MgO layer, a magnetoresistance change ratio (MR ratio) can be increased, efficiency of spin transfer can be thereby improved, and a magnetization reversal current density required for reversing the magnetization direction of the storage layer 33 can be reduced. Moreover, a cap layer 35 is formed in contact with the second surface 30B of the stack 30.

Moreover, in the memory cell array of Example 1, the magnetization direction of the storage layer 33 changes according to information to be stored. In addition, in the storage layer 33, an easy magnetization axis is parallel to the stacking direction of the stack 30 (that is, a perpendicular magnetization type). That is, the nonvolatile memory element 12 in the memory cell array of Example 1 is constituted by a perpendicular magnetization type spin transfer torque based magnetic random access memory. In other words, the nonvolatile memory element 12 in Example 1 is constituted by an MTJ element. A magnetization direction of the reference layer 31C is a magnetization direction serving as a reference of information to be stored in the storage layer 33, and information "0" and information "1" are defined by a relative angle between the magnetization direction of the storage layer 33 and the magnetization direction of the reference layer 31C.

The base layer 34 is connected to a contact hole 66. Specifically, the base layer 34 is formed on the pad portion 66A disposed on the contact hole 66. Furthermore, the cap layer 35 is connected to the second wire 42. In addition, by causing a current (a magnetization reversal current, a write current) to flow between the first wire 41 and the second wire 42, information is stored in the storage layer 33. That is, by causing a magnetization reversal current to flow in the stacking direction of the stack 30, the magnetization direction of the storage layer 33 can be changed, and information is recorded in the storage layer 33. As described above, the easy magnetization axis in the reference layer 31C is parallel to the stacking direction of the stack 30. That is, the reference layer 31C includes a ferromagnetic material having a magnetic moment whose magnetization direction changes in a direction parallel to the stacking direction of the stack 30, more specifically, a Co—Fe—B alloy $[(Co_{20}Fe_{80})_{80}B_{20}]$. Moreover, the fixed layer 31A is constituted by a Co—Pt alloy layer, and forms a stacked ferri-structure magnetically coupled to the reference layer 31C via the nonmagnetic layer 31B containing ruthenium (Ru).

Various layer configurations in Example 1 or each of Examples 2 to 5 described later are listed in Table 1 below.

TABLE 1

| Cap layer 35 | stacking of a Ta layer having a film thickness of 1 nm and a Ru layer having a film thickness of 5 nm |
|---|---|
| Stack 30 | |
| Storage layer 33 | $(Co_{20}Fe_{80})_{80}B_{20}$ layer having a film thickness of 1.6 nm |
| Intermediate layer 32 | MgO layer having a film thickness of 1.0 nm |
| Magnetization fixed layer 31 | |
| Reference layer 31C | $(Co_{20}Fe_{80})_{80}B_{20}$ layer having a film thickness of 1.0 nm |
| Nonmagnetic layer 31B | Ru layer having a film thickness of 0.8 nm |
| Fixed layer 31A | Co—Pt alloy layer having a film thickness of 2.5 nm |
| Base layer 34 | Ta layer having a film thickness of 5 nm |

The selection transistor TR constituted by a field effect transistor is disposed below the stack 30. Specifically, the selection transistor TR formed in the semiconductor layer 60 constituted by a silicon semiconductor substrate and the lower layer/interlayer insulating layer 67 covering the selection transistor TR are disposed.

In addition, the other source/drain region 64B of the selection transistor TR is connected to the first wire 41 via a contact hole 65 formed in the lower layer/interlayer insulating layer 67; a pad portion 65A disposed on the lower layer/interlayer insulating layer 67; a contact hole 65' formed in the lower layer/interlayer insulating layer 67 and an upper layer/interlayer insulating layer 67' formed on the pad portion 65A; a pad portion 65B disposed on the upper layer/interlayer insulating layer 67'; and a contact hole 65" formed in the upper layer/interlayer insulating layer 67' and an insulating material layer 51 formed on the pad portion 65B.

In addition, one source/drain region 64A of the selection transistor TR is connected to the second wire 42 via a contact hole 66 formed in the lower layer/interlayer insulating layer 67; a pad portion 66A disposed on the lower layer/interlayer insulating layer 67; the base layer 34, the stack 30, and the cap layer 35 formed on pad portion 66A; a pad portion 66B disposed on the upper layer/interlayer insulating layer 67' surrounding the pad portion 66A, the base layer 34, the stack 30, and the cap layer 35; and a contact hole 66" disposed in the insulating material layer 51 formed on the upper layer/ interlayer insulating layer 67' and the pad portion 66B.

The gate electrode 61 also functions as a so-called word line WL or an address line. In addition, a projection image in an extending direction of the second wire 42 is orthogonal to a projection image in an extending direction of the gate electrode 61 (word line WL), and is parallel a projection image in an extending direction of the first wire 41. Furthermore, an extending portion of the gate electrode 61 of the element isolation transistor TR' also extends in the second direction.

Hereinafter, a method for manufacturing the memory cell array of Example 1 will be described.
[Step-100]

First, the selection transistor TR constituting the memory cell 11 is formed in the semiconductor layer (silicon semiconductor substrate) 60, and then the lower layer/interlayer insulating layer 67 is formed on the entire surface. Specifically, a recess is formed in the semiconductor layer (silicon semiconductor substrate) 60 on the basis of a known method in order to form the element isolation region 81. Furthermore, the end portion 80" of the semiconductor layer (silicon semiconductor substrate) 60 facing the recess has a rounded structure. Then, an insulating material is formed on the entire surface, the insulating material is removed except for a portion where the element isolation region 81 is to be formed, and moreover, a top surface of the insulating material in the portion where the element isolation region 81 is to be formed is etched. In this way, it is possible to obtain a structure in which a surface of the element isolation region 81 is located at a position lower than a surface of the active region 80, specifically, a surface of the semiconductor layer (silicon semiconductor substrate) 60. The element isolation region 81 has a shallow trench structure. Furthermore, the end portion 80" of the active region 80 facing the element isolation region 81 has a rounded structure.
[Step-110]

Thereafter, the selection transistor TR including the gate insulating layer 62, the gate electrode 61, and the source/ drain regions 64A and 64B is formed on the basis of a known method. In addition, the element isolation transistor TR' including the gate insulating layer 62, the gate electrode 71, the source/drain regions 74A (64A) and 74B (64A), and the channel forming region 73 is formed. A portion of the semiconductor layer 60 located between the source/drain region 64A and the source/drain region 64B corresponds to the channel forming region 63. Furthermore, the element isolation transistor TR' having the same structure as the selection transistor TR is formed between the memory cells. Next, the lower layer/interlayer insulating layer 67 is formed on the entire surface, the contact hole 65 is formed in a portion of the lower layer/interlayer insulating layer 67 above the other source/drain region 64B, and the contact hole 66A is formed in a portion of the lower layer/interlayer insulating layer 67 above the one source/drain region 64A. Then, the pad portions 65A and 66A in contact with the contact holes 65 and 66 are disposed on the lower layer/ interlayer insulating layer 67.
[Step-120]

Thereafter, a stacked film electrically connected to the selection transistor constituting the memory cell for forming the nonvolatile memory element 12 is formed on the lower layer/interlayer insulating layer 67, and then the stacked film is patterned (specifically, etched) to form the nonvolatile memory element 12. Specifically, the pad portions 65A and 66A are formed on the lower layer/interlayer insulating layer 67. Subsequently, the base layer 34, the stack 30, and the cap layer 35 are continuously formed on the entire surface. Subsequently, the cap layer 35, the stack 30, and the base layer 34 are patterned on the basis of a reactive ion etching method (RIE method) or an ion milling method (ion beam etching method). The base layer 34 is in contact with the pad portion 66A. The intermediate layer 32 containing magnesium oxide (MgO) was formed by forming a MgO layer on the basis of an RF magnetron sputtering method. Furthermore, the other layers were formed on the basis of a DC magnetron sputtering method.
[Step-130]

Next, the upper layer/interlayer insulating layer 67' is formed on the entire surface, and the upper layer/interlayer insulating layer 67' is flattened to make a top surface of the upper layer/interlayer insulating layer 67' at the same level as a top surface of the cap layer 35. Then, the contact hole 65' is formed in a portion of the upper layer/interlayer insulating layer 67' above the pad portion 65A. Thereafter, the pad portions 65B and 66B connected to the contact hole 65' and the cap layer 35 are formed on the upper layer/ interlayer insulating layer 67', the insulating material layer 51 covering the upper layer/interlayer insulating layer 67' and the pad portions 65B and 66B is formed, the insulating material layer 51 is flattened, and the contact holes 65" and 66" are formed in a portion of the insulating material layer 51 above the pad portions 65B and 66B. Thereafter, the first wire 41 and the second wire 42 connected to the contact holes 65" and 66" are formed on the insulating material layer 51. In this way, a memory cell having the structure illustrated in FIG. 1 and the like (specifically, a spin transfer torque based magnetic random access memory) can be obtained.

As described above, a general MOS manufacturing process can be applied to manufacture of the memory cell in Example 1, and the memory cell can be applied as a general-purpose memory.

In a case of a resistance-variable nonvolatile memory element that stores binary information, the nonvolatile memory element is a type of so-called resistance-variable element that takes two states of a high resistance state (HRS) and a low resistance state (LRS), and these states are associated with, for example, "1" and "0", respectively. In addition, in general, a 0/1 state of the resistance-variable nonvolatile memory element is determined by whether a resistance value thereof is higher or lower than a reference resistance value for comparison, which is also called a reference resistance value, and a sense amplifier for performing this comparison determination is disposed. The reference resistance value is often combined on the basis of a plurality of memory elements in which HRS or LRS is written in advance (these are referred to as "reference elements"). That is, the reference resistance value is generated as an average value of a resistance value in HRS and a resistance value in LRS. In the memory cell array of Example 1 or each of Examples 2 to 4 described later, at the time of reading data, a voltage appearing in the first wire 41 is compared with a reference voltage, and it is determined whether data "1" or "0" is stored by a high or low voltage.

By the way, information is defined by the direction of a magnetization direction of the storage layer 33 having uniaxial anisotropy. Information is written by causing a magnetization reversal current (spin polarization current) to flow in the stacking direction of the stack 30 to cause spin torque magnetization reversal. Hereinafter, spin torque magnetization reversal will be briefly described with reference to FIG. 11A, which is a conceptual diagram of a spin transfer torque based magnetic random access memory to which spin transfer magnetization reversal is applied. Electrons have two types of spin angular momenta. These are defined as an upward momentum and a downward momentum. The number of upward momenta is the same as that of downward momenta in a nonmagnetic body, and the number of upward momenta is different from that of downward momenta in a ferromagnetic body.

It is assumed that directions of magnetic moments of the storage layer 33 and the reference layer 31C each including a ferromagnetic material are antiparallel to each other. In this state, information "1" is stored in the storage layer 33. It is assumed that the information "1" stored in the storage layer 33 is rewritten to "0". In this case, a magnetization reversal current (spin polarization current) is caused to flow from the storage layer 33 to the magnetization fixed layer 31 from the state illustrated in the conceptual diagram of (B) of FIG. 11A. That is, electrons are caused to flow from the magnetization fixed layer 31 toward the storage layer 33. Electrons that have passed through the reference layer 31C cause spin polarization, that is, a difference is generated between the number of upward momenta and the number of downward momenta. When the intermediate layer 32 is sufficiently thin and electrons reach the storage layer 33 before the spin polarization is relaxed to be in a non-polarized state (state in which the number of upward momenta is the same as that of downward momenta) in a normal nonmagnetic body, the signs of the spin polarization degrees are reversed, and therefore some electrons are reversed, that is, the directions of the spin angular momenta of some electrons are changed in order to lower the energy of the entire system. At this time, since the total angular momentum of the system needs to be stored, a reaction equivalent to the total angular momentum change due to electrons that have changed the directions is applied to the magnetic moment in the storage layer 33. In a case where a current, that is, the number of electrons passing through the stack 30 in a unit time is small, the total number of electrons that change the directions is also small. Therefore, the angular momentum change generated in the magnetic moment in the storage layer 33 is also small. However, when the current increases, a large amount of angular momentum change can be applied to the storage layer 33 in a unit time. The temporal change in the angular momentum is torque, and when the torque exceeds a certain threshold, the magnetic moment of the storage layer 33 starts to be reversed, and becomes stable when the magnetic moment is rotated by 180 degrees due to uniaxial anisotropy thereof. That is, reversal from the antiparallel state to the parallel state occurs, and the information "0" is stored in the storage layer 33 (see the conceptual diagram of (A) of FIG. 11A).

Next, it is assumed that the information "0" stored in the storage layer 33 is rewritten to "1". In this case, a magnetization reversal current is caused to flow from the magnetization fixed layer 31 to the storage layer 33 from the state illustrated in the conceptual diagram of (A) of FIG. 11A. That is, electrons are caused to flow from the storage layer 33 toward the magnetization fixed layer 31. Electrons that have reached the reference layer 31C and have a downward spin pass through the magnetization fixed layer 31. Meanwhile, electrons having an upward spin are reflected by the reference layer 31C. Then, when such electrons enter the storage layer 33, the electrons apply torque to the storage layer 33, and the storage layer 33 is reversed to an antiparallel state (see the conceptual diagram of (B) of FIG. 11A). However, at this time, the amount of current required to cause reversal is larger than that in a case where reversal is caused from the antiparallel state to the parallel state. Although it is difficult to intuitively understand the reversal from the parallel state to the antiparallel state, it may be considered that reversal cannot be performed because the magnetization direction of the reference layer 31C is fixed, and the storage layer 33 is reversed in order to store the angular momentum of the entire system. As described above, the information of 0/1 is stored by causing a magnetization reversal current (spin polarization current) equal to or larger than a certain threshold corresponding to each polarity to flow in the direction from the magnetization fixed layer 31 to the storage layer 33 or in the direction opposite thereto.

A result of examining a relationship between a value of ΔH and drain-induced barrier lowering (DIBL) is illustrated in Table 2 below. As a value of ΔH increases, a value of DIBL, which is an index of the amount of leakage current, decreases, and as the value of ΔH further increases, the value of DIBL turns to increase. When the leakage current decreases, an on-current in the selection transistor can be increased. From the present test result of examining the relationship between a value of ΔH and DIBL, it can be concluded that ΔH is desirably 15 nm to 35 nm. However, it goes without saying that there is a possibility that the preferable numerical range of $\Delta H$ may change when the conditions change.

TABLE 2

| $\Delta H(nm)$ | DIBL(%) |
|---|---|
| 0 | 0 |
| 15 | −17 |
| 25 | −19 |
| 40 | −7 |

Furthermore, in a case of $\Delta H=25$ nm, as compared with a case of $\Delta H=0$ nm, a value of a current value $I_d$ flowing between the one source/drain region 64A and the other source/drain region 64B of the selection transistor TR increased by 3.8%, and a value of $I_{off}$ decreased by 62%.

In the memory cell array or the memory cell of Example 1, a surface of the element isolation region is located at a position lower than a surface of the active region. Therefore, since a contact area between the gate electrode of the selection transistor and the active region can be increased, the effective width $L_W$ of the gate electrode of the selection transistor can be increased. As a result, it is possible to provide a memory cell and a memory cell array including a selection transistor having a configuration and a structure capable of increasing a flowable write current. Note that, in a case where a peripheral circuit is disposed, in a transistor constituting the peripheral circuit, a difference $\Delta H$ in a height direction between a top surface of the active region and a surface of the element isolation region is substantially "0".

Example 2

Figure 12:
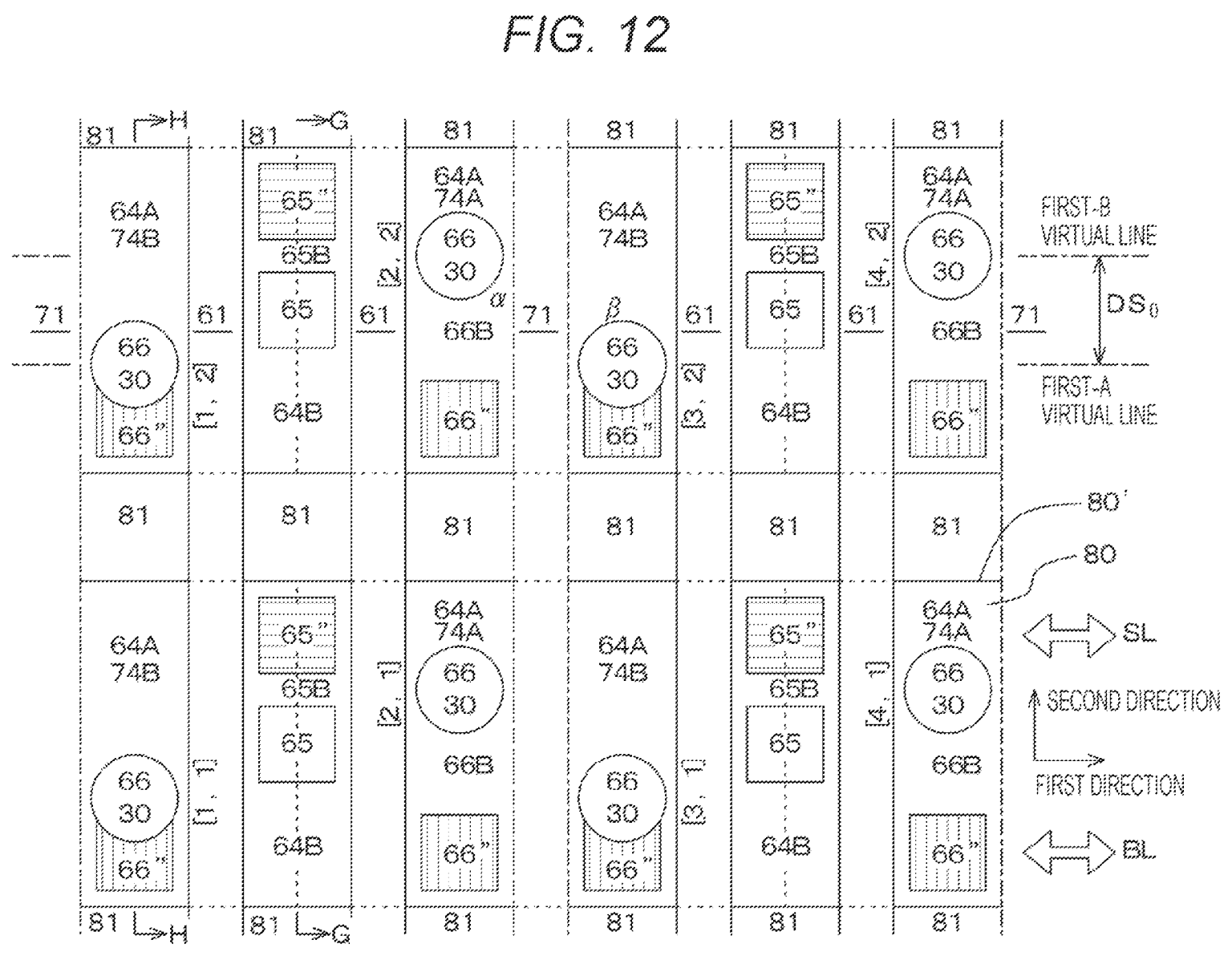
Figure 13:
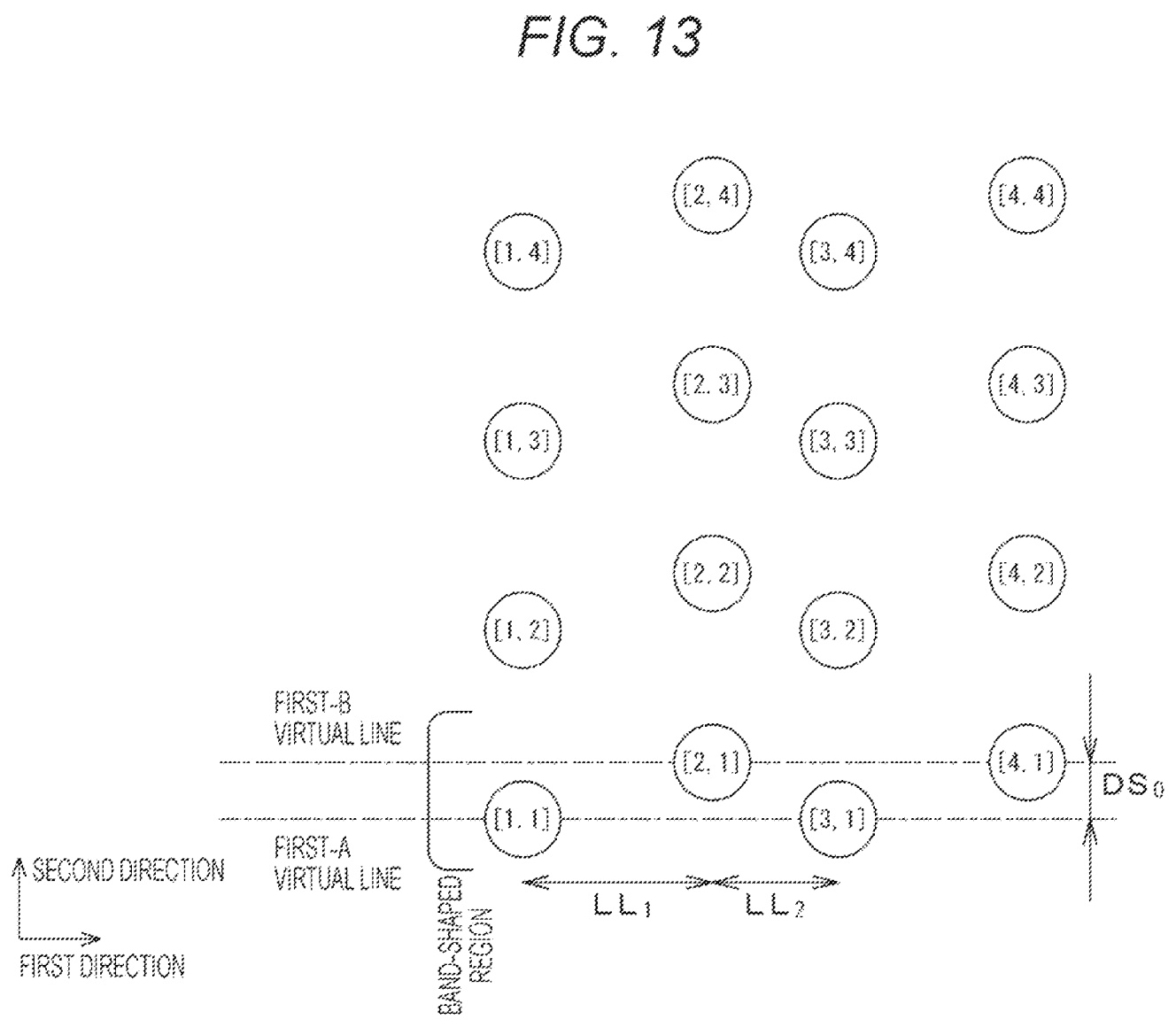
Figure 14:
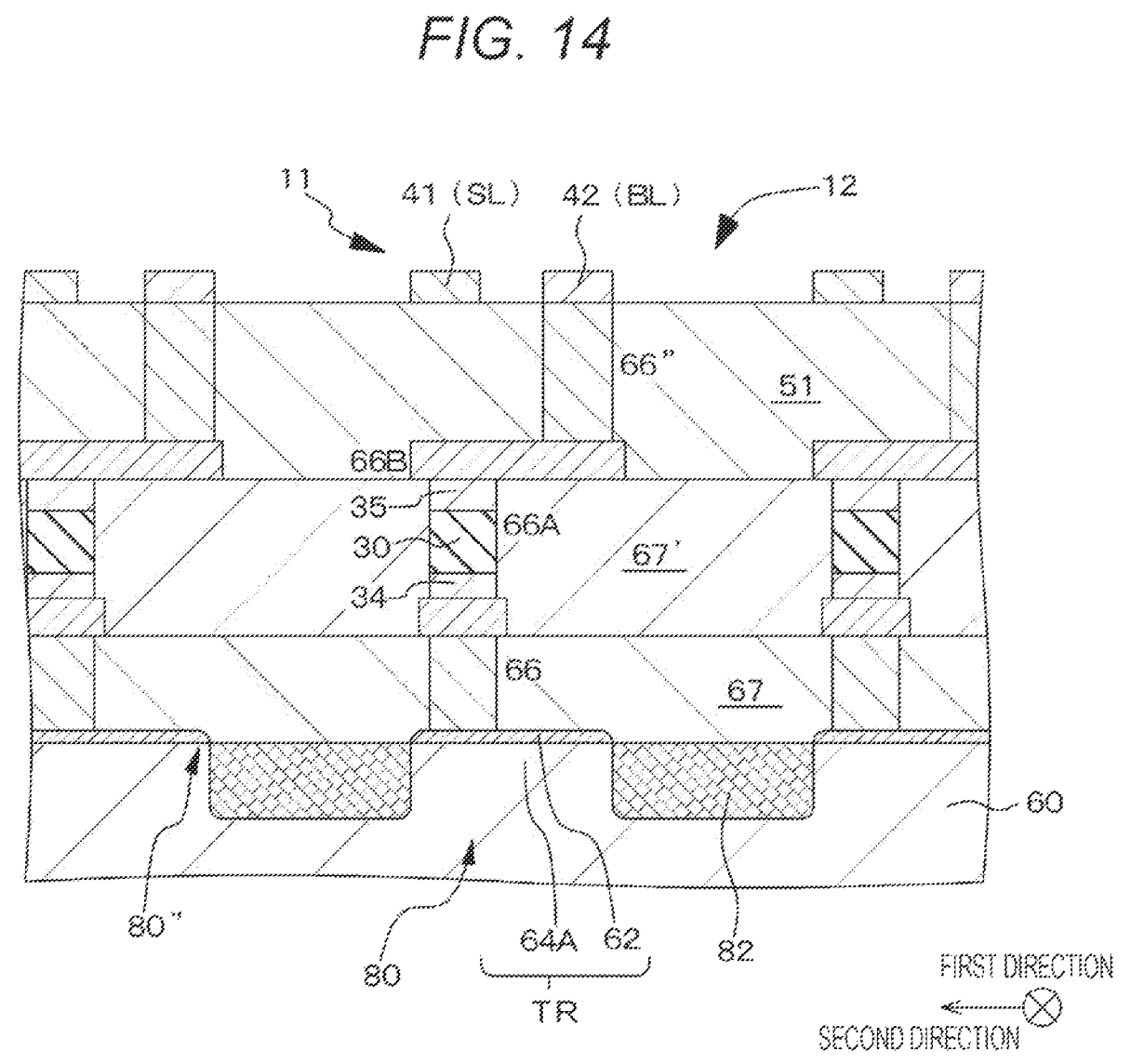
Figure 15:
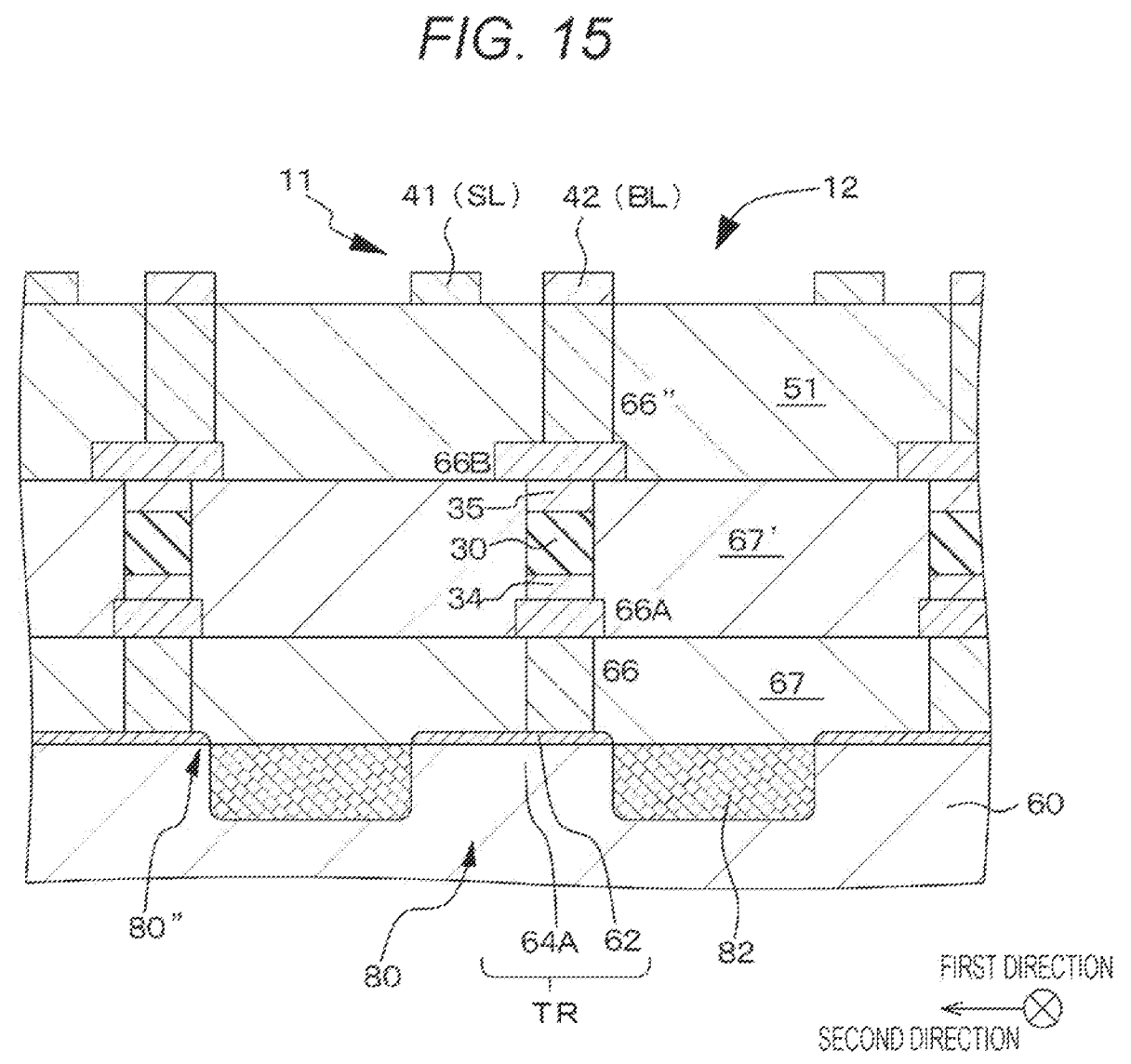

Example 2 relates to the memory cell array according to the second aspect of the present disclosure. The memory cell array of Example 2 also includes a memory cell unit. FIGS. 12 and 13 each illustrate an arrangement state of the memory cell array of Example 2. FIG. 14 illustrates a partial end view of the memory cell and the memory cell array of Example 2 taken along an arrow G-G in FIG. 12. FIG. 15 illustrates a partial end view of the memory cell and the memory cell array of Example 2 taken along an arrow H-H in FIG. 12. Note that a first-A virtual line and a first-B virtual line are indicated by one-dot chain lines in the drawings. Furthermore, a distance between the first-A virtual line and the first-B virtual line is represented by $DS_0$. Here, in FIGS. 12, 16, 26, and 27, a memory cell which is an M-th memory cell arranged in the first direction and an N-th memory cell arranged in the second direction is represented by [M,N].

In the memory cell array of Example 2, a nonvolatile memory element 12 constituting a (2m−1)-th (in which m=1, 2, 3 . . . ) memory cell 11 arranged in a first direction is arranged on the first-A virtual line extending in the first direction, and a nonvolatile memory element 12 constituting a 2m-th memory cell 11 is arranged on the first-B virtual line extending in the first direction and located away from the first-A virtual line in the second direction. Furthermore, a nonvolatile memory element 12 constituting an n-th (n=1, 2, 3 . . . ) memory cell 11 arranged in the second direction is substantially arranged on one virtual line extending in the second direction.

In addition, in the memory cell array of Example 2, the memory cells 11 adjacent to each other in the second direction are isolated from each other by an element isolation region 82. Furthermore, the memory cells 11 adjacent to each other in the first direction are isolated from each other by an element isolation transistor TR'. Note that a difference in a height direction between a top surface of the active region 80 and a surface of the element isolation region 82 is substantially "0". The element isolation region 82 has a shallow trench structure. Specifically, the element isolation region 82 can be formed by forming a recess in the semiconductor layer 60 and embedding the recess with an insulating material such as $SiO_2$ or SiN. Note that a difference $\Delta H$ in a height direction between a top surface of the active region 80 and a surface of the element isolation region 82 in Example 2 is substantially "0".

Here, in the memory cell unit in Example 2, the nonvolatile memory element 12 of the (2m−1)-th memory cell 11 and the nonvolatile memory element 12 of the 2m-th memory cell 11 arranged in the first direction are arranged two-fold rotationally symmetrically with (the center of) the selection transistor TR as a rotation axis. Furthermore, when a distance in the first direction between the nonvolatile memory element 12 of the (2m−1)-th memory cell 11 and the nonvolatile memory element 12 of the 2m-th memory cell 11 arranged in the first direction is represented by $LL_1$, and a distance in the first direction between the nonvolatile memory element 12 of the 2m-th memory cell 11 and the nonvolatile memory element 12 of the (2m+1)-th memory cell 11 arranged in the first direction is represented by $LL_2$, $$LL_2 < LL_1$$

is satisfied.

Furthermore, the nonvolatile memory element 12 constituting the (2m−1)-th memory cell 11 and the nonvolatile memory element 12 constituting the 2m-th memory cell 11 arranged in the first direction are arranged in a band-shaped region extending in the first direction, and one source/drain region 64A of the selection transistor TR constituting the 2m-th memory cell 11 arranged in the first direction is adjacent to one source/drain region 64A of the selection transistor TR constituting the (2m+1)-th memory cell 11 in the band-shaped region. Furthermore, the first-A virtual line and the first-B virtual line are also arranged in this band-shaped region. In addition, an edge portion of the band-shaped region extending in the first direction is in contact with the element isolation regions 81 and 82.

The memory cell array or the memory cell of Example 2 has the same configuration and structure except that the arrangement state of the nonvolatile memory elements 12 arranged in the first direction is different from the arrangement state of the nonvolatile memory elements 12 arranged in the first direction, described in the memory cell array or the memory cell of Example 1, and therefore, detailed description thereof is omitted. The nonvolatile memory element 12 and the memory cell 11 also have substantially the same configuration and structure as those of Example 1, and therefore, detailed description thereof is omitted.

In the memory cell array of Example 2, a distance between a nonvolatile memory element indicated by "α" and a nonvolatile memory element indicated by "β" is larger than an interval (formation pitch) between the nonvolatile memory elements arranged in the first direction in the memory cell array of Example 1. Therefore, when a stacked film for forming the nonvolatile memory element is formed and then the stacked film is patterned (for example, etched) to form a nonvolatile memory element, residues of the patterned (for example, etched) stacked film are not redeposited, and a short circuit does not occur between the adjacent nonvolatile memory elements. Therefore, the interval (formation pitch) between the nonvolatile memory elements can be narrowed, the memory cell array can be reduced, and the manufacturing yield of the memory cell array can be improved.

A memory cell array having a columnar stack in which the distance $DS_0$ between the first-A virtual line and the first-B virtual line was set to 0 nm (Comparative Example 2: see FIG. 27), 0.7 times $LL_1$ (Example 2B: see FIG. 26), or 0.78 times $LL_1$ (Example 2A: see FIG. 26), and the distances $LL_1$ and $LL_2$ between nonvolatile memory elements adjacent to each other in the first direction were constant (the same value) (diameter $R_1$, $R_2$, or $R_3$, $R_1 < R_2 < R_3$) was prototyped, and a short circuit failure ratio was obtained. Table 3 illustrates results thereof. Note that Table 3 illustrates a relative value of the short circuit failure ratio when a value of the short circuit failure ratio is standardized as "1.00". It has been found that, as a matter of course, as the diameter R of the columnar stack increases, the distance between adjacent nonvolatile memory elements decreases, and as a result, the short circuit failure ratio increases. Furthermore, in a case where the diameter R of the columnar stack is the same, it has been found that as the distance from the first-A virtual line to the first-B virtual line increases, that is, as the distance between adjacent nonvolatile memory elements increases, the short circuit failure ratio decreases.

TABLE 3

|  | $DS_0$ | $R_1$ | $R_2$ | $R_3$ |
|---|---|---|---|---|
| Example 2A | $LL_1 \times 0.78$ | 0.52 | 0.52 | 0.52 |
| Example 2B | $LL_1 \times 0.70$ | 0.63 | 0.63 | 0.63 |
| Comparative Example 2 | 0 nm | 1.00 | 1.00 | 1.00 |

Figure 16:
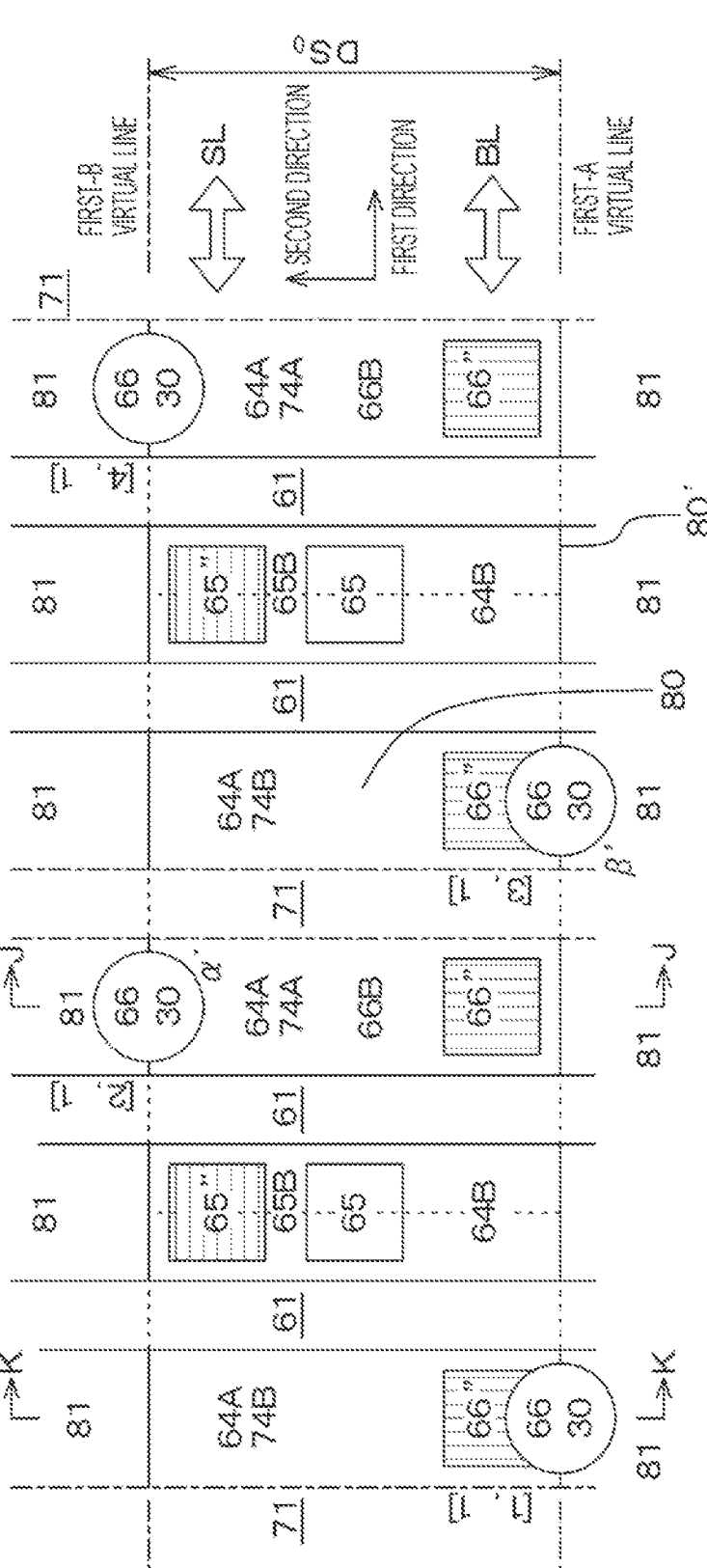
FIG. 16 is a diagram schematically illustrating an arrangement state of a memory cell array of a modification of Example 2.
Figure 17:
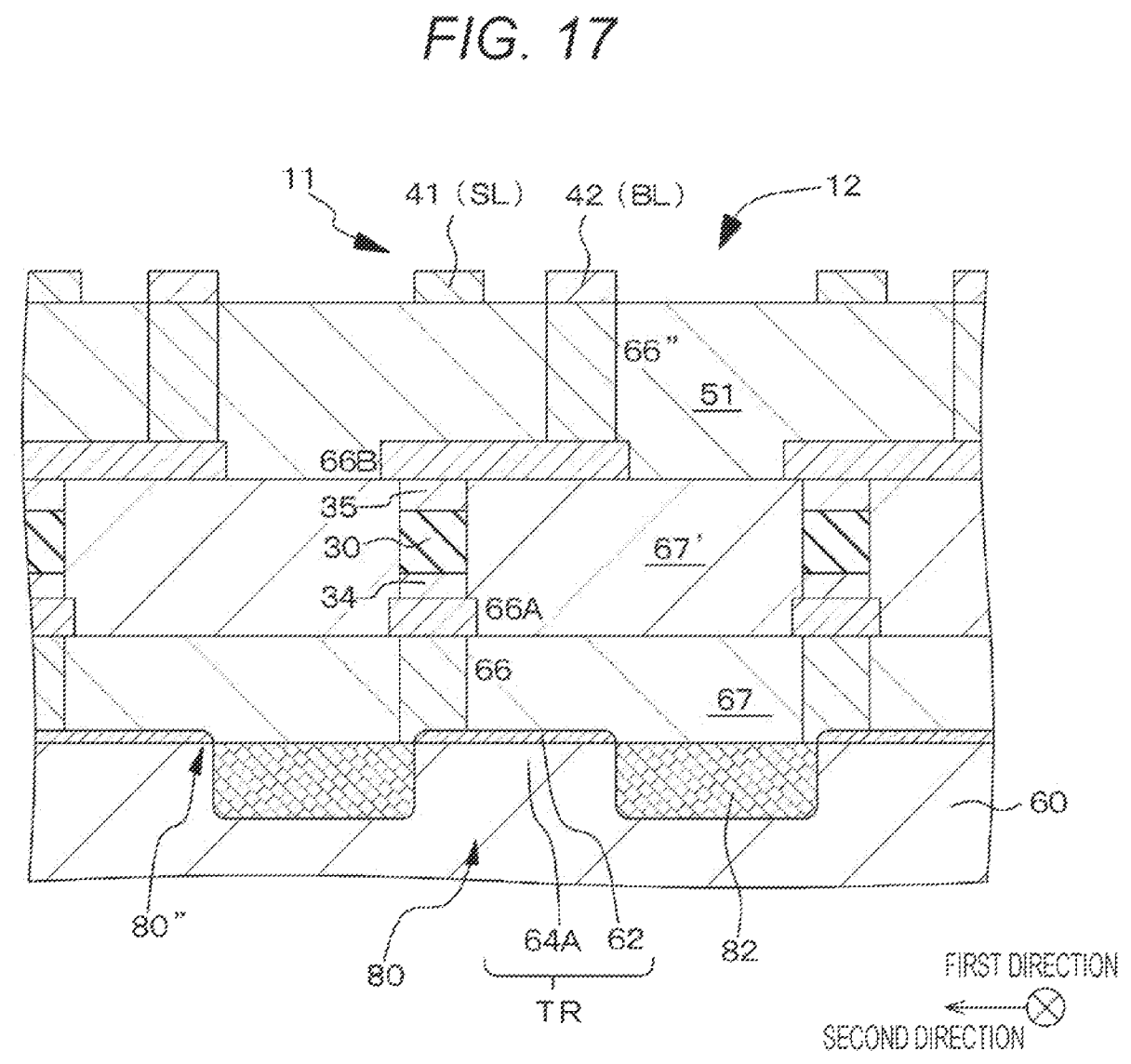
Figure 18:
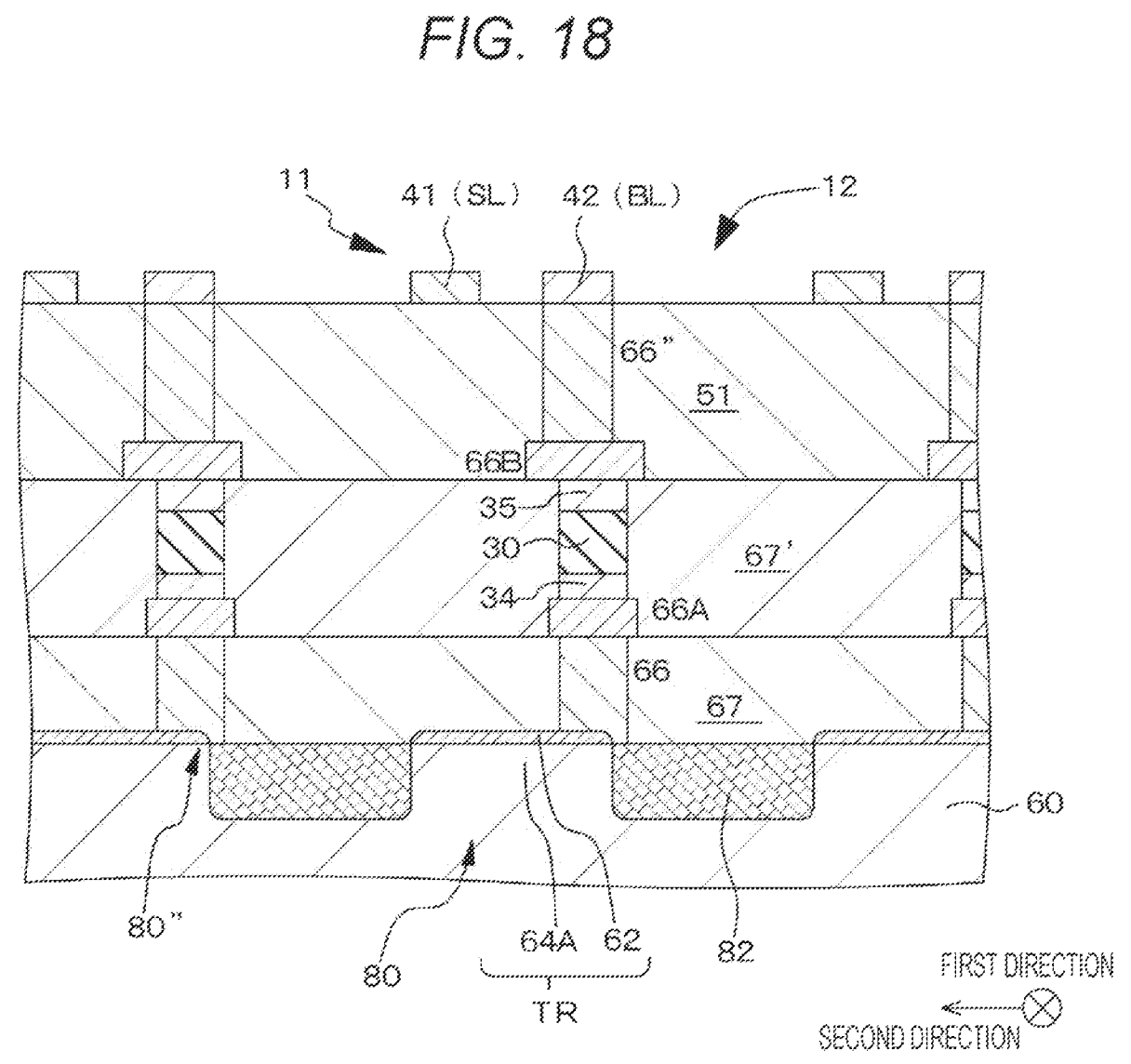

In the memory cell array of Example 2 illustrated in FIGS. 12, 14, and 15, an orthographic projection image of the stack 30 onto the active region 80 is included in the active region 80. Meanwhile, as illustrated in FIG. 16 schematically illustrating an arrangement state of the memory cell array of a modification of Example 2, as illustrated in FIG. 17 illustrating a partial end view of the memory cell and the memory cell array of the modification of Example 2 taken along an arrow J-J in FIG. 16, and as illustrated in FIG. 18 illustrating a partial end view of the memory cell and the memory cell array of the modification of Example 2 taken along an arrow K-K in FIG. 16, in the memory cell array of the modification of Example 2, a part of an orthographic projection image of the stack 30 onto the active region 80 can be included in the active region 80, and the remaining portion of the orthographic projection image of the stack 30 onto the active region 80 can be included in the element isolation region 82.

Example 3

Example 3 relates to a combination of Examples 1 and 2. Specifically, in the memory cell array or the memory cell described in Example 1, a nonvolatile memory element 12 constituting a (2m−1)-th (in which m=1, 2, 3 . . . ) memory cell 11 arranged in the first direction is arranged on the first-A virtual line extending in the first direction, and a nonvolatile memory element 12 constituting a 2m-th memory cell 11 is arranged on the first-B virtual line extending in the first direction and located away from the first-A virtual line in the second direction.

In addition, similarly to Example 1, a selection transistor TR is formed in an active region 80 provided in a semiconductor layer 60, and a difference ΔH in a height direction between a top surface of the active region 80 and a surface of an element isolation region 81 is 15 nm to 35 nm.

Figure 19:
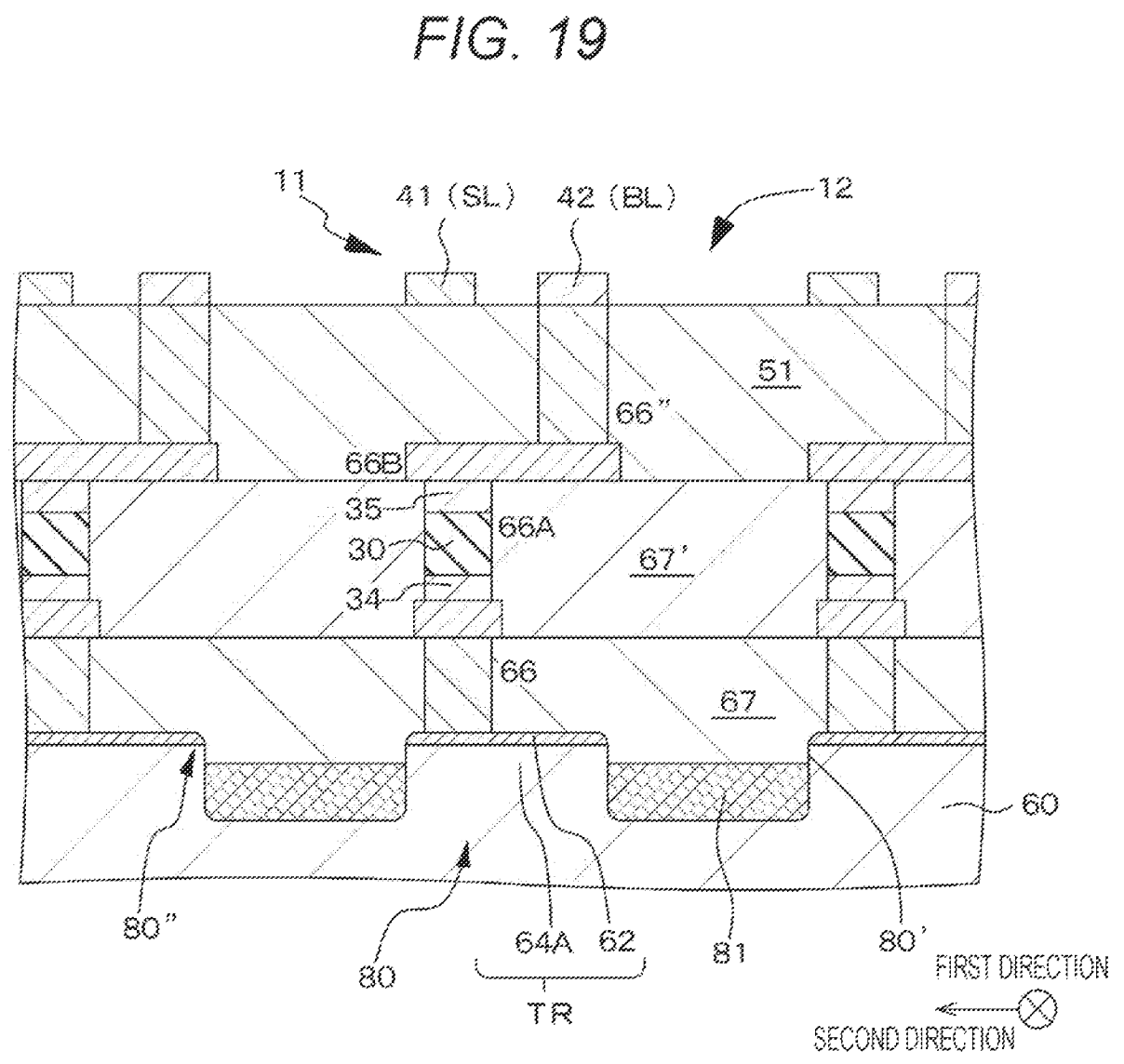
Figure 20:
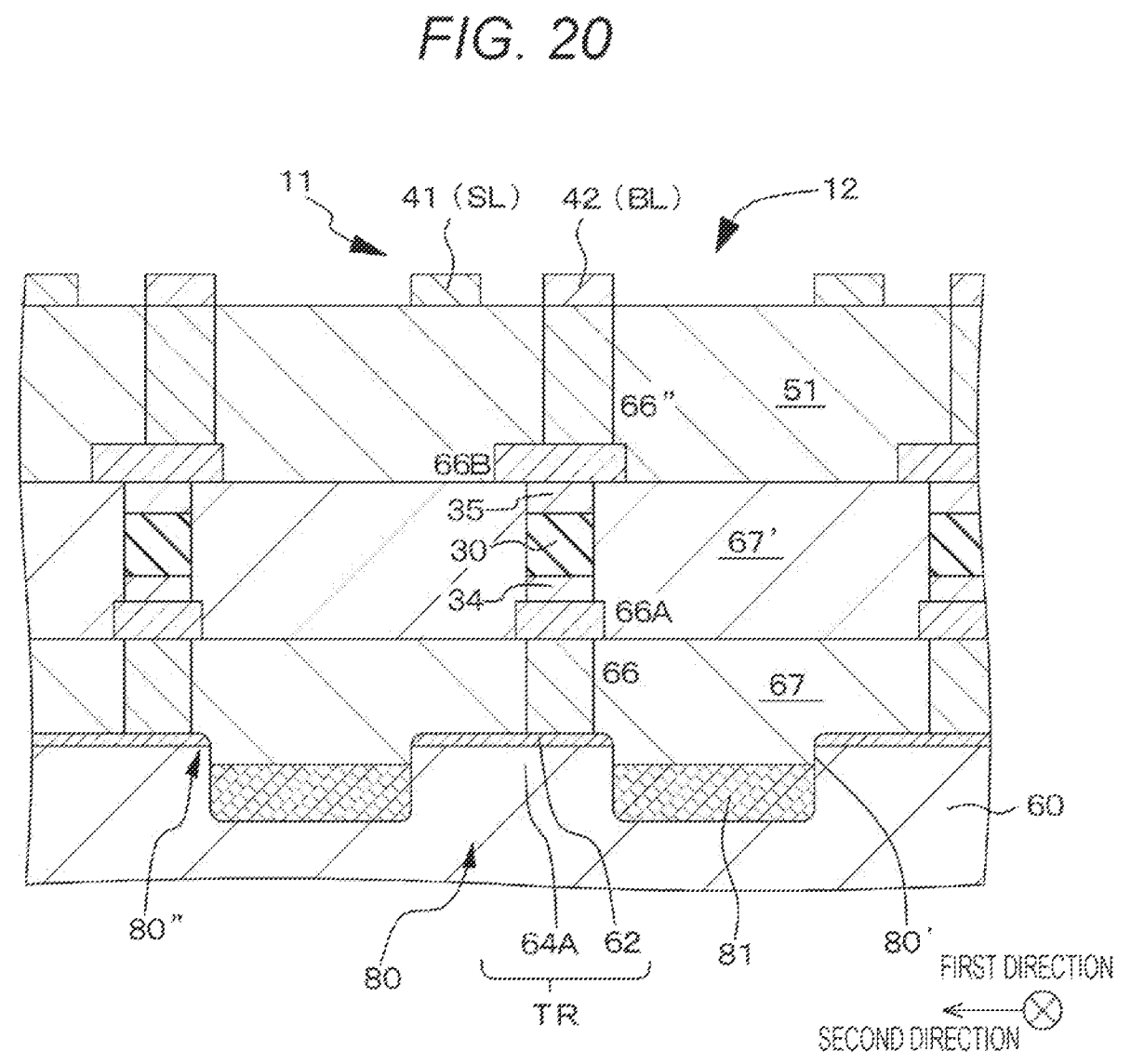
Figure 21:
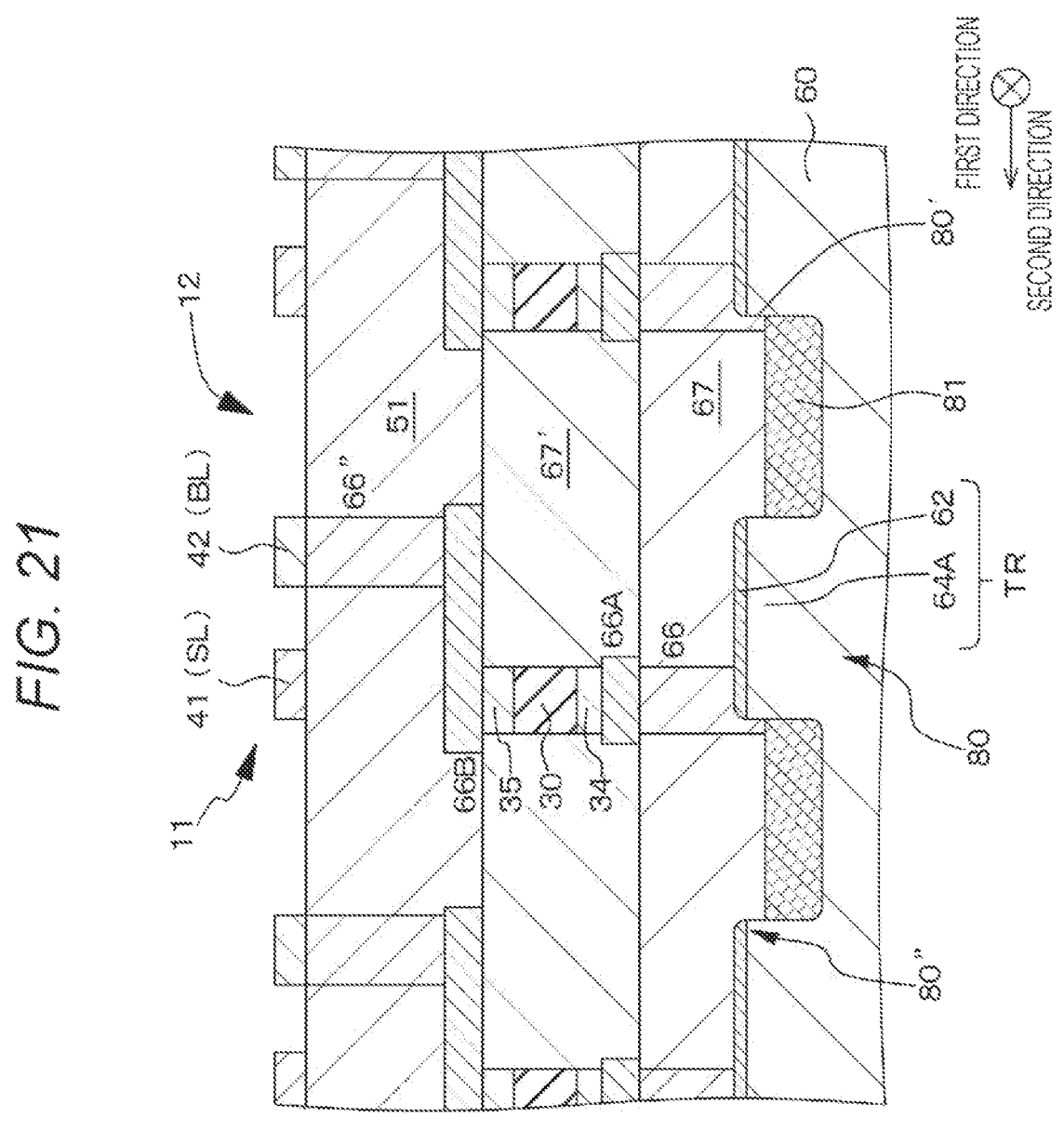
Figure 22:
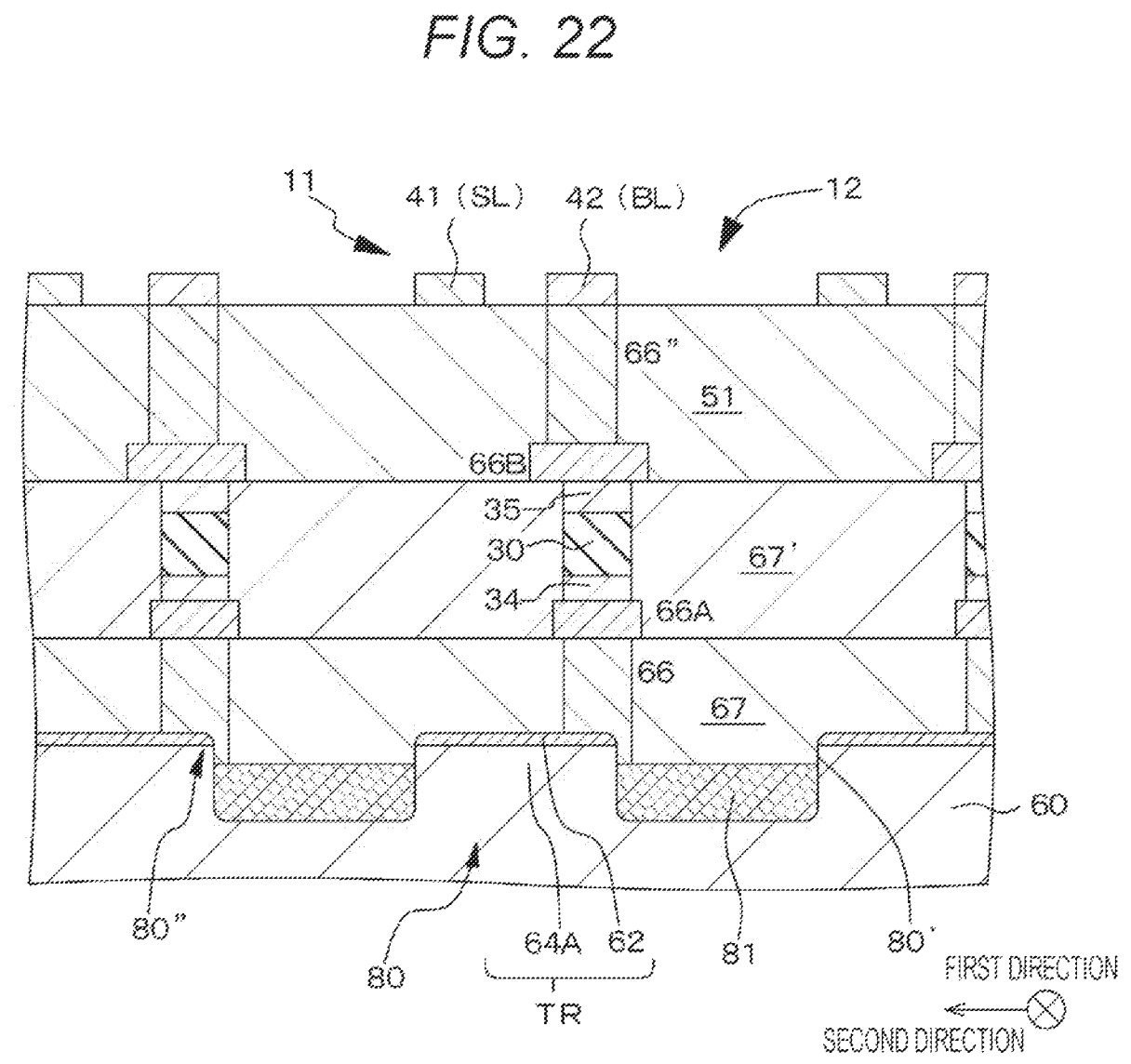

An arrangement state of the memory cell array or the memory cell of such Example 3 is similar to those illustrated in FIGS. 12 and 16. FIGS. 19 and 20 illustrate partial end views of the memory cell and the memory cell array of Example 3 taken along an arrow G-G and an arrow H-H in FIG. 12, respectively. FIGS. 21 and 22 illustrate partial end views of the memory cell and the memory cell array of Example 3 taken along an arrow J-J and an arrow K-K in FIG. 16, respectively. The configuration and structure of the memory cell array or the memory cell of Example 3 are substantially the same as the configuration and structure of the memory cell array or the memory cell of each of Examples 1 and 2, and therefore, detailed description thereof is omitted.

In the memory cell array of Example 3, a distance between a nonvolatile memory element indicated by "α'" and a nonvolatile memory element indicated by "β'" can be larger than an interval (formation pitch) between the nonvolatile memory elements arranged in the first direction in the memory cell array of Example 2.

Example 4

Figure 23:
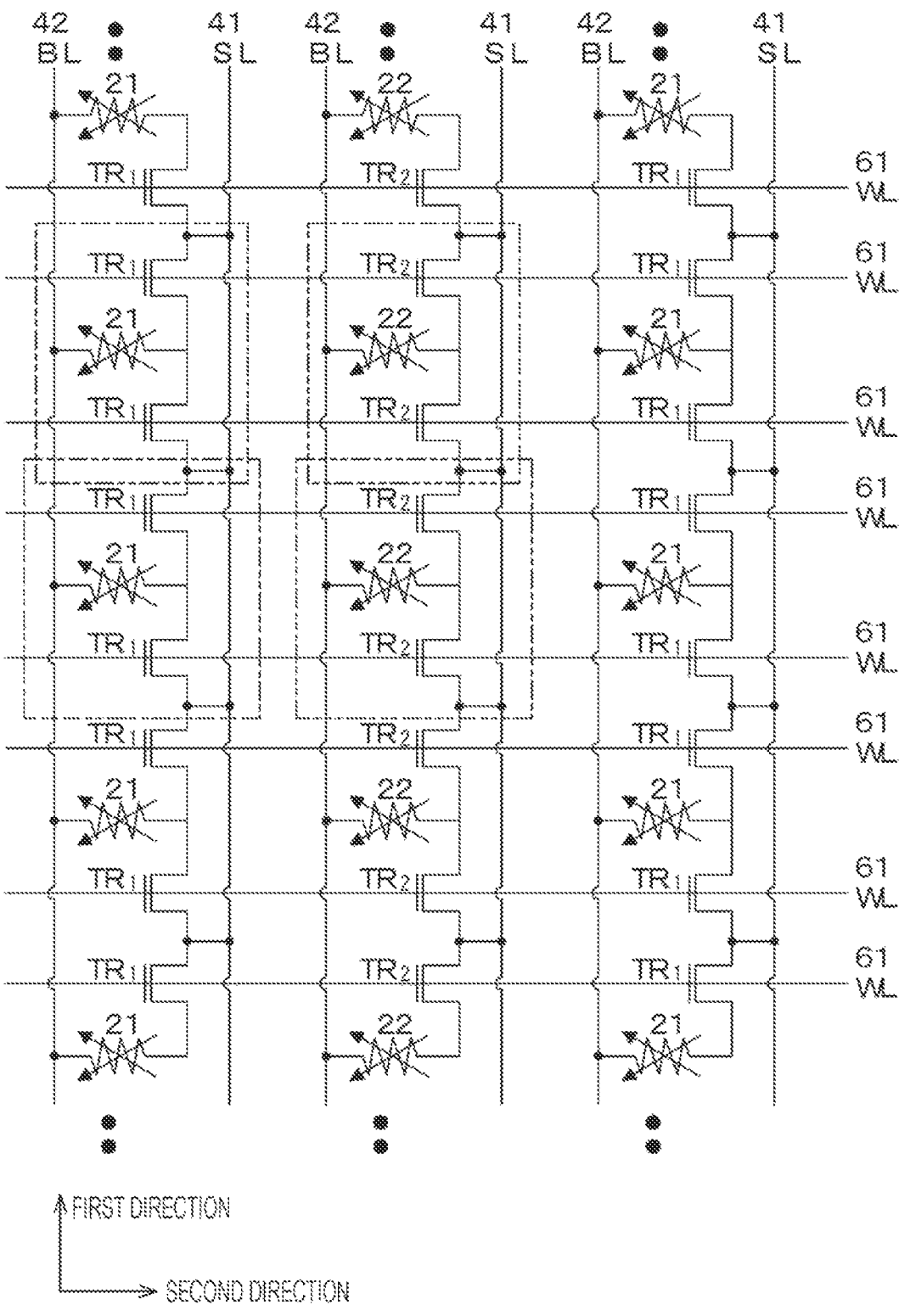
FIG. 23 is an equivalent circuit diagram of a memory cell array in Example 4.

Example 4 is a modification of Examples 1 to 3. FIG. 23 illustrates a diagram schematically illustrating an arrangement state of memory cells in a memory cell array of Example 4. In FIG. 23, one memory cell is surrounded by a two-dot chain line, and another memory cell is surrounded by a three-dot chain line.

In the memory cell array of Example 4, one memory cell includes one nonvolatile memory element 21, 22 and two selection transistors $TR_1$, $TR_2$ (see a memory cell surrounded by a two-dot chain line or a three-dot chain line). That is, the memory cell constituting the memory cell array of Example 4 is a so-called "2T/1R" type memory cell, and the present disclosure can also be applied to such a "2T/1R" type memory cell.

The configuration and structure of the memory cell array of Example 4 can be similar to those of the memory cell arrays of Examples 1 to 3 except for the above points, and therefore detailed description thereof is omitted.

Example 5

Figure 24:
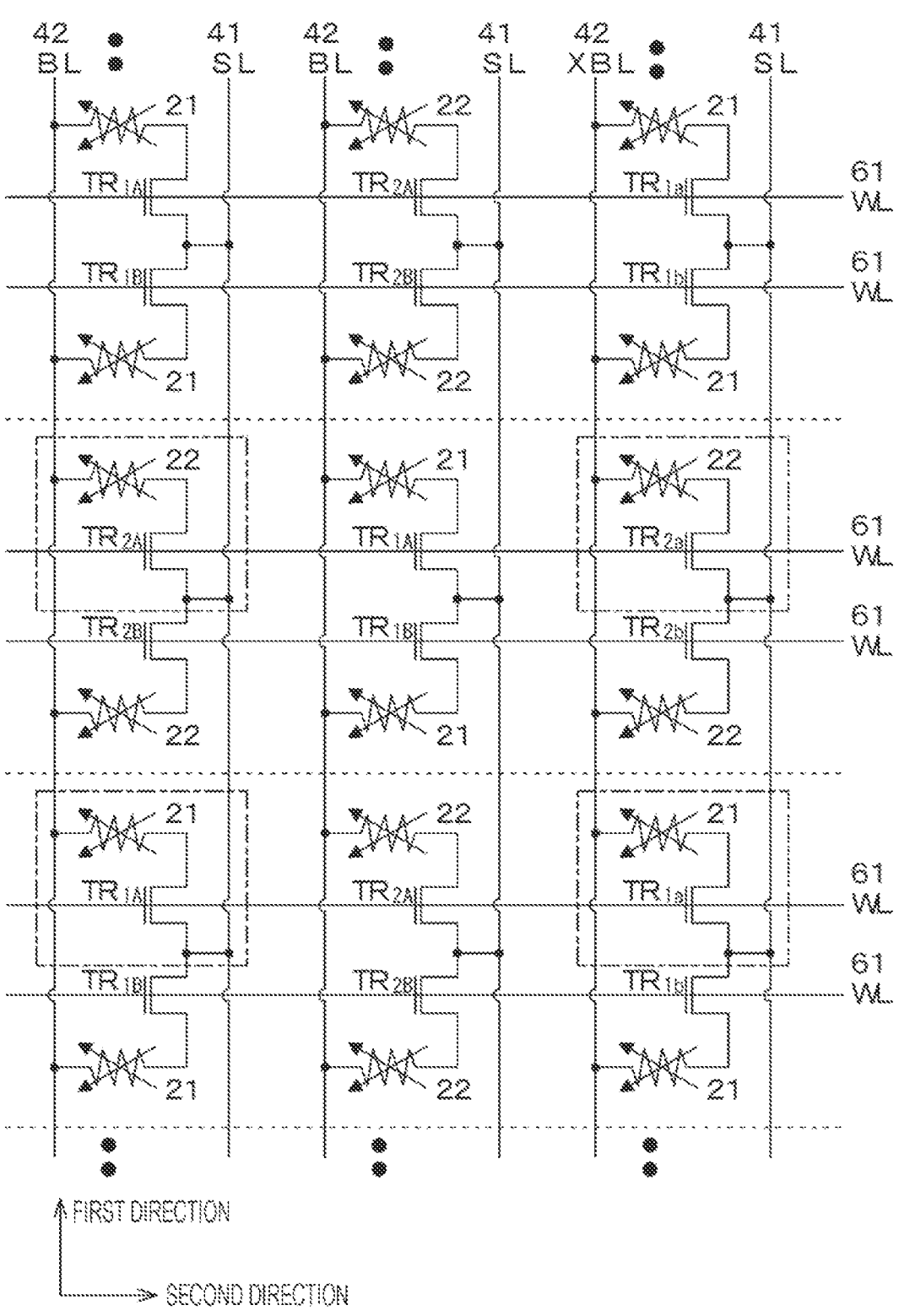
FIG. 24 is an equivalent circuit diagram of a memory cell array in Example 5.

Example 5 is also a modification of Examples 1 to 3. FIG. 24 illustrates an equivalent circuit diagram of a memory cell array of Example 5. In FIG. 24, memory cells that operate as a pair are surrounded by a one-dot chain line or a two-dot chain line.

In the memory cell array of Example 5, a memory cell includes two nonvolatile memory elements 21, 22 and two selection transistors $TR_{1A}$, $TR_1$, $TR_{1a}$, $TR_{1b}$, $TR_{2A}$, $TR_{2B}$, $TR_{2a}$, $TR_{2b}$. That is, the memory cell constituting the memory cell array of Example 5 is a so-called "2T/2R" type memory cell. By using such a "2T-2R" type memory cell and storing one piece of data in two memory cells (2 bits), a speed of reading data can be increased. Note that one of the pair of memory cells is connected to a bit line BL, and the other is connected to a bit line XBL.

The configuration and structure of the memory cell array of Example 5 can be similar to those of the memory cell arrays of Examples 1 to 3 except for the above points, and therefore detailed description thereof is omitted.

Hitherto, the present disclosure has been described on the basis of preferable Examples. However, the present disclosure is not limited to these Examples. The arrangement state of the memory cells, various stacked structures constituting the nonvolatile memory element, the materials used, and the like described in Examples are examples, and can be changed appropriately. In Examples, the stack is formed above the pad portion or above the contact hole, but may be formed on the wire or above the wire.

Figure 25A:
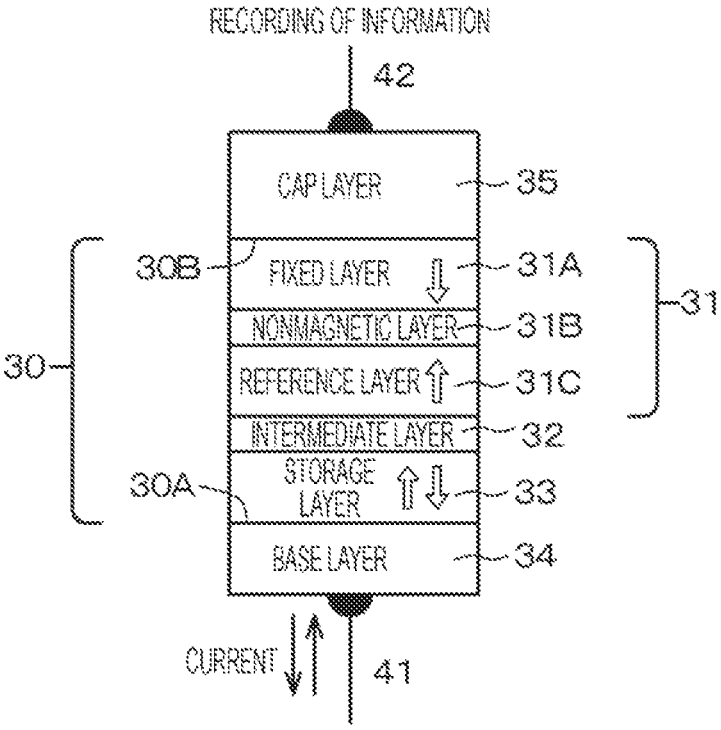
FIGS. 25A and 25B are conceptual diagrams of modifications of a nonvolatile memory element.
Figure 25B:
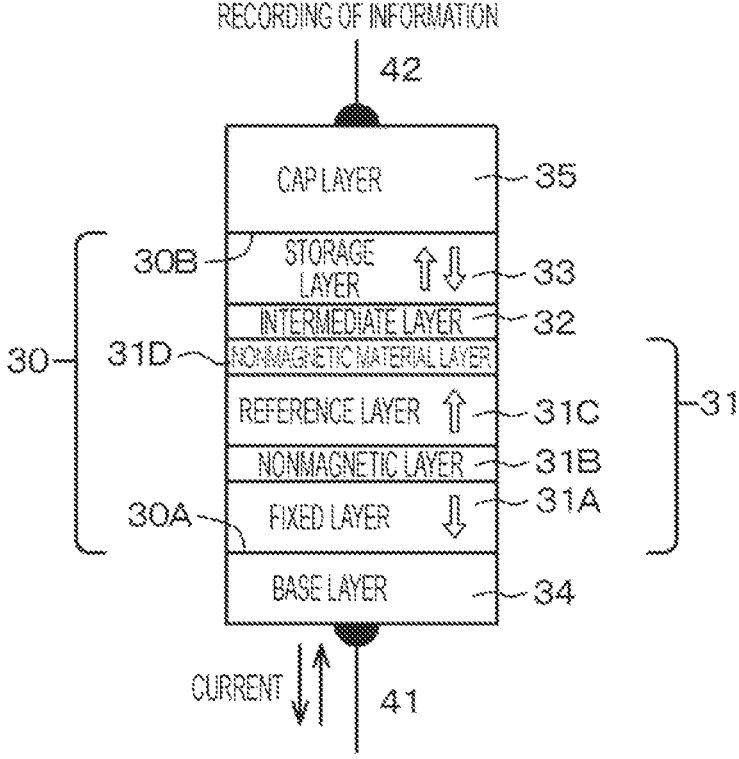
Figure 27:
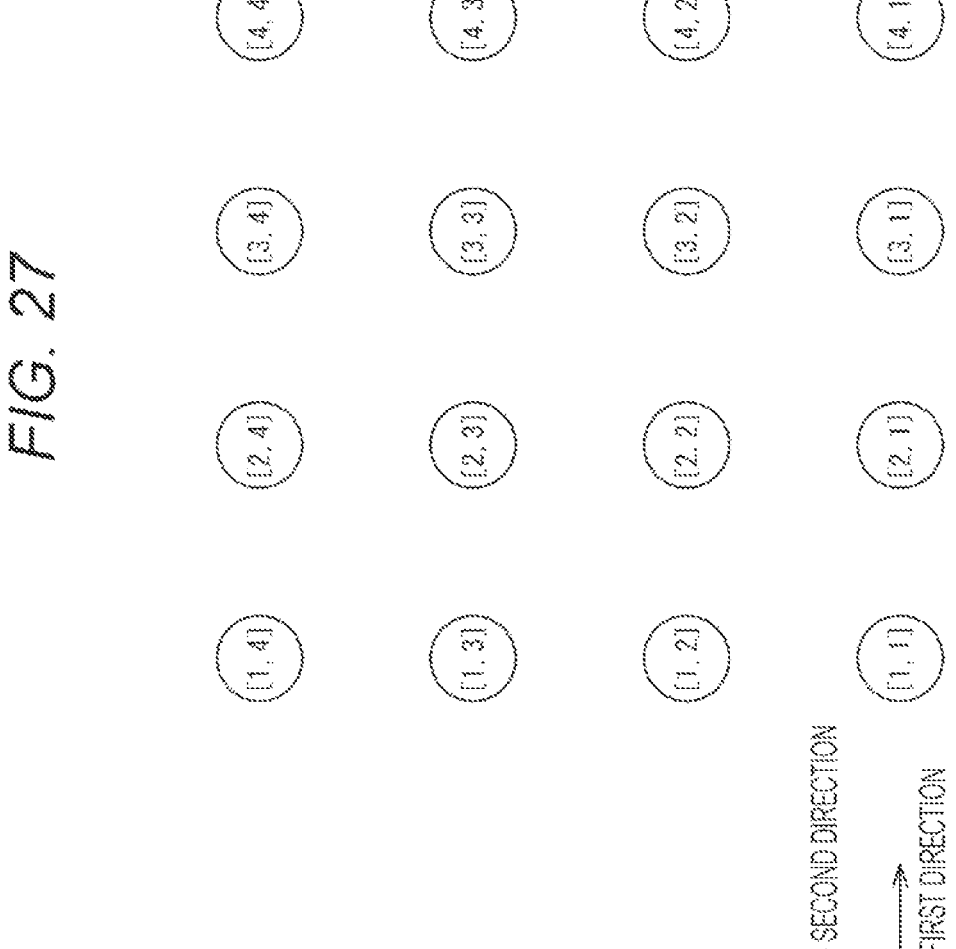
FIG. 27 is a diagram schematically illustrating an arrangement state of nonvolatile memory elements in a prototype of a memory cell array of Comparative Example 2.

As illustrated in the conceptual diagram of a modification of the nonvolatile memory element in FIG. 25A, in each Example, the spin transfer torque based magnetic random access memory having a structure in which the storage layer 33 is located at the uppermost layer of the stack 30 has been described. However, by reversing the order of stacking the layers in the stack 30, the spin transfer torque based magnetic random access memory having a structure in which the storage layer 33 is located at the lowermost layer in the stack 30 can also be used. Alternatively, as illustrated in the conceptual diagram of a modification of the nonvolatile memory element in FIG. 25B, the stacked ferri-structure may further include a nonmagnetic material layer 31D containing at least one element selected from the group consisting of vanadium, chromium, niobium, molybdenum, tantalum, tungsten, hafnium, zirconium, titanium, and ruthenium between one magnetic material layer (reference layer) 31C constituting the stacked ferri-structure and the stack 30.

Furthermore, the insulating material layer 51 can have a form having magnetism, and in this case, it is only required to constitute the insulating material layer 51 by, for example, iron oxide ($FeO_X$).

In Examples, the semiconductor layer (base portion) is constituted by a silicon semiconductor substrate, but the semiconductor layer (base portion) can alternatively be constituted by an SOI substrate (specifically, a silicon layer constituting an SOI substrate or the like). Alternatively, instead of the silicon layer, the semiconductor layer (base portion) can be constituted by an InGaAs layer or a Ge layer, and the selection transistor TR can also be formed in the InGaAs layer or the Ge layer.

Furthermore, a cross-point type memory cell array can be used in which a selector is disposed instead of the selection transistor as a selection element. Specifically, the memory cell includes a nonvolatile memory element and a selection element (selector) having a non-linear current-voltage characteristic, such as a bidirectional diode. The nonvolatile memory element and the selection element are connected to each other in series, and the selection element controls a current flowing through the nonvolatile memory element. The nonvolatile memory element is connected to the first wire, and the selection element is connected to the second wire. The nonvolatile memory element and the selection element are disposed in a region where an orthographic projection image of the first wire and an orthographic projection image of the second wire overlap each other. In addition, for example, when a current $I_{set}$ flows from the first wire to the second wire, information is written in the nonvolatile memory element.

Furthermore, by causing a minute current to flow from the first wire to the second wire and measuring an electric resistance value of the nonvolatile memory element, information stored in the nonvolatile memory element can be read. Moreover, when a current $I_{reset}$ flows from the second wire to the first wire, the information of the nonvolatile memory element is erased. The directions in which the currents $I_{set}$, $I_{reset}$, and the like flow may be reversed.

In Examples, the magnetic random access memory, specifically, the perpendicular magnetization type spin transfer torque based magnetic random access memory has been exclusively described as an example. However, the nonvolatile memory element is not limited thereto, and the present disclosure can be applied to any nonvolatile memory element as long as the nonvolatile memory element is a resistance-variable nonvolatile memory element. That is, examples thereof include:

(a) a nonvolatile memory element including a resistance-variable layer constituted by an ion conductor containing a metal;

(b) a nonvolatile memory element including a resistance-variable layer having a stacked structure of a high resistance layer and an ion source layer (ion supply source layer);

(c) a nonvolatile memory element including a resistance-variable layer including a chalcogenide-based material;

(d) a nonvolatile memory element including a resistance-variable layer including a material having a colossal electro-resistance effect (CER effect);

(e) a nonvolatile memory element including a resistance-variable layer including a material having a colossal magneto-resistance effect (CMR effect);

(f) a phase change type nonvolatile memory element (PRAM) that operates as a nonvolatile memory element by utilizing a fact that a phase change material constituting a resistance-variable layer has an electrical resistance that differs by several orders of magnitude between an amorphous state and a crystalline state, or a programmable metallization cell (PMC).

(g) a resistance random access memory (ReRAM) in which a metal oxide is sandwiched between two electrodes and a pulse voltage is applied to the electrodes; and (h) a nonvolatile memory element including: an inter-electrode material layer disposed between electrodes; and an oxidation-reduction reaction active substance that can serve as an electrode reaction inhibition layer according to an application state of a voltage between the electrodes, in which the electrode reaction inhibition layer is formed or eliminated, or the area of the electrode reaction inhibition layer is increased or decreased along an interface region between the electrodes and the inter-electrode material layer according to the application state of the voltage between the electrodes.

These nonvolatile memory elements can be applied as the nonvolatile memory element constituting the memory cell array in the present disclosure.

In a case where the resistance-variable layer is constituted by an ion conductor containing a metal, specifically, the resistance-variable layer can be constituted by a conductive or semiconductive thin film containing at least one element (atom) selected from the group consisting of copper (Cu), silver (Ag), and zinc (Zn) and at least one element (chalcogen) (atom) selected from the group consisting of tellurium (Te), sulfur (S), and selenium (Se) (for example, a thin film including GeSbTe, GeTe, GeSe, GeS, SiGeTe, or SiGeSbTe). Note that the resistance-variable layer may have a stacked structure of these thin films and a thin film including, for example, Ag, an Ag alloy, Cu, a Cu alloy, Zn, or a Zn alloy. Alternatively, the resistance-variable layer can have a configuration in which a film (rare earth oxide thin film) including an oxide of at least one rare earth element selected from the group consisting of La, Ce, Pr, Nd, Sm, Eu, Gd, Tb, Dy, Ho, Er, Yb, and Y among rare earth elements, or an oxide film of Hf, Ta, W, or the like is formed on the whole or a part of these thin films in a film thickness direction. Alternatively, the resistance change layer can be constituted by a conductive or semiconductive thin film containing at least one element (atom) selected from the group consisting of germanium (Ge), silicon (Si), antimony (Sb), and indium (In) and at least one element (chalcogen) (atom) selected from the group consisting of tellurium (Te), sulfur (S), and selenium (Se) (for example, an amorphous thin film including GeSbTeGd).

In a case where the resistance-variable layer has a stacked structure of a high resistance layer and an ion source layer, specifically, the ion source layer can contain at least one metal element as a cationizable element, and can further contain at least one element (chalcogen) (atom) selected from the group consisting of tellurium (Te), sulfur (S), and selenium (Se) as an anionizable element. The metal element and the chalcogen are bonded to each other to form a metal chalcogenide layer (chalcogenide-based material layer). The metal chalcogenide layer mainly has an amorphous structure and serves as an ion supply source. Here, the ion source layer is formed so as to have a lower resistance value than the high resistance layer in an initial state or an erased state.

The metal element constituting the metal chalcogenide layer is preferably a chemically stable element that can exist in a metal state in the above-described ion source layer containing a chalcogen so as to be reduced on the electrode during a write operation to form a metal-state conduction path (filament). Examples of such a metal element include copper (Cu), aluminum (Al), germanium (Ge), zinc (Zn), and transition metals of groups 4A, 5A, and 6A on the periodic table, that is, titanium (Ti), zirconium (Zr), hafnium (Hf), vanadium (V), niobium (Nb), tantalum (Ta), chromium (Cr), molybdenum (Mo), and tungsten (W). One or more of these elements can be used. Furthermore, aluminum (Al), copper (Cu), germanium (Ge), silicon (Si), or the like may be used as an additive element to the ion source layer.

Examples of a specific constituent material of the ion source layer include ZrTeAl, TiTeAl, CrTeAl, WTeAl, TaTeAl, and CuTe. Furthermore, examples thereof include CuZrTeAl in which Cu is added to ZrTeAl, CuZrTeAlGe in which Ge is further added, and CuZrTeAlSiGe in which Si is further added as an additive element. Alternatively, examples thereof further include ZrTeMg using Mg instead of Al. Even in a case where another transition metal element such as titanium (Ti) or tantalum (Ta) is selected instead of zirconium (Zr) as the metal element constituting the metal chalcogenide layer, a similar additive element can be used, and examples of a specific constituent material of the ion source layer include TaTeAlGe. Moreover, in addition to tellurium (Te), sulfur (S), selenium (Se), and iodine (I) may be used, and examples of a specific constituent material of the ion source layer include ZrSAl, ZrSeAl, and ZrIAl.

Alternatively, when the metal element constituting the metal chalcogenide layer is constituted by a metal element (M) that easily reacts with tellurium (Te) contained in the high resistance layer to form a stacked structure such as a Te/ion source layer (including the metal element M), a stabilized structure of an MTe/ion source layer can be obtained by heat treatment after film formation. Here, examples of the metal element (M) that easily reacts with tellurium (Te) include aluminum (Al) and magnesium (Mg).

Note that other elements may be added to the ion source layer for the purpose of, for example, suppressing film peeling at the time of high-temperature heat treatment when the resistance-variable layer is formed. For example, silicon (Si) is an additive element with which holding characteristics can be expected to be improved at the same time, and for example, silicon (Si) is preferably added to the ion source layer together with zirconium (Zr). However, if the amount of silicon (Si) added is too small, an effect of preventing film peeling cannot be expected, and if the amount of silicon (Si) added is too large, good memory operation characteristics cannot be obtained. Therefore, the content of silicon (Si) in the ion source layer is preferably in a range of about 10 to 45 atom %.

When a predetermined voltage is applied to the nonvolatile memory element, at least one metal element as a cationizable element diffuses into the high resistance layer, and a resistance value of the high resistance layer thereby decreases. In addition, the high resistance layer has a function as a barrier in electric conduction, and exhibits a resistance value higher than that of the ion source layer when a predetermined voltage is applied between an electrode and a conductive material layer (or a wire) in an initialized state or an erased state. As described above, the high resistance layer includes, for example, a layer including a compound mainly containing tellurium (Te) that behaves as an anion component. Specific examples of such a compound include AlTe, MgTe, and ZnTe. As for the composition of the compound containing tellurium (Te), for example, in AlTe, the content of aluminum (Al) is preferably 20 atom % or more and 60 atom % or less. Alternatively, the high resistance layer may contain an oxide such as aluminum oxide (AlO$_x$). Furthermore, an initial resistance value of the high resistance layer is preferably 1 MΩ or more, and a resistance value in a low resistance state is preferably several 100 kΩ or less. That is, the nonvolatile memory element stores information and the like by changing the resistance value of the high resistance layer. In order to read a resistance state of the miniaturized nonvolatile memory element at high speed, the resistance value in the low resistance state is preferably reduced as much as possible. However, in a case where information (data) or the like is written under conditions of 20 μA to 50 μA and 2 V, the resistance value is 40 kΩ to 100 kΩ. Therefore, the initial resistance value of the nonvolatile memory element is higher than this value as a precondition.

Moreover, considering a resistance separation width of one digit, the above resistance value is considered to be appropriate. Note that the high resistance layer can have not only a single-layer configuration but also a multilayer configuration. In this case, a lower layer containing tellurium in the largest amount as an anion component is in contact with a high resistance layer side electrode, and an upper layer contains an element other than tellurium as an anion component. Alternatively, examples of the high resistance layer include SiN, SiO$_2$, and Gd$_2$O$_3$, and also include a material containing fluorine (for example, MgF$_2$, AlF$_3$, CaF$_2$, and LiF).

Here, if tellurium (Te) is contained in the largest amount as an anion component in the high resistance layer, a metal element diffused into the high resistance layer when the resistance of the high resistance layer decreases is stabilized, and the low resistance state is easily maintained. Meanwhile, tellurium (Te) has a weaker bonding force with a metal element than an oxide or a silicon compound, and the metal element diffused into the high resistance layer easily moves to the ion source layer. Therefore, erasing characteristics are improved. That is, holding characteristics of write data in the low resistance state are improved, and the voltage can be decreased at the time of data erasing. Moreover, it is possible to reduce variations in the resistance value in the erased state for a large number of write/erase operations. Note that an absolute value of electronegativity generally increases in the order of tellurium<selenium<sulfur<oxygen in the chalcogenide compounds. Therefore, an improvement effect is higher as the amount of oxygen in the high resistance layer is smaller and a chalcogenide having a lower electronegativity is used.

Examples of a material constituting the electrode include tungsten (W), tungsten nitride (WN), copper (Cu), aluminum (Al), molybdenum (Mo), gold (Au), platinum (Pt), titanium (Ti), titanium nitride (TiN), titanium/tungsten (TiW), molybdenum (Mo), tantalum (Ta), and silicide.

Note that, in a case where the electrode includes a material which may cause ion conduction in an electric field, such as copper (Cu), a surface of the electrode may be coated with a material which hardly causes ion conduction or thermal diffusion, such as tungsten (W), tungsten nitride (WN), titanium nitride (TiN), or tantalum nitride (TaN). Furthermore, in a case where aluminum (Al) is contained in the ion source layer, examples of the material constituting the electrode include a material that is less likely to be ionized than aluminum (Al), such as a metal film containing at least one of chromium (Cr), tungsten (W), cobalt (Co), silicon (Si), gold (Au), palladium (Pd), molybdenum (Mo), iridium (Ir), titanium (Ti), and the like, an oxide film thereof, or a nitride film thereof. As the conductive material layer (or a wire), a known conductive material containing a conductive material similar to that of the electrode can be used. Alternatively, the conductive material layer (or a wire) may have a stacked structure of a base layer including Cr, Ti, or the like, and a Cu layer, a Au layer, a Pt layer, or the like formed thereon. Moreover, the conductive material layer (or a wire) can also be constituted by a single layer such as Ta or a stacked structure with Cu, Ti, or the like. The electrode and the conductive material layer (or a wire) can be formed by, for example, a PVD method exemplified by a sputtering method, or a CVD method.

When information is stored (written), a voltage pulse in a "positive direction" (for example, the high resistance layer has a negative potential, and the ion source layer side has a positive potential) is applied to the nonvolatile memory element in an initial state (high resistance state). As a result, a metal element contained in the ion source layer is ionized and diffused into the high resistance layer, and is bonded to electrons on the electrode to be precipitated, or remains in the high resistance layer to form an impurity level. As a result, a conduction path containing the metal element is formed in the information storage layer, more specifically, in the high resistance layer, and the resistance of the information storage layer decreases (information storage state). Thereafter, even when application of a voltage to the nonvolatile memory element is stopped, the information storage layer is held in the low resistance state. As a result, information is written and held. In a case of use in a storage device that can be written only once, a so-called programmable read only memory (PROM), information storage (recording) is completed only by this information storage process. Meanwhile, a rewriting process is necessary for application to a storage device in which information can be rewritten a plurality of times, that is, a random access memory (RAM), an EEPROM, or the like. When information is rewritten, a voltage pulse in a "negative direction" (for example, the high resistance layer has a positive potential, and the ion source layer side has a negative potential) is applied to the nonvolatile memory element in the low resistance state. As a result, the metal element deposited on the electrode is ionized and dissolved in the ion source layer. As a result, the conduction path containing the metal element disappears, and the resistance of the high resistance layer becomes high (initial state or erased state). Thereafter, even when application of a voltage to the nonvolatile memory element is stopped, the information storage layer is held in the high resistance state. In this way, the written information is erased. By repeating such a process, writing of information to the nonvolatile memory element and erasing of the written information can be repeated. In reading the information stored in the nonvolatile memory element, for example, a voltage in the "positive direction" (for example, the high resistance layer has a negative potential, and the ion source layer side has a positive potential) is applied, but a value of the voltage is lower than a value of the voltage applied when the information is stored (written). For example, when the high resistance state corresponds to information of "0" and the low resistance state corresponds to information of "1", "0" is changed to "1" in the information writing process, and "1" is changed to "0" in the information erasing process. Note that, although the operation for setting the low resistance state and the operation for setting the high resistance state correspond to the write operation and the erase operation, respectively, the erase operation and the write operation may correspond to resistance states opposite thereto, respectively.

In a case where the resistance-variable layer is constituted by a chalcogenide-based material, examples of the chalcogenide-based material include a compound of a metal and Se or Te, such as GeSbTe, ZnSe, or GaSnTe.

Furthermore, in a case where the resistance-variable layer is constituted by a material having a colossal electroresistance effect (CER effect), examples of such a material include a ternary perovskite type transition metal oxide ($PrCaMnO_3$ or $SrTiO_3$) and a binary transition metal oxide (CiO, NiO, CuO, $TiO_2$, or $Fe_3O_4$).

Furthermore, in order to cause a phase change type nonvolatile memory element to operate as a nonvolatile memory element by utilizing a fact that a phase change material constituting a resistance-variable layer of the phase change type nonvolatile memory element has an electrical resistance that differs by several orders of magnitude between an amorphous state and a crystalline state, the resistance-variable layer is constituted by a chalcogenide-based material. In addition, a pulsed large current is caused to flow through the resistance-variable layer for a short time (for example, 200 microamperes, 20 nanoseconds), and then the resistance-variable layer is rapidly cooled. At this time, the phase change material constituting the resistance-variable layer becomes an amorphous state and exhibits high resistance. Meanwhile, a pulsed small current is caused to flow through the resistance-variable layer for a relatively long time (for example, 100 microamperes, 100 nanoseconds), and the resistance-variable layer is gradually cooled. At this time, the phase change material constituting the resistance-variable layer becomes a crystalline stat and exhibits low resistance.

Furthermore, the ReRAM includes a multicomponent metal oxide including a plurality of metal elements such as a perovskite type metal oxide and oxygen, or includes a binary metal oxide including one metal element and oxygen, and can be a unipolar (non-polar) type, a bipolar type, a filament type (fuse/antifuse type), or an interface type.

In the nonvolatile memory element including an interelectrode material layer, in which the electrode reaction inhibition layer is formed or eliminated, or the area of the electrode reaction inhibition layer is increased or decreased, a redox reaction active material layer is constituted by at least one selected from the group consisting of nickel (Ni), cobalt (Co), chromium (Cr), titanium (Ti), tantalum (Ta), iron (Fe), aluminum (Al), vanadium (V), a reduced product ($H_xWO_3$) of tungsten oxide ($WO_3$), and an oxide of vanadium (V). Furthermore, the inter-electrode material layer includes, as a base material, an amorphous thin film containing at least one of chalcogenide materials such as sulfur (S), selenium (Se), and tellurium (Te) and at least one of germanium (Ge), silicon (Si), antimony (Sb), and indium (In).

Note that the present disclosure can have the following configurations.

[A01] <<Memory Cell Array: First Aspect>>

A memory cell array including a plurality of memory cells arranged in a first direction and a second direction different from the first direction, in which each of the memory cells includes:

a resistance-variable nonvolatile memory element; and a selection transistor electrically connected to the non-volatile memory element, the selection transistor is formed in an active region provided in a semiconductor layer, at least a part of the active region is in contact with an element isolation region provided in the semiconductor layer, and a surface of the element isolation region is located at a position lower than a surface of the active region.

[A02] The memory cell array according to [A01], in which a nonvolatile memory element constituting a (2m–1)-th (in which m=1, 2, 3 . . . ) memory cell arranged in the first direction is arranged on a first-A virtual line extending in the first direction, and a nonvolatile memory element constituting a 2m-th memory cell is arranged on a first-B virtual line extending in the first direction and located away from the first-A virtual line in the second direction.

[A03] The memory cell array according to [A01] or [A02], in which a difference in a height direction between a top surface of the active region and a surface of the element isolation region is 15 nm to 35 nm.

[A04] The memory cell array according to any one of [A01] to [A03], in which the memory cells adjacent to each other in the second direction are isolated from each other by the element isolation region.

[A05] The memory cell array according to [A04], in which the memory cells adjacent to each other in the first direction are isolated from each other by an element isolation transistor.

[A06] The memory cell array according to any one of [A01] to [A05], in which the selection transistor includes a gate electrode, a gate insulating layer, a channel forming region, and source/drain regions, one source/drain region of the selection transistor is electrically connected to one end of the nonvolatile memory element, the other source/drain region of the selection transistor is electrically connected to a first wire, the other end of the nonvolatile memory element is electrically connected to a second wire, a word line also serving as the gate electrode of the selection transistor extends in the second direction, and the channel forming region and the source/drain regions of the selection transistor are arranged in the first direction.

[A07] The memory cell array according to [A06], in which the other source/drain region of the selection transistor is shared by a (2m–1)-th (in which m=1, 2, 3 . . . ) memory cell and a 2m-th memory cell arranged in the first direction, and the 2m-th memory cell and a (2m+1)-th memory cell are isolated from each other by an element isolation transistor.

[A08] The memory cell array according to [A07], in which a (2m–1)-th memory cell and a 2m-th memory cell arranged in the first direction are sandwiched between two element isolation transistors of a first element isolation transistor adjacent to the (2m–1)-th memory cell and a second element isolation transistor adjacent to the 2m-th memory cell, the nonvolatile memory element of the (2m–1)-th memory cell is electrically connected to the other source/drain region of the first element isolation transistor, and the nonvolatile memory element of the 2m-th memory cell is electrically connected to one source/drain region of the second element isolation transistor.

[A09] The memory cell array according to [A08], in which the other source/drain region of the first element isolation transistor also serves as one source/drain region of the selection transistor in the (2m–1)-th memory cell, and one source/drain region of the second element isolation transistor also serves as one source/drain region of the selection transistor in the 2m-th memory cell.

[A10] The memory cell array according to any one of [A01] to [A09], in which a word line of the selection transistor extends from an edge portion of the active region along a side surface of the active region in the second direction, and further extends on the element isolation region.

[A11] The memory cell array according to any one of [A06] to [A10], in which when a difference in a height direction between a top surface of the active region and a surface of the element isolation region is represented by $\Delta H$, and the width of the channel forming region of the selection transistor in the second direction is represented by $L_W$, $$0.08 \le \Delta H / L_W \le 0.28$$

is satisfied.

[A12] The memory cell array according to any one of [A01] to [A11], in which the element isolation region has a shallow trench structure.

[A13] The memory cell array according to any one of [A01] to [A12], in which an end portion of the active region facing the element isolation region is rounded.

[B01] <<Memory Cell Array: Second Aspect>>

A memory cell array including a plurality of memory cells arranged in a first direction and a second direction different from the first direction, in which each of the memory cells includes:

a resistance-variable nonvolatile memory element; and a selection transistor electrically connected to the non-volatile memory element, and a nonvolatile memory element constituting a (2m–1)-th (in which m=1, 2, 3 . . . ) memory cell arranged in the first direction is arranged on a first-A virtual line extending in the first direction, and a nonvolatile memory element constituting a 2m-th memory cell is arranged on a first-B virtual line extending in the first direction and located away from the first-A virtual line in the second direction.

[B02] The memory cell array according to [B01], in which the memory cells adjacent to each other in the second direction are isolated from each other by an element isolation region.

[B03] The memory cell array according to [B01] or [B02], in which the memory cells adjacent to each other in the first direction are isolated from each other by an element isolation transistor.

[B04] The memory cell array according to any one of [B01] to [B03], in which the selection transistor includes a gate electrode, a gate insulating layer, a channel forming region, and source/drain regions, one source/drain region of the selection transistor is electrically connected to one end of the nonvolatile memory element, the other source/drain region of the selection transistor is electrically connected to a first wire, the other end of the nonvolatile memory element is electrically connected to a second wire, a word line also serving as the gate electrode of the selection transistor extends in the second direction, and the channel forming region and the source/drain regions of the selection transistor are arranged in the first direction.

[B05] The memory cell array according to [B04], in which the other source/drain region of the selection transistor is shared by a (2m−1)-th memory cell and a 2m-th memory cell, and the 2m-th memory cell and a (2m+1)-th memory cell are isolated from each other by an element isolation transistor.

[B06] The memory cell array according to [B05], in which a (2m−1)-th memory cell and a 2m-th memory cell arranged in the first direction are sandwiched between two element isolation transistors of a first element isolation transistor adjacent to the (2m−1)-th memory cell and a second element isolation transistor adjacent to the 2m-th memory cell, the nonvolatile memory element of the (2m−1)-th memory cell is electrically connected to the other source/drain region of the first element isolation transistor, and the nonvolatile memory element of the 2m-th memory cell is electrically connected to one source/drain region of the second element isolation transistor.

[B07] The memory cell array according to [B06], in which the other source/drain region of the first element isolation transistor also serves as one source/drain region of the selection transistor in the (2m−1)-th memory cell, and one source/drain region of the second element isolation transistor also serves as one source/drain region of the selection transistor in the 2m-th memory cell.

[B08] The memory cell array according to any one of [B01] to [B07], in which a nonvolatile memory element of a (2m−1)-th memory cell and a nonvolatile memory element of a 2m-th memory cell arranged in the first direction are arranged two-fold rotationally symmetrically with (the center of) the selection transistor as a rotation axis.

[B09] The memory cell array according to any one of [B01] to [B08], in which when a distance in the first direction between a nonvolatile memory element of a (2m−1)-th memory cell and a nonvolatile memory element of a 2m-th memory cell arranged in the first direction is represented by $LL_1$, and a distance in the first direction between the nonvolatile memory element of the 2m-th memory cell and a nonvolatile memory element of a (2m+1)-th memory cell arranged in the first direction is represented by $LL_2$, $$LL_2 < LL_1$$

is satisfied.

[B10] The memory cell array according to any one of [B01] to [B09], in which a nonvolatile memory element constituting a (2m−1)-th memory cell and a nonvolatile memory element constituting a 2m-th memory cell arranged in the first direction are arranged in a band-shaped region extending in the first direction.

[B11] The memory cell array according to [B10], in which the first-A virtual line and the first-B virtual line are arranged in the band-shaped region.

[B12] The memory cell array according to [B10] or [B11], in which an edge portion of the band-shaped region extending in the first direction is in contact with an element isolation region.

[C01] <<Memory Cell>>

A memory cell including:

a resistance-variable nonvolatile memory element; and a selection transistor electrically connected to the non-volatile memory element, in which the selection transistor is formed in an active region provided in a semiconductor layer, at least a part of the active region is in contact with an element isolation region provided in the semiconductor layer, and a surface of the element isolation region is located at a position lower than a surface of the active region.

[D01] The memory cell array according to any one of [A01] to [B12], in which the memory cell includes one nonvolatile memory element and one selection transistor.

[D02] The memory cell array according to any one of [A01] to [B12], in which the memory cell includes one nonvolatile memory element and two selection transistors.

[D03] The memory cell array according to any one of [A01] to [B12], in which the memory cell includes two nonvolatile memory elements and two selection transistors.

[D04] The memory cell array according to any one of [A01] to [D03], in which the nonvolatile memory element is constituted by a perpendicular magnetization type spin transfer torque based magnetic random access memory.

[D05] The memory cell array according to any one of [A01] to [D04], further including a peripheral circuit, in which a dummy stack having the same configuration as the stack constituting the nonvolatile memory element is formed above the peripheral circuit.

[E01] <<Semiconductor Device>>

A semiconductor device including:

the memory cell array according to any one of [A01] to [D05]; and a peripheral circuit, in which a dummy stack having the same configuration as the stack constituting the nonvolatile memory element is formed above the peripheral circuit.

[F01] <<Electronic Device>>

An electronic device including the memory cell according to any one of [A01] to [D05].

[F02] <<Electronic Device>>

An electronic device including the memory cell array according to any one of [A01] to [D05].

REFERENCE SIGNS LIST

11 Memory cell
12, 21, 22 Nonvolatile memory element
30 Stack
30A First surface of stack
30B Second surface of stack
31 Magnetization fixed layer
31A Fixed layer
31B Nonmagnetic layer
31C Reference layer
31D Nonmagnetic material layer
32 Intermediate layer 33 Storage layer (magnetization reversal layer or free layer)
34 Base layer
35 Cap layer
41 First wire
42 Second wire
51 Insulating material layer
60 Semiconductor layer (base portion, semiconductor substrate)
61 Gate electrode
62 Gate insulating layer
63 Channel forming region
64A, 64B Source/drain region
65 Connection hole
65, 66', 65", 66, 66', 66" Contact hole
65A, 65B, 66A, 66B Pad portion
67 Lower layer/interlayer insulating layer
67' Upper layer/interlayer insulating layer
71 Gate electrode
73 Channel forming region
74A, 74B Source/drain region
80 Active region
80' Side surface of active region
80" End portion of active region
81, 82 Element isolation region
TR, TR$_1$, TR$_2$, TR$_{1A}$, TR$_{1B}$, TR$_{1a}$, TR$_{1b}$, TR$_{2A}$, TR$_{2B}$, TR$_{2a}$, TR$_{2b}$ Selection transistor (selection element)
TR' Element isolation transistor
WL Word line
BL, XBL Bit line
SL Selection line (sense line)

The invention claimed is:

1. A memory cell array comprising a plurality of memory cells arranged in a first direction and a second direction different from the first direction, wherein
each of the memory cells includes:
a resistance-variable nonvolatile memory element; and
a selection transistor electrically connected to the nonvolatile memory element, the selection transistor is formed in an active region provided in a semiconductor layer,
at least a part of the active region is in contact with an element isolation region provided in the semiconductor layer,
a surface of the element isolation region is located at a position lower than a surface of the active region,
the memory cells adjacent to each other in the second direction are isolated from each other by the element isolation region, and
the memory cells adjacent to each other in the first direction are isolated from each other by an element isolation transistor.

2. The memory cell array according to claim 1, wherein a first one of the nonvolatile memory element constituting a (2m−1)-th (in which m=1, 2, 3 . . . ) memory cell arranged in the first direction is arranged on a first-A virtual line extending in the first direction, and a second one of the nonvolatile memory element constituting a 2m-th memory cell is arranged on a first-B virtual line extending in the first direction and located away from the first-A virtual line in the second direction.

3. The memory cell array according to claim 1, wherein a difference in a height direction between a top surface of the active region and a surface of the element isolation region is 15 nm to 35 nm.

4. The memory cell array according to claim 1, wherein the selection transistor includes a gate electrode, a gate insulating layer, a channel forming region, and source/drain regions,
one source/drain region of the selection transistor is electrically connected to one end of the nonvolatile memory element,
the other source/drain region of the selection transistor is electrically connected to a first wire,
the other end of the nonvolatile memory element is electrically connected to a second wire,
a word line also serving as the gate electrode of the selection transistor extends in the second direction, and
the channel forming region and the source/drain regions of the selection transistor are arranged in the first direction.

5. The memory cell array according to claim 4, wherein
the other source/drain region of the selection transistor is shared by a (2m−1)-th (in which m=1, 2, 3 . . . ) memory cell and a 2m-th memory cell arranged in the first direction, and
the 2m-th memory cell and a (2m+1)-th memory cell are isolated from each other by an element isolation transistor.

6. The memory cell array according to claim 4, wherein the word line of the selection transistor extends from an edge portion of the active region along a side surface of the active region in the second direction, and further extends on the element isolation region.

7. The memory cell array according to claim 4, wherein
when a difference in a height direction between a top surface of the active region and a surface of the element isolation region is represented by ΔH, and a width of the channel forming region of the selection transistor in the second direction is represented by L$_w$,
$$0.08 \leq \Delta H/L_w \leq 0.28$$
is satisfied.

8. The memory cell array according to claim 1, wherein the element isolation region has a shallow trench structure.

9. The memory cell array according to claim 1, wherein an end portion of the active region facing the element isolation region is rounded.

10. A memory cell array comprising a plurality of memory cells arranged in a first direction and a second direction different from the first direction, wherein
each of the memory cells includes:
a resistance-variable nonvolatile memory element; and
a selection transistor electrically connected to the nonvolatile memory element,
a first one of the nonvolatile memory element constituting a (2m−1)-th (in which m=1, 2, 3 . . . ) memory cell arranged in the first direction is arranged on a first-A virtual line extending in the first direction, and a second one of the nonvolatile memory element constituting a 2m-th memory cell is arranged on a first-B virtual line extending in the first direction and located away from the first-A virtual line in the second direction,
the selection transistor includes a gate electrode, a gate insulating layer, a channel forming region, and source/drain regions,
one source/drain region of the selection transistor is electrically connected to one end of the nonvolatile memory element,
the other source/drain region of the selection transistor is electrically connected to a first wire,
the other end of the nonvolatile memory element is electrically connected to a second wire, a word line also serving as the gate electrode of the selection transistor extends in the second direction, the channel forming region and the source/drain regions of the selection transistor are arranged in the first direction, the other source/drain region of the selection transistor is shared by a (2m−1)-th memory cell and a 2m-th memory cell, and the 2m-th memory cell and a (2m+1)-th memory cell are isolated from each other by an element isolation transistor.

11. The memory cell array according to claim 10, wherein the memory cells adjacent to each other in the second direction are isolated from each other by an element isolation region.

12. The memory cell array according to claim 10, wherein the memory cells adjacent to each other in the first direction are isolated from each other by an element isolation transistor.

13. The memory cell array according to claim 10, wherein the other source/drain region of a first element isolation transistor also serves as one source/drain region of the selection transistor in the (2m−1)-th memory cell, and one source/drain region of a second element isolation transistor also serves as one source/drain region of the selection transistor in the 2m-th memory cell.

14. The memory cell array according to claim 10, wherein a nonvolatile memory element of a (2m−1)-th memory cell and a nonvolatile memory element of a 2m-th memory cell arranged in the first direction are arranged two-fold rotationally symmetrically with the selection transistor as a rotation axis.

15. The memory cell array according to claim 10, wherein when a distance in the first direction between a nonvolatile memory element of a (2m−1)-th memory cell and a nonvolatile memory element of a 2m-th memory cell arranged in the first direction is represented by $LL_1$, and a distance in the first direction between the nonvolatile memory element of the 2m-th memory cell and a nonvolatile memory element of a (2m+1)-th memory cell arranged in the first direction is represented by $LL_2$, $LL_2 < LL_1$ is satisfied.

16. A memory cell comprising:

a resistance-variable nonvolatile memory element; and a selection transistor electrically connected to the nonvolatile memory element, wherein the selection transistor is formed in an active region provided in a semiconductor layer, at least a part of the active region is in contact with an element isolation region provided in the semiconductor layer, a surface of the element isolation region is located at a position lower than a surface of the active region, and a word line of the selection transistor extends from an edge portion of the active region along a side surface of the active region in the second direction, and further extends on the element isolation region.

17. A memory cell comprising:

a resistance-variable nonvolatile memory element; and a selection transistor electrically connected to the nonvolatile memory element, wherein the selection transistor is formed in an active region provided in a semiconductor layer, at least a part of the active region is in contact with an element isolation region provided in the semiconductor layer, a surface of the element isolation region is located at a position lower than a surface of the active region, and when a difference in a height direction between a top surface of the active region and a surface of the element isolation region is represented by $\Delta H$, and a width of a channel forming region of the selection transistor in the second direction is represented by $L_W$, $0.08 \le \Delta H / L_W \le 0.28$ is satisfied.

* * * * *